US007831010B2

(12) United States Patent
Tobita

(10) Patent No.: US 7,831,010 B2
(45) Date of Patent: Nov. 9, 2010

(54) SHIFT REGISTER CIRCUIT

(75) Inventor: Youichi Tobita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 38 days.

(21) Appl. No.: 12/268,729

(22) Filed: Nov. 11, 2008

(65) Prior Publication Data
US 2009/0122951 A1    May 14, 2009

(30) Foreign Application Priority Data
Nov. 12, 2007 (JP) .............................. 2007-292758
Jul. 24, 2008 (JP) .............................. 2008-190500

(51) Int. Cl.
*G11C 19/00* (2006.01)

(52) U.S. Cl. .......................................... 377/64; 377/69

(58) Field of Classification Search .................. 327/64, 327/68, 69–74, 77–81
See application file for complete search history.

(56) References Cited

U.S. PATENT DOCUMENTS

| 5,410,583 | A | 4/1995 | Weisbrod et al. |
| 5,859,630 | A * | 1/1999 | Huq .......................... 345/100 |
| 6,064,713 | A | 5/2000 | Lebrun et al. |
| 6,621,481 | B1 * | 9/2003 | Kanbara ..................... 345/100 |
| 7,492,853 | B2 * | 2/2009 | Tobita ......................... 377/64 |
| 2002/0097829 | A1 | 7/2002 | Kawahata |
| 2006/0001637 | A1 | 1/2006 | Pak et al. |
| 2007/0217564 | A1 | 9/2007 | Tobita |
| 2007/0237285 | A1 * | 10/2007 | Chien et al. ................... 377/64 |

FOREIGN PATENT DOCUMENTS

| JP | 7-182891 | 7/1995 |
| JP | 11-502355 | 2/1999 |
| JP | 2002-133890 | 5/2002 |
| JP | 2006-24350 | 1/2006 |
| JP | 2007-250052 | 9/2007 |

* cited by examiner

*Primary Examiner*—Tuan Lam
(74) *Attorney, Agent, or Firm*—Oblon, Spivak, McClelland, Maier & Neustadt, L.L.P.

(57) ABSTRACT

A bidirectional shift register in which an operation margin is not lowered when a shift direction of a signal is switched is provided. A unit shift register $SR_k$ at one stage of a plurality of stages of shift registers includes a gate line drive unit, a forward shift unit, and backward shift unit each capable of operating as one-stage shift register. The gate line drive unit outputs a gate line drive signal $G_k$ to a gate line $GL_k$ in response to a previous-stage forward signal $Gn_{k-1}$ and a subsequent-stage backward signal $Gr_{k+1}$. The forward shift unit performs only forward shift to output a forward signal $Gn_k$ to the subsequent-stage in response to the previous-stage forward signal $Gn_{k-1}$, and the backward shift unit performs only backward shift to output a backward signal $Gr_k$ to the previous-stage in response to the subsequent-stage backward signal $Gr_{k+1}$.

19 Claims, 34 Drawing Sheets

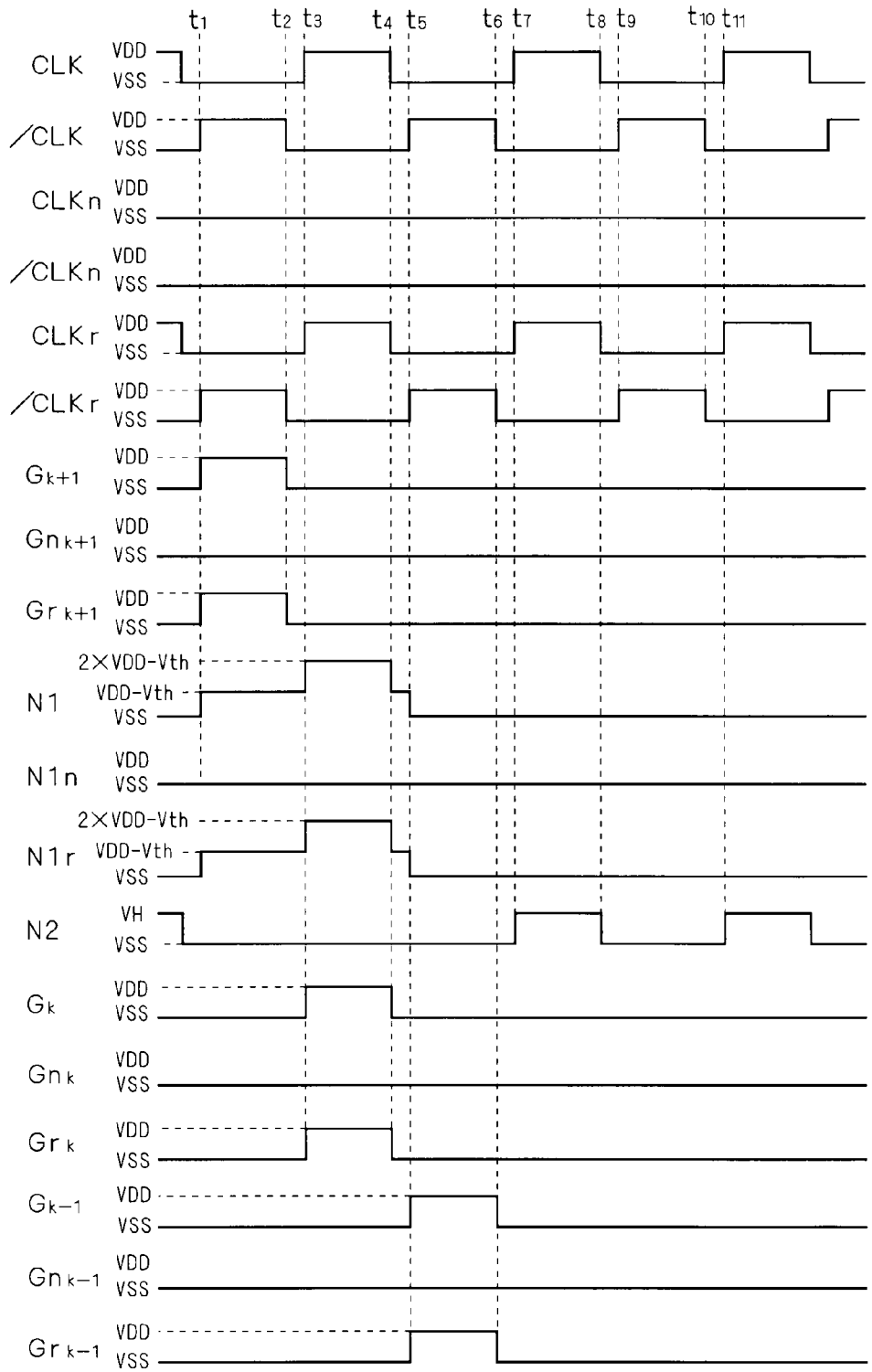
F I G . 1 1

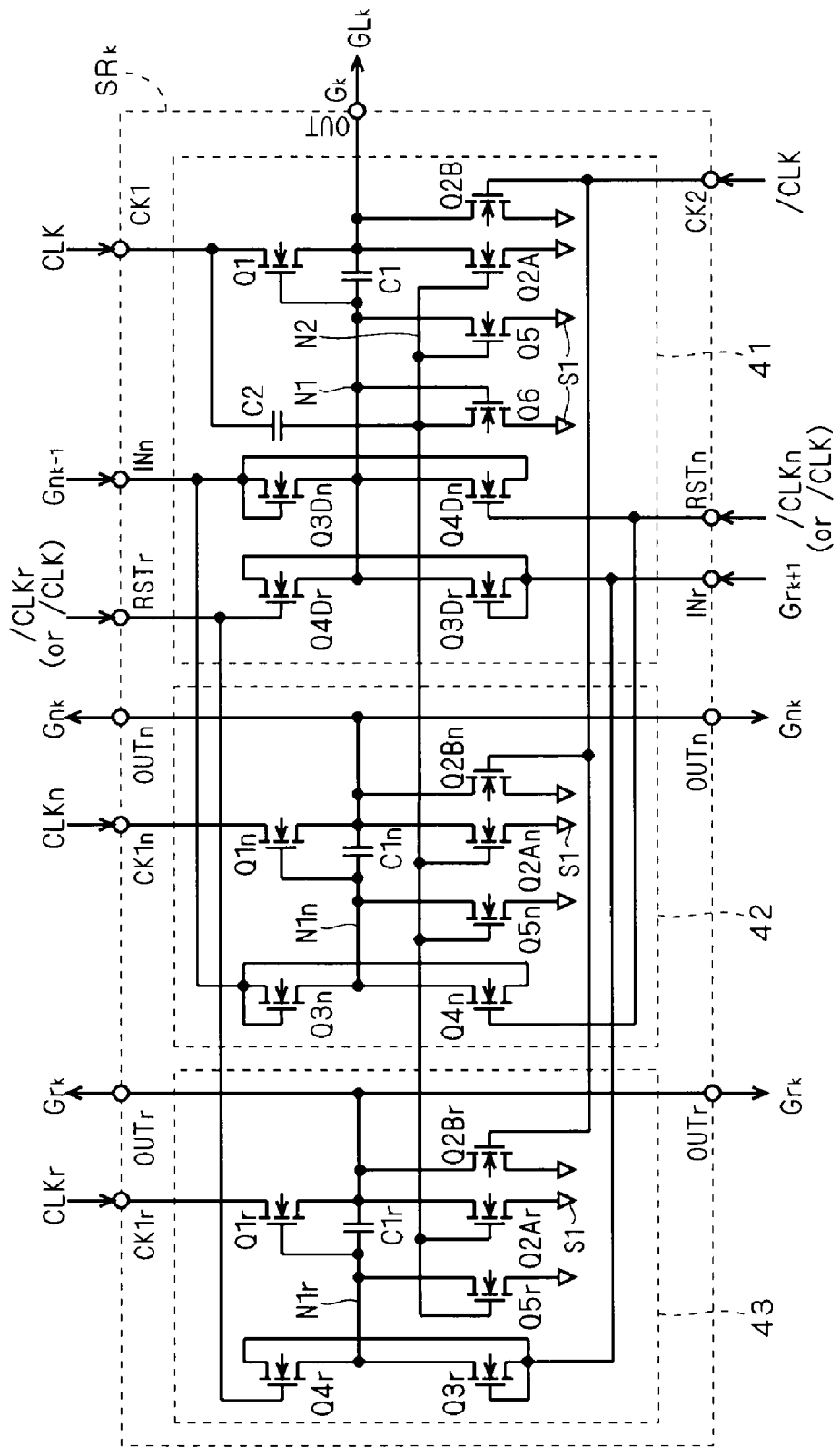
F I G. 1 3

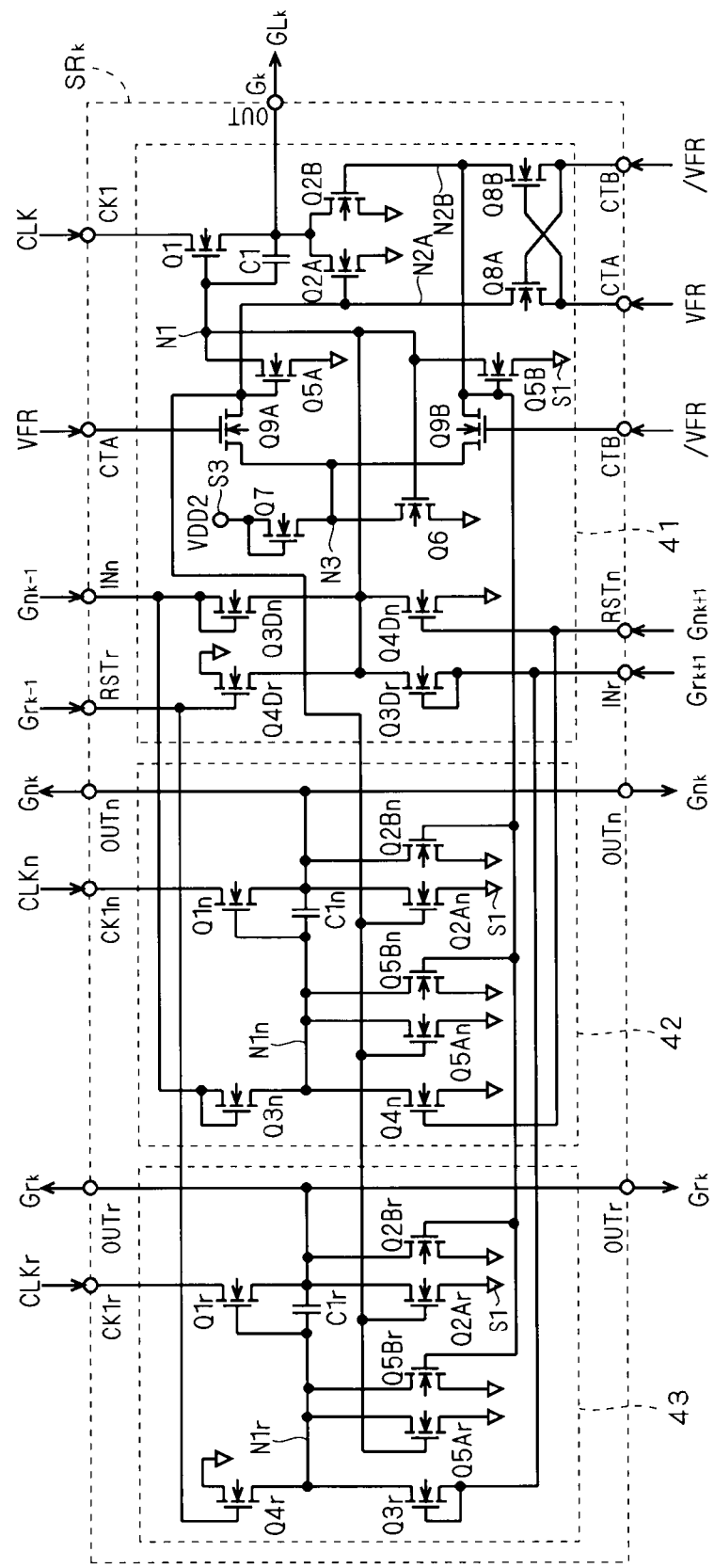
F I G . 2 2

SHIFT REGISTER CIRCUIT

BACKGROUND OF THE INVENTION

1. Field of the Invention

The present invention relates to shift register circuit only composed of same conductivity type field-effect transistors used in a scanning line drive circuit of an image display device, for example, and more particularly to a bidirectional shift register capable of inverting a shift direction of a signal.

2. Description of the Related Art

According to an image display device such as a liquid crystal display device (referred to as "display device" hereinafter), a gate line (scanning line) is provided for each pixel row (pixel line) of a display panel in which a plurality of pixels are arranged in the form of a matrix, and a display image is updated by sequentially selecting and driving the gate line based on one horizontal period of a display signal. As a gate line drive circuit (scanning line drive circuit) to sequentially select and drive the pixel line, that is, the gate line, a shift register performing a shift operation with respect to each frame period of the display signal may be used.

It is preferable that the shift register used in the gate line drive circuit be only composed of same conductivity type field-effect transistors to reduce a number of steps in a production process of the display device. Thus, various kinds of shift registers only composed of an N type or P type field-effect transistors and display devices mounting it are proposed. As the field-effect transistor, a MOS (Metal Oxide Semiconductor) transistor, a thin film transistor (TFT), and the like may be used.

The gate line drive circuit is composed of a plurality of stages of shift registers (multi-stage shift register). More specifically, the gate line drive circuit is configured by cascade-connecting a plurality of shift register circuits provided for each pixel line, that is, each gate line. In this specification, each shift register circuit constituting each stage of the multi-stage shift registers is referred to as "unit shift register".

The matrix type liquid crystal display device in which the liquid crystal pixels are arranged in the form of a matrix is required to change a display pattern such as to invert the display image vertically or laterally, or change the display order at the time of display.

For example, display reversing is required when the liquid crystal display device is applied to projection equipment for OHP (Overhead Projector) on a translucent screen. When the translucent screen is used, since a video is projected from a back side of the screen as viewed from audience, the video on the screen is reversed as compared with the case where the video is projected from the front side of the screen. In addition, the display order change is required to stage-manage a display such as a bar chart and a histogram so that the display image appears gradually from an upper side to a lower side, or lower side to an upper side.

Switching of a shift direction (scanning direction) of the signal in the gate line drive circuit is one method for changing the display pattern of the display device. Thus, a shift register capable of switching the shift direction of the signal is proposed (for example, National Publication of Translation No. 11-502355). The shift register capable of switching the shift direction of the signal is referred to as "bidirectional shift register" and each stage is referred to as "bidirectional unit shift register", occasionally.

A bidirectional unit shift register composed of N channel type field-effect transistors only is disclosed in FIG. 7 of National Publication of Translation No. 11-502355. The unit shift register has an output terminal connected to a first transistor (MN2) for supplying a clock signal (ϕ1) to the output terminal and to second and third transistors (MN4 and MN7) for discharging the output terminal. The second transistor (MN4) is driven by an output signal of a subsequent-stage (n+1) and the third transistor (MN7) is driven by an output signal of previous-stage (n−1).

The first transistor (MN2) is driven by fourth and fifth transistors (MN1 and MN3) connected to its gate node (G) (referred to as "node G"). The fourth transistor (MN1) is driven by the output signal of the previous-stage (n−1), and supplies a predetermined first voltage signal (Vb) to the node G. The fifth transistor (MN3) is driven by the output signal of the subsequent-stage (n+1), and supplies a predetermined second voltage signal (Vh) to the node G.

The first and second voltage signals (Vb and Vh) are complementary signals such that when one voltage level (referred to as simply "level" hereinafter) of one is at H (High) level, the other level is at L (Low) level. The shift direction of the signal in the bidirectional unit shift register is determined by the levels.

For example, in the case where the first voltage signal (Vb) is at H level and the second voltage signal (Vh) is at L level, when the output signal of the previous-stage (n−1) becomes H level and the fourth transistor (MN1) is turned on, the node G becomes H level and the first transistor (MN2) is turned on. Thus, the output signal is outputted at the timing when the clock signal (ϕ1) becomes H level next. That is, when the first voltage signal is at H level and the second voltage signal is at L level, the corresponding unit shift register operates so as to output the signal after the its previous-stage (n−1) (this operation is referred to as "forward shift").

Meanwhile, in the case where the first voltage signal (Vb) is at L level and the second voltage signal (Vh) is at H level, when the output signal of the subsequent-stage (n+1) becomes H level and the fifth transistor (MN3) is turned on, the node G becomes H level and the first transistor (MN2) is turned on. Thus, the output signal is outputted at the timing when the clock signal (ϕ1) becomes H level next. That is, when the first voltage signal is at L level and the second voltage signal is at H level, the corresponding unit shift register operates so as to output the signal after its subsequent-stage (n+1) (this operation is referred to as "backward shift").

Thus, according to the conventional bidirectional unit shift register (in FIG. 7 of National Publication of Translation No. 11-502355), the shift direction of the signal is switched by switching the levels of the first and second voltage signals (Vb and Vh) supplied to the gate (node G) of the first transistor (MN2) through the fourth and fifth transistors (MN1 and MN3).

According to a display device in which a shift register in a gate line drive circuit is formed of amorphous silicon TFT (a-Si TFT), a large area can be provided and productivity is high, so that it is widely employed in a screen of a notebook PC or a large screen display device. However, according to the a-Si TFT, when a gate electrode is positively biased continuously, the threshold voltage is likely to be positively shifted and its driving ability (ability to flow a current) is lowered. In addition, it is known that the threshold voltage is shifted not only in the a-Si TFT but also in an organic TFT.

When the unit shift register in FIG. 7 of National Publication of Translation No. 11-502355 performs the forward shift, since the first voltage signal (Vb) is at H level and the second voltage signal (Vn) is at L level, the fourth transistor (MN 1) charges the node G, and the fifth transistor (MN3) discharges the node G. Meanwhile, when the backward shift is performed, since the first voltage signal (Vb) is at L level and the second voltage signal (Vn) is at H level, the fifth transistor (MN3) charges the node G, and the fourth transistor (MN1) discharges the node G.

When the unit shift register is used in the gate line drive circuit of the image display device, its each-stage output signal becomes H level once with respect to each frame period of the video signal. For example, at the time of forward shift (forward scanning), the fifth transistor (MN3) in each stage is turned on once per one frame period during a period (active period) while the output signal of the subsequent-stage (n+1) is at H level, and discharge the node G. Although the active period at each stage is very short (a few thousandths of one frame), the voltage between gate and the source of the subsequent-stage fifth transistor (MN3) is positively biased during that period and the threshold voltage is slightly shifted to the positive side. When this is repeated for a long period of time, the slight shift of the threshold voltage can be accumulated to several volts finally.

Since the fourth transistor (MN1) at the time of forward shift charges the node G in a source follower operation, the voltage between the gate and source thereof is as low as the threshold voltage, so that the threshold voltage is not shifted.

While the fifth transistor (MN3) performs the discharging operation, the shift of the threshold voltage does not affect that discharging operation. However, when the operation of the gate line drive circuit is switched to the backward shift (backward scanning) after that, the following problem arises.

The fifth transistor (MN3) at the time of backward shift charges the node G in the source follower operation similar to the fourth transistor (MN1) at the time of forward shift. Thus, the potential of the charged node G is a value dropped from the gate voltage of the fifth transistor (MN3) by its threshold voltage. Therefore, if the threshold voltage of the fifth transistor (MN3) has been shifted at the time of previous forward shift, the potential of the node G after charged is lowered by the shifted amount. As a result, the operation margin of the unit shift register is lowered and an error operation is likely to be generated.

SUMMARY OF THE INVENTION

It is an object of the present invention to provide a bidirectional shift register in which an operation margin is not lowered when a shift direction of a signal is switched.

The present invention relates to a shift register composed of a plurality of stages. Each stage of the plurality of stages includes first to third shift register components each capable of operating as one-stage shift register; first to third output terminals for outputting first to third output signals serving as output signals of the first to third shift register components, respectively; and a first input terminal receiving the second output signal of a previous-stage, and a second input terminal receiving the third output signal of a subsequent-stage. The first shift register component activates the first output signal outputted from the first output terminal, in response to both of the second output signal of the previous-stage inputted to the first input terminal and the third output signal of the subsequent-stage inputted to the second input terminal. The second shift register component activates the second output signal outputted from the second output terminal, in response to only the second output signal of the previous-stage inputted to the first input terminal. The third shift register component activates the third output signal outputted from the third output terminal, in response to only the third output signal of the subsequent-stage inputted to the second input terminal.

At the time of forward shift, the second shift register component performs the shift operation of the signal, and at the time of backward shift, the third shift register component performs the shift operation of the signal. As a result, when the shift direction of the signal is switched, the operation is not affected by the threshold voltage of the transistor generated before. Thus, the operation margin of the shift register can be prevented from being lowered and the error operation can be prevented from being generated.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a timing chart showing an operation at the time of backward shift in the bidirectional unit shift register according to the embodiment 1.

FIG. 13 is a view showing a constitution of a bidirectional shift register according to an embodiment 3.

FIG. 22 is a view showing a constitution of a bidirectional shift register according to an embodiment 10.

DESCRIPTION OF THE PREFERRED EMBODIMENTS

Figure 1:
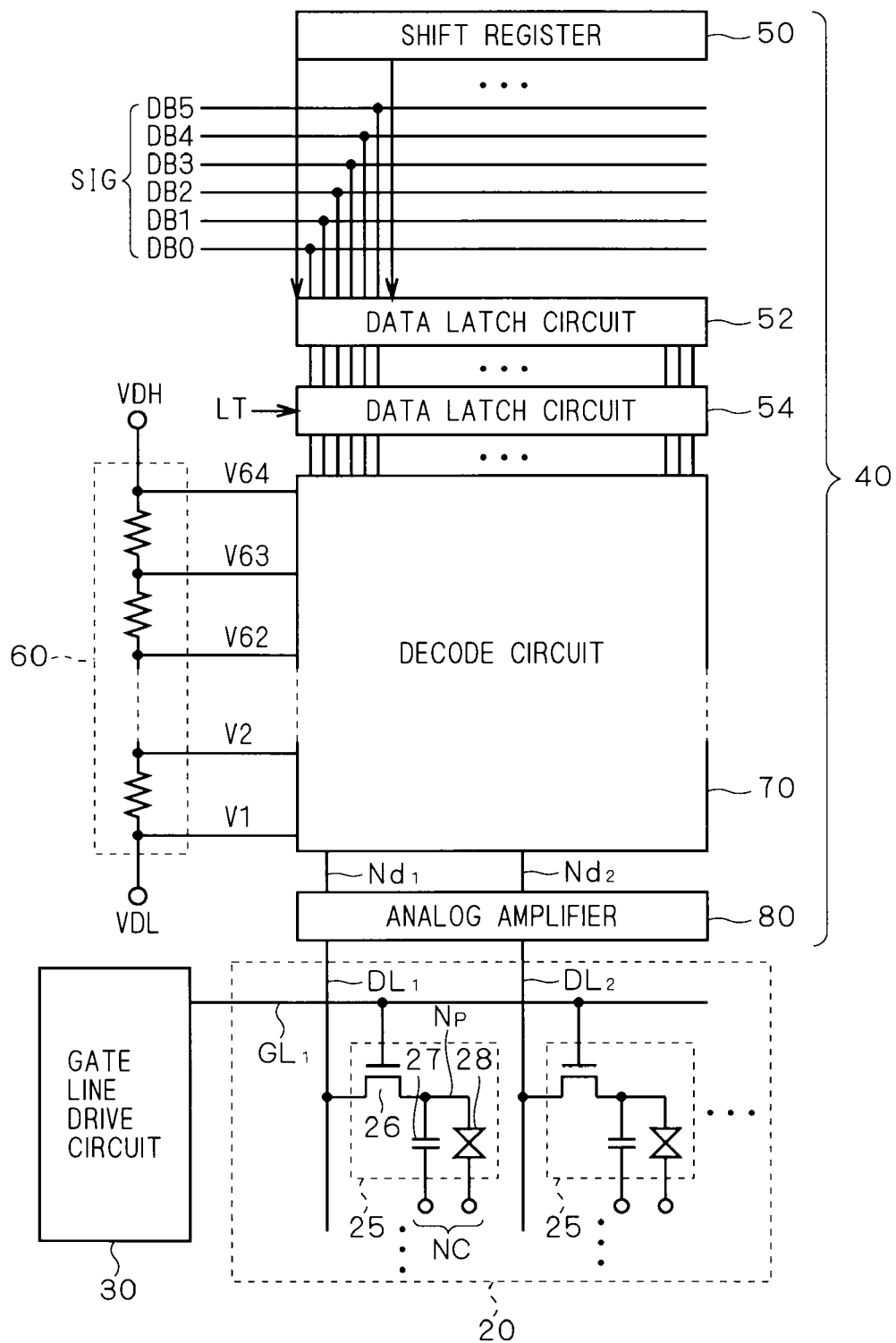
FIG. 1 is a schematic block diagram showing a constitution of a display device according to an embodiment of the present invention.

Embodiments of the present invention will be described with reference to the drawings. In order to avoid repeating the description, the same reference is allotted to a component having the same or corresponding function in the drawings.

Embodiment 1

FIG. 1 is a schematic block diagram showing a constitution of a display device according to an embodiment 1 of the present invention in which an entire constitution of a liquid crystal display device 10 is shown as a representative example of a display device.

The liquid crystal display device 10 includes a liquid crystal array unit 20, a gate line drive circuit (scanning line drive circuit) 30, and source driver 40. Although it will be clear from a description below, a bidirectional shift register according to this embodiment of the present invention is mounted on the gate line drive circuit 30.

The liquid crystal array unit 20 includes a plurality of pixels 25 arranged in the form of a matrix. Gate lines $GL_1$, $GL_2$, ... (generic term "gate line GL") are arranged in rows of pixels (referred to also as "pixel line"), and data lines $DL_1$, $DL_2$, ... (generic term "data line DL") are arranged in columns of pixels (referred to also as "pixel column). In FIG. 1, pixels 25 in first and second columns and in a first row, and the gate line $GL_1$ and data lines $DL_1$ and $DL_2$ are representatively shown.

Each pixel 25 has a pixel switch element 26 provided between the corresponding data line DL and pixel node Np, a capacitor 27 connected in parallel between the pixel node Np and a common electrode node NC, and a liquid crystal display element 28. The orientation of the liquid crystal in the liquid crystal display element 28 varies based on a voltage difference between the pixel node Np and the common electrode node NC, and in response to this, the display brightness of the liquid crystal display element 28 varies. Thus, the brightness of each pixel can be controlled by a display voltage transmitted to the pixel node Np through the data line DL and the pixel switch element 26. In other words, intermediate brightness can be provided by applying an intermediate voltage difference between a voltage difference corresponding to a maximum brightness and a voltage difference corresponding to a minimum brightness, to between the pixel node Np and the common electrode node NC. Therefore, when the display voltage is set in stages, the brightness can be provided in stages.

The gate line drive circuit 30 sequentially selects and drives the gate line GL based on a predetermined scanning cycle. According to this embodiment, the gate line drive circuit 30 is composed of bidirectional shift registers, and a direction to activate the gate line GL can be switched. A gate electrode of the pixel switch element 26 is connected to the corresponding gate line GL. While the specific gate line GL is selected, the pixel switch element 26 is turned on in the pixel connected thereto, and the pixel node Np is connected to the corresponding data line DL. Thus, a display voltage transmitted to the pixel node Np is retained by the capacitor 27. In general, the pixel switch element 26 is composed of a TFT formed on the same insulator substrate (glass substrate, resin substrate and the like) as the liquid crystal display element 28.

A source driver 40 outputs the display voltage set by a display signal SIG as an N-bit digital signal, in stages, to the data line DL. Here, the display signal SIG is a 6-bit signal composed of display signal bits DB0 to DB5 as an example. Based on the 6-bit display signal SIG, $2^6=64$-stage gradation can be displayed in each pixel. Furthermore, when one color display unit is formed of three colors of R (Red), G (Green) and B (Blue), 260,000 colors can be displayed.

As shown in FIG. 1, the source driver 40 includes a shift register 50, data latch circuits 52 and 54, a gradation voltage generation circuit 60, a decode circuit 70, and an analog amplifier 80.

According to the display signal SIG, the display signal bits DB0 to DB5 corresponding to the display brightness of each pixel 25 are serially generated. That is, the display signal bits DB0 to DB5 at each timing show display brightness in any one of pixels 25 in the liquid crystal array unit 20.

The shift register 50 instructs the data latch circuit 52 to take in the display signal bits DB0 to DB5 at a timing in synchronization with the cycle when the setting of the display signal SIG is switched. The data latch circuit 52 takes in the serially generated display signal SIG sequentially, and holds the display signal SIG corresponding to one pixel line.

A latch signal LT inputted to the data latch circuit 54 is activated at a timing when the display signal SIG corresponding to one pixel line is taken in the data latch circuit 52. The data latch circuit 54 takes the display signal SIG corresponding to one pixel line retained in the data latch circuit 52 at that time, in response to that timing.

The gradation voltage generation circuit 60 is composed of 63 voltage divider resistors connected between a high voltage VDH and a low voltage VDL in series and generates 64-stage gradation voltage V1 to V64, respectively.

The decode circuit 70 decodes the display signal SIG retained in the data latch circuit 54, selects a voltage to be outputted to each decode output nodes $Nd_1$, $Nd_2$, ... (generic term "decode output node Nd"), based on the above decoded result, from the gradation voltages V1 to V64, and outputs it.

As a result, the display voltage (one of the gradation voltages V1 to V64) corresponding to the display signal SIG for one pixel line retained in the data latch circuit 54 is outputted to the decode output node Nd. In FIG. 1, the decode output nodes $Nd_1$ and $Nd_2$ corresponding to the data lines $DL_1$ and $DL_2$ in the first and second columns are representatively shown.

The analog amplifier 80 outputs an analog voltage corresponding to the display voltage outputted from the decode circuit 70 to each of the decode output nodes $Nd_1$, $Nd_2$, ..., to each of the data lines $DL_1$, $DL_2$, ....

When the source driver 40 outputs the display voltage corresponding to the sequential display signal SIG by one pixel line to the data line DL based on the predetermined scanning cycle, and the gate line drive circuit 30 drives the gate lines $GL_1$, $GL_2$, ... in this order or its reverse order in synchronization with the scanning cycle, an image based on the display signal SIG or its reverse image is displayed in the liquid crystal array unit 20.

Although the liquid crystal display device 10 in which the gate line drive circuit 30 and the source driver 40 are integrally formed with the liquid crystal array unit 20 is shown in FIG. 1 as a constitution example, as another constitution, the gate line drive circuit 30 and the liquid crystal array unit 20 may be integrally formed and the source driver 40 may be provided as an external circuit of the liquid crystal array unit 20, or the gate line drive circuit 30 and the source driver 40 may be provided as external circuits of the liquid crystal array unit 20.

Figure 2:
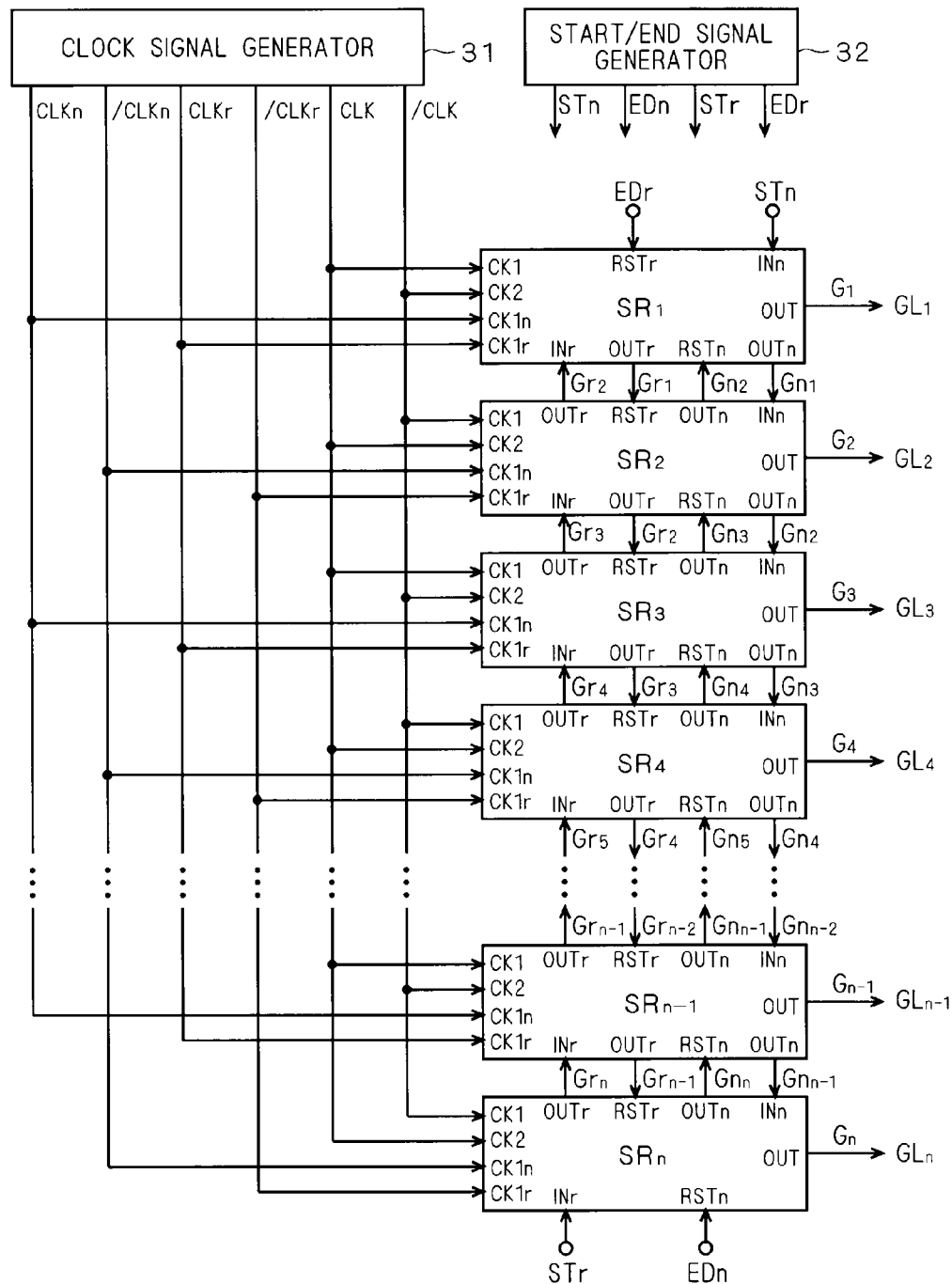
FIG. 2 is a block diagram showing a constitution example of a gate line drive circuit composed of bidirectional shift registers according to an embodiment 1.

A description will be made of the entire constitution and operation of the gate line drive circuit 30 and its control signal according to this embodiment. FIG. 2 is a view showing the constitution of the gate line drive circuit 30 according to this embodiment. The gate line drive circuit 30 is composed of a plurality of stages of bidirectional shift registers. More specifically, the gate line drive circuit 30 is composed of "n" cascade-connected bidirectional unit shift registers $SR_1$, $SR_2$, ... $SR_n$ (the cascade-connected shift registers $SR_1$, $SR_2$, ... $SR_n$ are sometimes referred to as "unit shift register SR" collectively). The unit shift register SR is provided with respect to one pixel line, that is, each gate line GL.

A clock signal generator 31 shown in FIG. 2 supplies clock signals CLK, /CLK, CLKn, /CLKn, CLKr, and /CLKr to the unit shift registers SR of the gate line drive circuit 30. The clock signals CLK and /CLK are complementary signals (their periods at H level (activated periods) do not overlap with each other) and controlled so as to be activated in synchronization with the scanning cycle of the display device.

Figure 3:
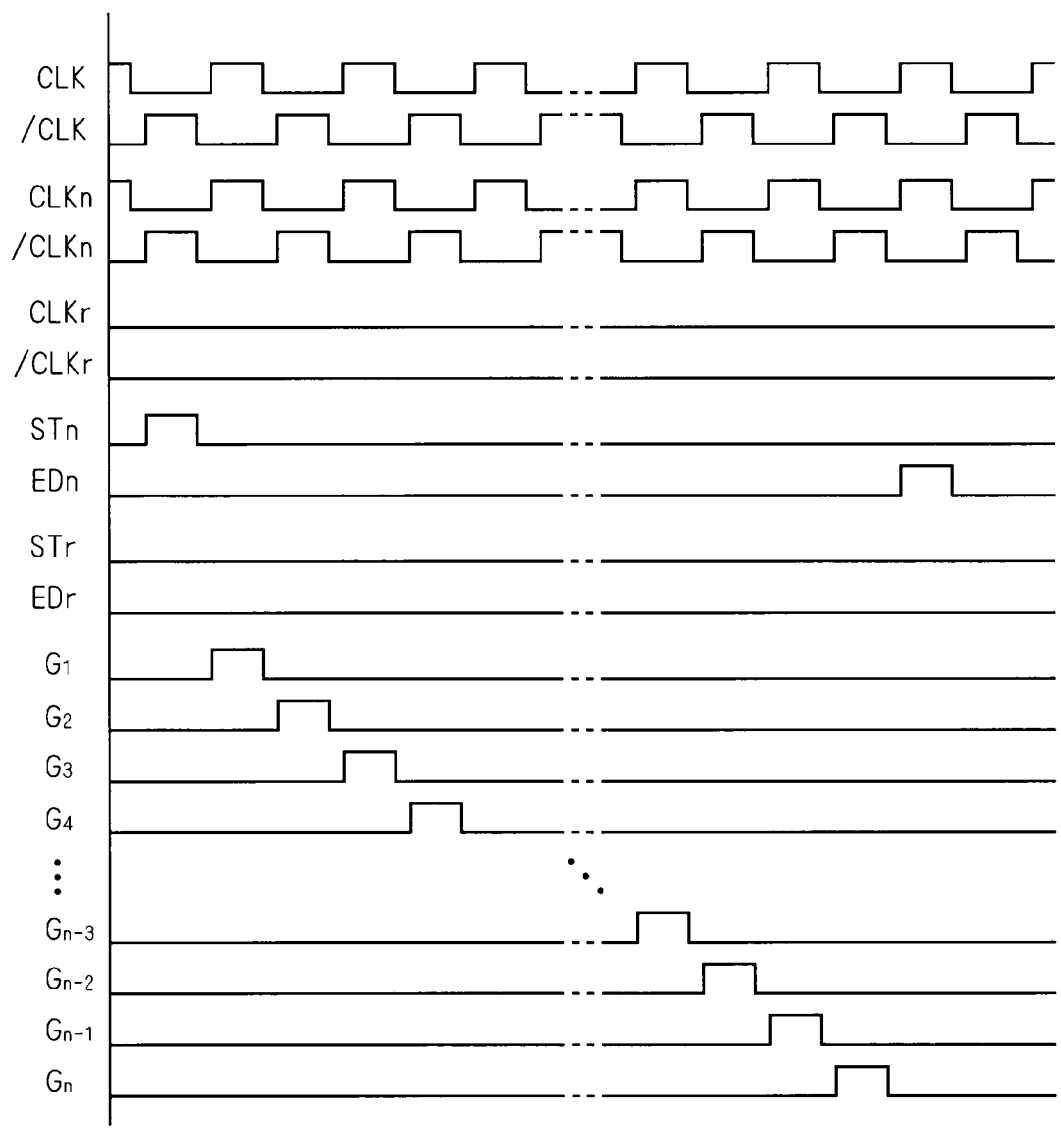
FIG. 3 is a timing chart showing an operation at the time of forward shift in the gate line drive circuit according to the embodiment 1.
Figure 4:
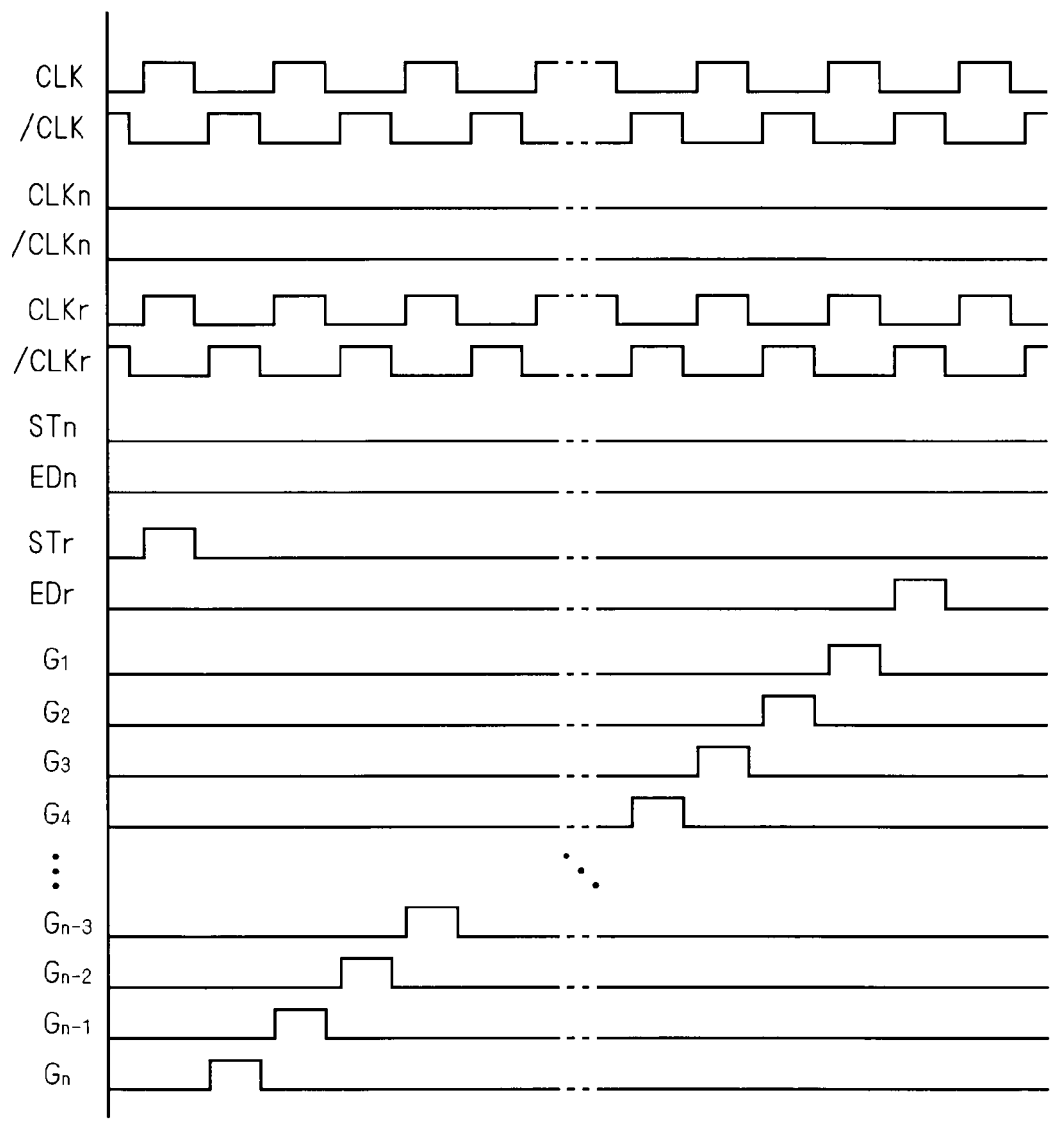
FIG. 4 is a timing chart showing an operation at the time of backward shift in the gate line drive circuit according to the embodiment 1.

The clock signals CLKn and /CLKn are activated at the same timing as that of the clock signals CLK and /CLK when the gate line drive circuit 30 shifts the signal forward as shown in FIG. 3 (in the order of the unit shift registers $SR_1$, $SR_2$, $SR_3$, ... (this direction is defined as "forward direction")). In addition, as shown in FIG. 4, when the signal is shifted backward (in the order of the unit shift registers $SR_n$, $SR_{n-1}$, $SR_{n-2}$ ... (this direction is defined as "backward direction")), they are in an inactive state (fixed to L level).

Meanwhile, the clock signals CLKr and /CLKr become the inactive state (fixed to L level) when the gate line drive circuit 30 performs the forward shift as shown in FIG. 3 and activated at the same timing as that of the clock signals CLK and /CLK when it performs the backward shift as shown in FIG. 4.

Thus, the clock signals CLKn and /CLKn are activated only at the time of forward shift and the clock signals CLKr and /CLKr are activated only at the time of backward shift. The clock signals CLKn and /CLKn are referred to as "forward clocks" and the clock signals CLKr and /CLKr are referred to as "backward clocks" hereinafter.

Figure 5A:
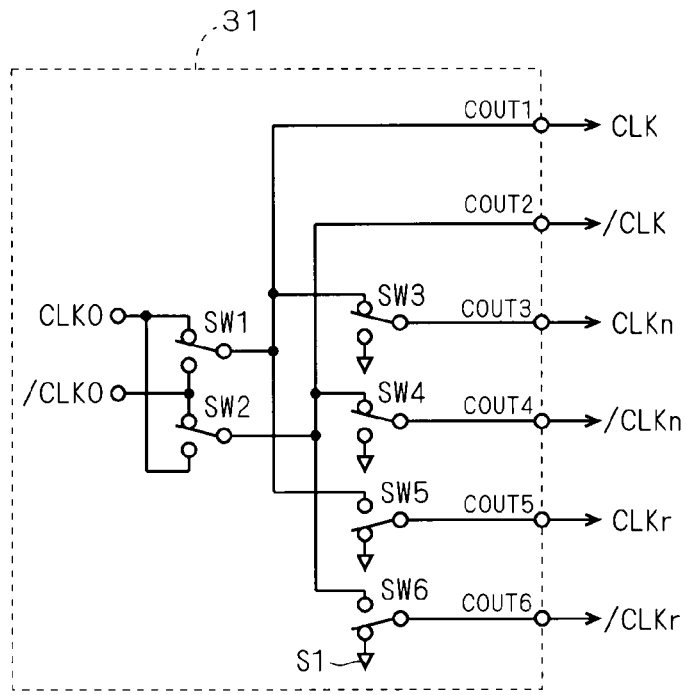
FIGS. 5A and 5B are views showing a constitution and an operation of a clock signal generator according to the embodiment 1.
Figure 5B:
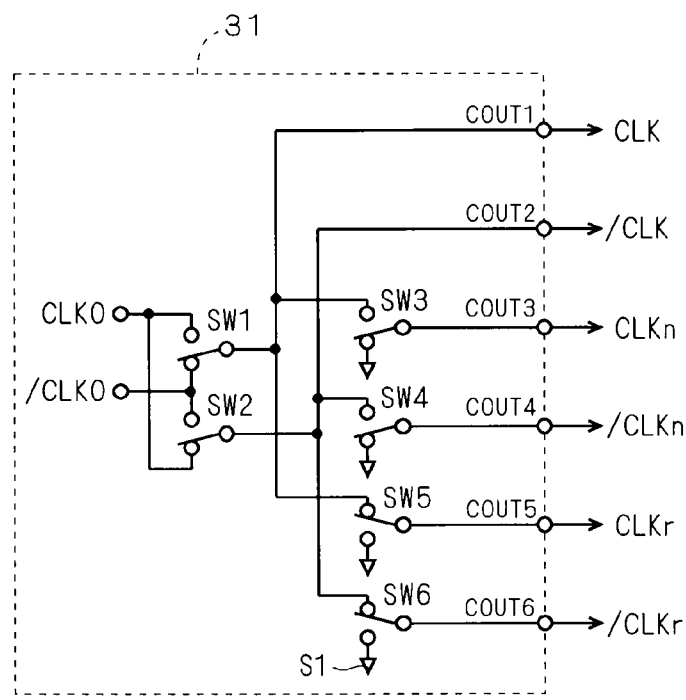

FIGS. 5A and 5B show a constitution example of the clock signal generator 31. This drawings show circuits for generating the clock signals CLK and /CLK, the forward clocks CLKn and /CLKn and the backward clocks CLKr and /CLKr by use of complementary basic clock signals CLK0 and /CLK0.

As shown in the drawings, the clock signals CLK and /CLK, the forward clocks CLKn and /CLKn and the backward clocks CLKr and /CLKr are outputted from terminals COUT1 to COUT6 of the clock signal generator 31, respectively. In addition, an L-level potential (low potential side power supply potential VSS) is supplied to a first power supply terminal S1.

A switch SW1 switches the phase of the clock signal CLK by selectively supplying the basic clock signal CLK0 or /CLK0 to the terminal COUT1. The switch SW2 switches the phase of the clock signal /CLK by selectively supplying the basic clock signal CLK0 or /CLK0 having a phase opposite to the one supplied to the terminal COUT1, to the terminal COUT2.

The switch SW3 switches the state of the forward clock CLKn by connecting the terminal COUT3 to the terminal COUT1 or the first power supply terminal S1. The switch SW4 switches the state of the forward clock /CLKn by connecting the terminal COUT4 to the terminal COUT2 or the first power supply terminal S1. The switch SW5 switches the state of the backward clock CLKr by connecting the terminal COUT5 to the terminal COUT1 or the first power supply terminal S1. The switch SW6 switches the state of the backward clock /CLKr by connecting the terminal COUT6 to the terminal COUT2 or the first power supply terminal S1.

FIG. 5A shows the state at the time of forward shift. The switch SW1 supplies the basic clock signal CLK0 to the terminal COUT1 as the clock signal CLK, the switch SW2 supplies the basic clock signal /CLK0 to the terminal COUT2 as the clock signal /CLK. The switch SW3 connects the terminal COUT3 to the terminal COUT1 and supplies the clock signal CLK to the terminal COUT3 as the forward clock CLKn. The switch SW4 connects the terminal COUT4 to the terminal COUT2 and supplies the clock signal /CLK to the terminal COUT4 as the forward clock /CLKn. The switches SW5 and SW6 connect the terminals COUT5 and COUT6 to the first power supply terminal S1 and fixes the backward clocks CLKr and /CLKr to L level.

FIG. 5B shows the state at the time of backward shift. The switch SW1 supplies the basic clock signal /CLK0 to the terminal COUT1 as the clock signal CLK, the switch SW2 supplies the basic clock signal CLK0 to the terminal COUT2 as the clock signal /CLK. Thus, the phases of the clock signals CLK and /CLK are exchanged. The switches SW3 and SW4 connect the terminals COUT3 and COUT4 to the first power supply terminal S1 and fix the forward clocks CLKn and /CLKn to L level. The switch SW5 connects the terminal COUT5 to the terminal COUT1 and supplies the clock signal CLK to the terminal COUT5 as the backward clock CLKr. The switch SW6 connects the terminals COUT6 to the terminal COUT2 and supplies the clock signal /CLK to the terminal COUT6 as the backward clock /CLKr.

When the clock signal generator 31 operates as shown in FIGS. 5A and 5B, each of the clock signals CLK and /CLK, the forward clocks CLKn and /CLKn, and the backward clocks CLKr and /CLKr is generated in the shift directions of the signal as shown in FIGS. 3 and 4.

Since the clock signal generator 31 can generate six signals such as the clock signals CLK and /CLK, the forward clocks CLKn and /CLKn and backward clocks CLKr and /CLKr by using the two basic clock signals CLK0 and /CLK0 only, in the circuits shown in FIGS. 5A and 5B, the cost can be reduced. As a matter of course, there is no problem in the operation of the gate line drive circuit 30 even when the clock signal generator 31 generates the six signals independently from each other.

A start/end signal generator 32 shown in FIG. 2 supplies a start signal to start the shifting operation of the signal and an end signal ED to end it by the gate line drive circuit 30, to a first-stage (unit shift register $SR_1$) or the last-stage (unit shift register $SR_n$) in the gate line drive circuit 30. The start signal is activated at a timing corresponding to the start of a frame cycle of a video signal, and the end signal is activated at a timing in synchronization with end of the frame period.

The start/end signal generator 32 outputs two start signals STn and STr and two end signals EDn and EDr. At the time of forward shift, the start signal STn and the end signal EDn are activated, and the start signal STr and the end signal EDr are inactivated (fixed to L level) (refer to FIG. 3). At the time of backward shift, the start signal STr and the end signal EDr are activated, and the start signal STn and the end signal EDn are inactivated (refer to FIG. 4). The start signal STn is referred to as "forward start signal" and the end signal EDn is referred to as "forward end signal", and the start signal STr is referred to as "backward start signal" and the end signal EDr is referred to as "backward end signal", hereinafter.

Figure 6A:
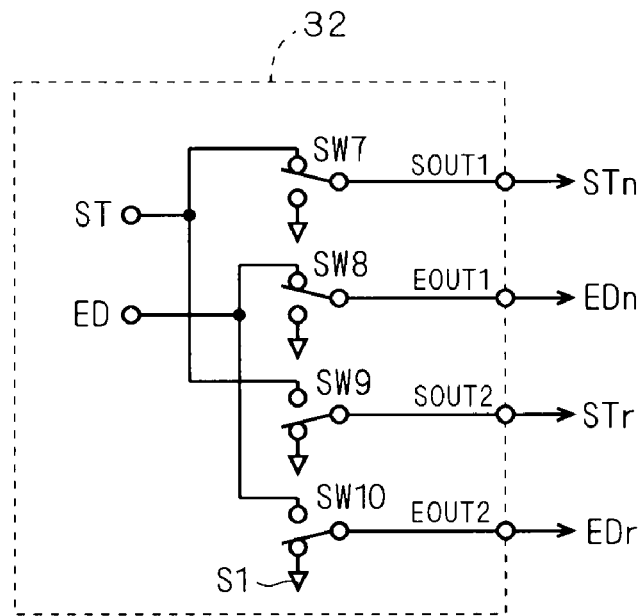
FIGS. 6A and 6B are views showing a constitution and an operation of a start/end signal generator according to the embodiment 1.
Figure 6B:
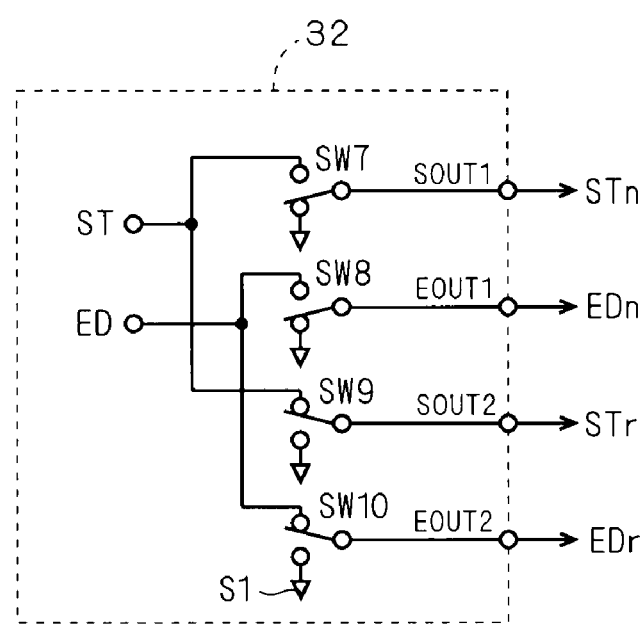

FIGS. 6A and 6B show a constitution example of the start/end signal generator 32. The drawings show the circuit of generating the forward start signal STn, forward end signal EDn, backward start signal STr and the backward end signal EDr by use of basic general start signal ST and end signal ED (corresponding to the start and end of each flame period, respectively).

As shown in the drawings, the forward start signal STn, the forward end signal EDn, the backward start signal STr and the backward end signal EDr are outputted from terminals SOUT1, EOUT1, SOUT2, and EOUT2 of the start/end signal generator 32, respectively. Also in this drawings, a L-level potential (low potential side power supply potential VSS) is supplied to the first power supply terminal S1.

A switch SW7 switches the state of the forward start signal STn by connecting the terminal SOUT1 to the start signal ST or the first power supply terminal S1. A switch SW8 switches the state of the forward end signal EDn by connecting the terminal EOUT1 to the end signal ED or the first power supply terminal S1. A switch SW9 switches the state of the backward start signal STr by connecting the terminal SOUT2 to the start signal ST or the first power supply terminal S1. A switch SW10 switches the state of the backward end signal EDr by connecting the terminal EOUT2 to the end signal ED or the first power supply terminal S1.

FIG. 6A shows the state at the time of forward shift. The switch SW7 supplies the start signal ST to the terminal SOUT1 as the forward start signal STn. The switch SW8 supplies the end signal ED to the terminal EOUT1 as the forward end signal EDn. In addition, the switches SW9 and SW10 connect the terminal SOUT2 and EOUT2 to the first power supply terminal S1 and fix the backward start signal STr and the backward end signal EDr to L level.

FIG. 6B shows the state at the time of backward shift. The switches SW7 and SW8 connect the terminal SOUT1 and EOUT1 to the first power supply terminal S1 and fix the forward start signal STn and the forward end signal EDn to L level. The switch SW9 supplies the start signal ST to the terminal SOUT2 as the backward start signal STr. The switch SW10 supplies the end signal ED to the terminal EOUT2 as the backward end signal EDr.

When the start/end signal generator 32 operates as shown in FIGS. 6A and 6B, each of the forward start signal STn, the forward end signal EDn, the backward start signal STr, and the backward end signal EDr is generated in the shift direction of the signal as shown in FIGS. 3 and 4.

Since the start/end signal generator 32 can generate the four signals of the forward start signal STn, the forward end signal EDn, the backward start signal STr, and the backward end signal EDr by use of the general start signal ST and end signal ED only, in the circuits shown in FIGS. 6A and 6B, the cost can be reduced. As a matter of course, there is no problem in the operation of the gate line drive circuit 30 even when the start/end signal generator 32 generates the four signals independently from each other.

The switches SW1 to SW10 in the clock signal generator 31 shown in FIG. 5 and the start/end signal generator 32 shown in FIG. 6 are switched by a program or a connection change of a wiring based on the shift direction. The switching by the connection change of the wiring is effective when the shift direction is fixed to one direction before the display device is produced. In addition, the switching by the program is effective when the shift direction is fixed to one direction after the display device is produced, or when the shift direction can be changed while the display device is used.

With reference to FIG. 2 again, each bidirectional unit shift register SR has two input terminals (a forward input terminal INn (first input terminal) and a backward input terminal INr (second input terminal)), three output terminals (an output terminal OUT (first output terminal), a forward output terminal OUTn (second output terminal) and a backward output terminal OUTr (third output terminal)), two reset terminals (a forward reset terminal RSTn (first reset terminal) and a backward reset terminal RSTr (second reset terminal)), and four clock terminals (first and second clock terminals CK1, CK2, a first forward clock terminal CK1$n$, and a first backward clock terminal CK1$r$). The function of each terminal will be described later and a connection relation in each unit shift register SR will be described first.

The clock signals having the different phases are inputted to the first and second clock terminals CK1 and CK2 in each unit shift register SR. According to this embodiment, as shown in FIG. 2, the clock signal CLK or /CLK is supplied from the clock signal generator 31 to the first or second clock terminals CK1 and CK2. According to the example in FIG. 2, in the odd stages (unit shift registers $SR_1$, $SR_3$, ... $SR_{n-1}$), the clock signal CLK is inputted to the first clock terminal CK1, and the clock signal /CLK is inputted to the second clock terminal CK2. In the even stages (unit shift registers $SR_2$, $SR_4$, ... $SR_n$), the clock signal /CLK is inputted to the first clock terminal CK1, and the clock signal CLK is inputted to the second clock terminal CK2.

Meanwhile, the forward clock CLKn or /CLKn is supplied to the first forward clock terminal CK1$n$ in each shift register SR. According to the example in FIG. 2, the forward clock CLKn and the forward clock /CLKn are inputted to the odd stage and the even stage, respectively. In addition, the backward clock CLKr or /CLKr is supplied to the first backward clock terminal CK1$r$ in the unit shift register SR. According to the example in FIG. 2, the backward clock CLKr and the backward clock /CLKr are inputted to the odd stage and even stage, respectively.

The gate line GL is connected to the output terminal OUT of the unit shift register SR. That is, a signal G outputted from the output terminal OUT is a vertical (horizontal) scanning pulse to activate the gate line GL.

The forward output terminal OUTn of the unit shift register SR is connected to the forward input terminal INn of its subsequent-stage and the forward reset terminal RSTn of its previous-stage. The backward output terminal OUTr is connected to the backward input terminal INr of its previous-stage and the backward reset terminal RSTr of its subsequent-stage. In other words, according to the unit shift register SR, the forward input terminal INn is connected to the forward output terminal OUTn of its previous-stage, the forward reset terminal RSTn is connected to the forward output terminal OUTn of its subsequent-stage, the backward input terminal INr is connected to the backward output terminal OUTr of its subsequent-stage, and the backward reset terminal RSTr is connected to the backward output terminal OUTr of its previous-stage.

As for the first-stage unit shift register $SR_1$, herein, the forward start signal STn is inputted to the forward input terminal INn, and the backward end signal EDr is inputted to the backward reset terminal RSTr. As for the last-stage unit shift register $SR_n$, the backward start signal STr is inputted to the backward input terminal INr, and the forward end signal EDn is inputted to the forward reset terminal RSTn.

It is assumed that transistors constituting the unit shift registers SR are all the same conductivity type of field-effect transistors and in this embodiment, an N type, a-Si TFT is used. The N type TFT is turned on when the gate becomes H level, and it is turned off when the gate becomes L level. It is noted that the unit shift register can be composed of a P type transistor and in the case of the P type transistor, it is turned on when the gate becomes L level and it is turned off when the gate becomes H level. In addition, the present invention can be applied to not only the shift register composed of the a-Si TFT but also the one composed of an organic TFT.

Figure 7:
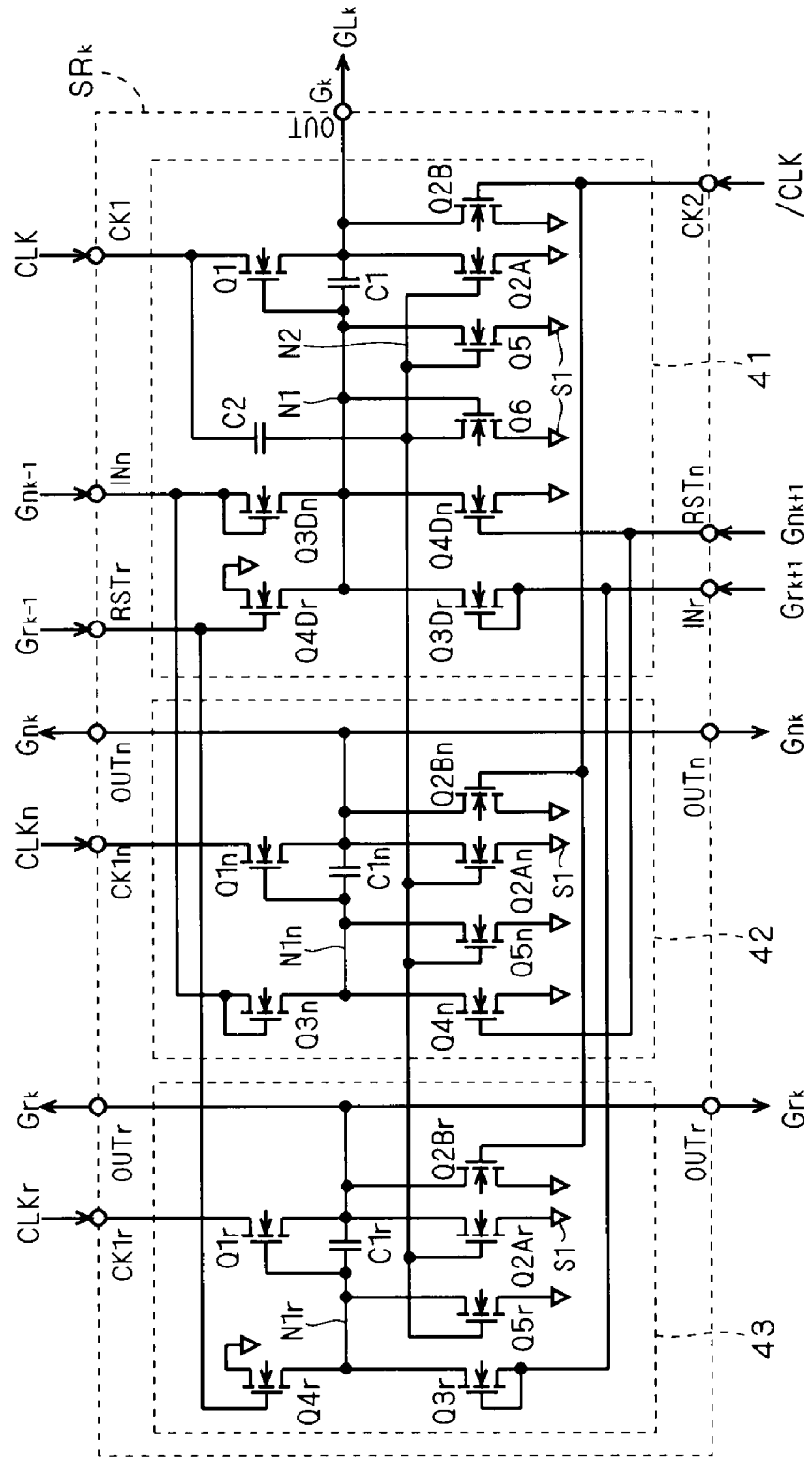
FIG. 7 is a view showing a constitution of a bidirectional unit shift register according to the embodiment 1.
Figure 8:
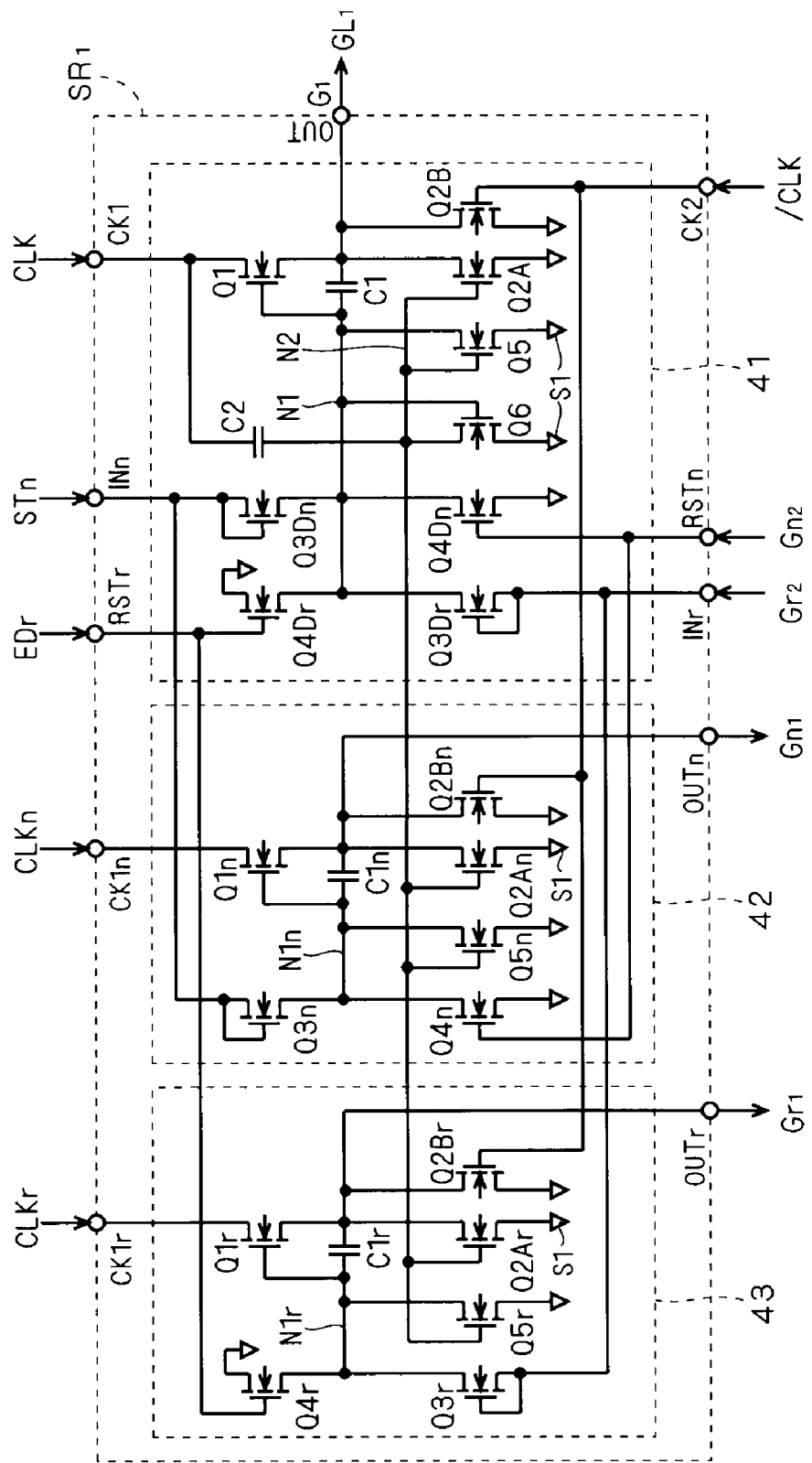
FIG. 8 is a view showing a constitution of a first-stage unit shift register in the gate line drive circuit according to the embodiment 1.
Figure 9:
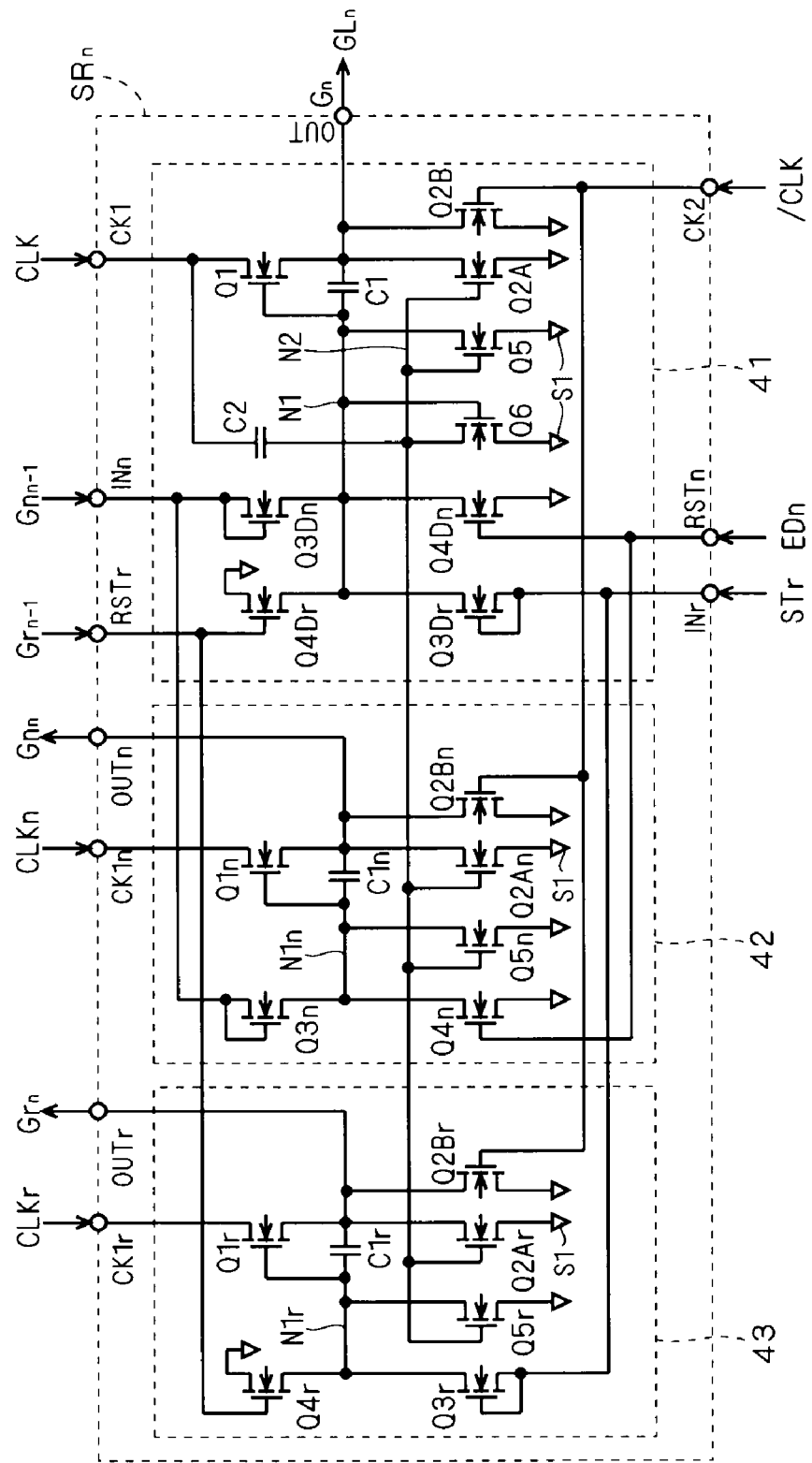
FIG. 9 is a view showing a constitution of a last-stage unit shift register in the gate line drive circuit according to the embodiment 1.

FIGS. 7 to 9 show circuit diagrams of the unit shift registers SR according to this embodiment. FIG. 7 shows a k-stage unit shift register $SR_k$ belonging to the middle stages (unit shift registers $SR_2$ to $SR_{n-1}$) in the gate line drive circuit 30, FIG. 8 shows the first-stage unit shift register $SR_1$, and FIG. 9 shows the last-stage unit shift register $SR_n$. Although the inputted signals are different in the first-stage, the middle stages, and the last-stage, the circuit constitutions of the unit shift registers $SR_1$ to $SR_n$ are basically the same.

According to the unit shift register $SR_k$ shown in FIG. 7, the clock signal CLK is inputted to the first clock terminal CK1, the clock signal /CLK is inputted to the second clock terminal CK2, the forward clock CLKn is inputted to the first forward clock terminal CK1n, and the backward clock CLKr is inputted to the first backward clock terminal CK1r. That is, the unit shift register $SR_k$ belongs to the odd stage (refer to FIG. 2). As described above, in the even stage, the clock signal /CLK is inputted to the first clock terminal CK1, the clock signal CLK is inputted to the second clock terminal CK2, the forward clock /CLKn is inputted to the first forward clock terminal CK1n, and the backward clock /CLKr is inputted to the first backward clock terminal CK1r. Since the circuit constitution is the same in the even stage and the odd stage, the even-stage circuit is omitted.

Since the unit shift registers $SR_1$ to $SR_n$ have the same constitution, the constitution will be described with reference to the unit shift register $SR_k$ shown in FIG. 7 as a representative example. As shown in FIG. 7, the unit shift register $SR_k$ has the first power supply terminal S1 (common to the first power supply terminal S1 in FIGS. 5 and 6) to which the low power supply potential VSS is supplied, other than the terminals shown in FIG. 2. Although the low power supply potential VSS is set to a reference potential (=0V) of the circuit in the following description, the reference potential of an actual image display device is set based on a voltage of a display signal written in the pixel, and it is set to −12V, for example.

In this case, L level of each control signal including the clock signals CLK and /CLK is set to −12V and H level is set to 17V, for example.

The unit shift register $SR_k$ is composed of three circuits each having a function as a shift register at one stage, that is, a gate line drive unit 41 (first shift register component), a forward shift unit 42 (second shift register component), and backward shift unit 43 (third shift register component).

The gate line drive unit 41 outputs a signal $G_k$ (first output signal) from the output terminal OUT. The output terminal OUT is connected to a corresponding gate line $GL_k$ and the signal $G_k$ is used to drive the gate line $GL_k$. The signal G outputted from the output terminal OUT of the unit shift register SR is referred to as "gate line drive signal". In general, the gate line GL has relatively large parasitic capacity. The gate line drive unit 41 has a relatively high driving ability so as to charge or discharge it at high speed.

Meanwhile, the forward shift unit 42 and the backward shift unit 43 control the shift direction of the signal in the gate line drive circuit 30. The signal $Gn_k$ (second output signal) outputted from the forward output terminal OUTn of the forward shift unit 42 and the signal $Gr_k$ (third output signal) outputted from the backward output terminal OUTr are used as the control signals of the shift direction. The signal Gn outputted from each unit shift register SR is referred to as the "forward signal" and the signal Gr is referred to as the "backward signal" hereinafter.

As can be seen from FIG. 7, the forward shift unit 42 and the backward shift unit 43 have the same circuit constitution. However, the shift directions of the signal of them are different from each other. The forward shift unit 42 performs the forward shift operation only, and the backward shift unit 43 performs the backward shift operation only. More specifically, according to the forward shift unit 42, when the forward signal $Gn_{k-1}$ at the previous-stage is activated, it operates so as to activate the forward signal $Gn_k$, and according to the backward shift unit 43, when the backward signal $Gr_{k+1}$ at the subsequent-stage is activated, it operates so as to activate the backward signal $Gr_k$.

Meanwhile, the gate line drive unit 41 performs both forward shift of the forward signal Gn and backward shift of the backward signal Gr. That is, the gate line drive unit 41 of the unit shift register $SR_k$ sequentially activates the gate line drive signal $G_k$ in both cases where the forward signal $Gn_{k-1}$ at the previous-stage to be inputted to the forward input terminal INn is activated and when the backward signal $Gn_{k+1}$ at the subsequent-stage to be inputted to the backward input terminal INr is activated.

The circuit constitution of the gate line drive unit 41 will be described. Transistors Q1, Q2A, and Q2B are connected to the output terminal OUT of the gate line drive unit 41. The transistor Q1 (first transistor) is connected between the output terminal OUT and the first clock terminal CK1. That is, the transistor Q1 is a transistor to supply the clock signal inputted to the first clock terminal CK1 to the output terminal OUT. Both transistors Q2A and Q2B are connected between the output terminal OUT and the first power supply terminal S1. That is, the transistors Q2A and Q2B are transistors to discharge the output terminal OUT. Here, the node (gate node) connected to the gate of the transistor Q1 is defined as "node N1".

A capacitive element C1 is provided between the gate and the source of the transistor Q1, that is, between the node N1 and the output terminal OUT. The capacitive element C1 capacitively couples the output terminal OUT and the node N1, and enhances the boosting effect of the node N1 so as to correspond to the level rise of the output terminal OUT. It is note that when the capacity between the gate and the channel of the transistor Q1 is sufficiently high, the capacitive element C1 may be replaced by it and omitted.

The transistor Q1 is driven by a circuit consisting of transistors Q3Dn, Q4Dn, Q3Dr and Q4Dr connected to the node N1. The transistor Q3Dn is connected between the node N1 and the forward input terminal INn, and its gate is connected to the forward input terminal INn. That is, the transistor Q3Dn is diode-connected such that the side of the forward input terminal INn is an anode and the side of the node N1 is a cathode. Therefore, the transistor Q3Dn functions to charge the node N1 based on the forward signal $Gn_{k-1}$ of the previous-stage. The transistor Q4Dn is connected between the node N1 and the first power supply terminal S1, and its gate is connected to the forward reset terminal RSTn. Thus, the transistor Q4Dn functions to discharge the node N1 based on the forward signal $Gn_{k+1}$ of the subsequent-stage.

The transistor Q3Dr is connected between the node N1 and the backward input terminal INr, and its gate is connected to the backward input terminal INr. That is, the transistor Q3Dr is diode-connected such that the side of the backward input terminal INr is an anode and the side of the node N1 is a cathode. Therefore, the transistor Q3Dr functions to charge the node N1 based on the backward signal $Gr_{k+1}$ of the subsequent-stage. The transistor Q4Dr is connected between the node N1 and the first power supply terminal S1, and its gate is connected to the backward reset terminal RSTr. Thus, the transistor Q4Dr functions to discharge the node N1 based on the backward signal $Gr_{k-1}$ of the previous-stage.

The gate line drive unit 41 is provided with an inverter having the node N1 as its input end. The inverter is composed of a capacitive element C2 and a transistor Q6 and it is a capacitive load type inverter in which the capacitive element C2 is a load element. It is noted that this inverter differs from a normal inverter in that the clock signal to be inputted to the first clock terminal CK1 is supplied as a power supply.

When the output end of the inverter is defined as a "node 2", the capacitive element C2 is connected between the node N2 and the first clock terminal CK1 (that is, the node N2 is connected to the first clock terminal CK1 through the capacitive element C2 (load)). The capacitive element C2 serves as the load element of the inverter and functions as coupling capacity between its output end (node N2) and the first clock terminal CK1. The transistor Q6 is connected between the node N2 and the first power supply terminal S1, and its gate is connected to the node N1 serving as the input end of the inverter. That is, the transistor Q6 is controlled by the level of the node N1 and discharges the node N2.

Since the power supply of the inverter is the clock signal inputted to the first clock terminal CK1, and the capacitive element C2 capacitively couples the first clock terminal CK1 and the node N2, the inverter performs an alternate operation in which it is activated in synchronization with the clock signal inputted to the first clock terminal CK1. More specifically, when the clock signal inputted to the first clock terminal CK1 is activated (becomes H level), the inverter inverts the level of the node N1 and outputs it to the node N2. Meanwhile, when the clock signal inputted to the first clock terminal CK1 is inactivated (at L level), the node N2 becomes L level regardless of the level of the node N1.

The gate of the transistor Q2A is connected to the node N2. That is, the transistor Q2A is driven by the inverter composed of the capacitive element C2 and the transistor Q6. Meanwhile, the gate of the transistor Q2B is connected to the second clock terminal CK2. The clock signal having the phase different from the one inputted to the first clock terminal CK1 is inputted to the second clock terminal CK2.

According to the unit shift register $SR_k$, the clock signal CLK is inputted to the first clock terminal CK1, and the clock signal /CLK is inputted to the second clock terminal CK2, respectively.

The gate line drive unit 41 is provided with a transistor Q5 connected between the node N1 and the first power supply terminal S1, and having a gate connected to the node N2. That is, the transistor Q5 is controlled by the output of the inverter composed of the capacitive element C2 and the transistor Q6, and discharges the node N1.

Next, the constitution of the forward shift unit 42 and the backward shift unit 43 will be described. The forward shift unit 42 and the backward shift unit 43 have the same circuit constitution and their constitution is similar to the gate line drive unit 41. (In FIG. 7, common references are allotted to the components functioning similarly in the gate line drive unit 41 and the forward shift unit 42 except for subscript such as "D", "n" and "r").

Transistors Q1n, Q2An and Q2Bn are connected to the forward output terminal OUTn of the forward shift unit 42. The transistor Q1n is connected between the forward output terminal OUTn and the first forward clock terminal CK1n. That is, the transistor Q1n is a transistor to supply the clock signal (forward clock) inputted to the first forward clock terminal CK1n to the forward output terminal OUTn. The forward clock CLKn is inputted to the first forward clock terminal CK1n of the unit shift register $SR_k$.

Both transistors Q2An and Q2Bn are connected between the forward output terminal OUTn and the first power supply terminal S1. Thus, transistors Q2An and Q2Bn function to discharge the forward output terminal OUTn. Here, the gate node of the transistor Q1n is defined as "node N1n".

A capacitive element C1n is provided between the gate and the source of the transistor Q1n, that is, between the node N1n and the forward output terminal OUTn. The capacitive element C1n enhances the boosting effect of the node N1n so as to correspond to the level rise of the forward output terminal OUTn. When the capacity between the gate and the channel of the transistor Q1n is sufficiently high, the capacitive element C1n may be also replaced by it and omitted.

The transistor Q1n is driven by a circuit consisting of transistors Q3n and Q4n connected to the node N1n. The transistor Q3n is connected between the node N1n and the forward input terminal INn, and its gate is connected to the forward input terminal INn. That is, the transistor Q3n is diode-connected such that the side of the forward input terminal INn is an anode and the side of the node N1n is a cathode. Therefore, the transistor Q3n functions to charge the node N1n based on the forward signal $Gn_{k-1}$ of the previous-stage. The transistor Q4n is connected between the node N1n and the first power supply terminal S1, and its gate is connected to the forward reset terminal RSTn. Thus, the transistor Q4n functions to discharge the node N1n when the forward signal $Gn_{k+1}$ of the subsequent-stage is activated.

Although the forward shift unit 42 itself does not include the inverter in this embodiment, the output of the inverter composed of the capacitive element C2 and the transistor Q6 of the gate line drive unit 41 is shared by the forward shift unit 42. That is, the transistor Q2An is connected to the node N2 serving as the output end of the inverter in the gate line drive unit 41. In addition, the gate of a transistor Q5n connected between the node N1n and the first power supply terminal S1 is connected to the node N2. The gate of the transistor Q2Bn is connected to the second clock terminal CK2.

Meanwhile, transistors Q1r, Q2Ar and Q2Br are connected to the backward output terminal OUTr of the backward shift unit 43. The transistor Q1r is connected between the backward output terminal OUTr and the first backward clock terminal CK1r. That is, the transistor Q1r is a transistor to supply the clock signal (backward clock) inputted to the first backward clock terminal CK1r to the backward output terminal OUTr. Both transistors Q2Ar and Q2Br are connected between the backward output terminal OUTr and the first power supply terminal S1. Thus, transistors Q2Ar and Q2Br function to discharge the backward output terminal OUTr. Here, the gate node of the transistor Q1r is defined as "node N1r".

A capacitive element C1r is provided between the gate and the source of the transistor Q1r, that is, between the node N1r and the backward output terminal OUTr. The capacitive element C1r enhances the boosting effect of the node N1r so as to correspond to the level rise of the backward output terminal OUTr. When the capacity between the gate and the channel of the transistor Q1r is sufficiently high, the capacitive element C1r may be also replaced by it and omitted.

The transistor Q1r is driven by a circuit consisting of transistors Q3r and Q4r connected to the node N1r. The transistor Q3r is connected between the node N1r and the backward input terminal INr, and its gate is connected to the backward input terminal INr. That is, the transistor Q3r is diode-connected such that the side of the backward input terminal INr is an anode and the side of the node N1r is a cathode. Therefore, the transistor Q3r functions to charge the node N1r based on the backward signal $Gr_{k+1}$ of the subsequent-stage. The transistor Q4r is connected between the node N1r and the first power supply terminal S1, and its gate is connected to the backward reset terminal RSTr. Thus, the transistor Q4r functions to discharge the node N1r when the backward signal $Gr_{k-1}$ of the previous-stage is activated.

Although the backward shift unit 43 also does not include the inverter, the output of the inverter of the gate line drive unit 41 is shared by the backward shift unit 43. That is, the transistor Q2Ar is connected to the node N2 serving as the output end of the inverter in the gate line drive unit 41. The gate of a transistor Q5r connected between the node N1r and the first power supply terminal S1 is also connected to the node N2. The gate of the transistor Q2Br is connected to the second clock terminal CK2.

The constitution of the unit shift register $SR_k$ shown in FIG. 7 has been described above. The unit shift registers $SR_1$ and $SR_n$ shown in FIGS. 8 and 9 have the same constitution. However, as described above with reference to FIG. 2, according to the first-stage unit shift register $SR_1$, the forward start signal STn is inputted to the forward input terminal INn, and the backward end signal EDr is inputted to the backward reset terminal RSTr. According to the last-stage unit shift register $SR_n$, the backward start signal STr is inputted to the backward input terminal INr, and the forward end signal EDn is inputted to the forward reset terminal RSTn.

Next, the operation of the bidirectional unit shift register SR according to this embodiment will be described. To simplify the following description, it is assumed that the H level and the L level of the clock signals CLK and /CLK, the forward clock CLKn and /CLKn, the backward clock CLKr and /CLKr, the forward start signal STn, the forward end signal EDn, the backward start signal STr, and the backward end signal EDr are equal, respectively. In addition, the potential of the H level is equal to the high potential side power supply potential VDD, and the potential of the L level is equal to the low potential side power supply potential VSS (=0V). Furthermore, it is assumed that the threshold voltages of the transistors constituting the unit shift register SR are the same and its value is Vth.

Since the operations of the unit shift registers $SR_1$ to $SR_n$ are all the same basically, the operation of the k-stage unit shift register $SR_k$ shown in FIG. 7 will be described representatively also here. It is assumed that the unit shift register $SR_k$ belongs to the odd stage, and the clock signal CLK is inputted to the first clock terminal CK1 and the clock signal /CLK is inputted to the second clock terminal CK2 as shown in FIG. 4. It is also assumed that the forward clock CLKn is inputted to the first forward clock terminal CK1n, and the backward clock CLKr is inputted to the first backward clock terminal CK1r.

Figure 10:
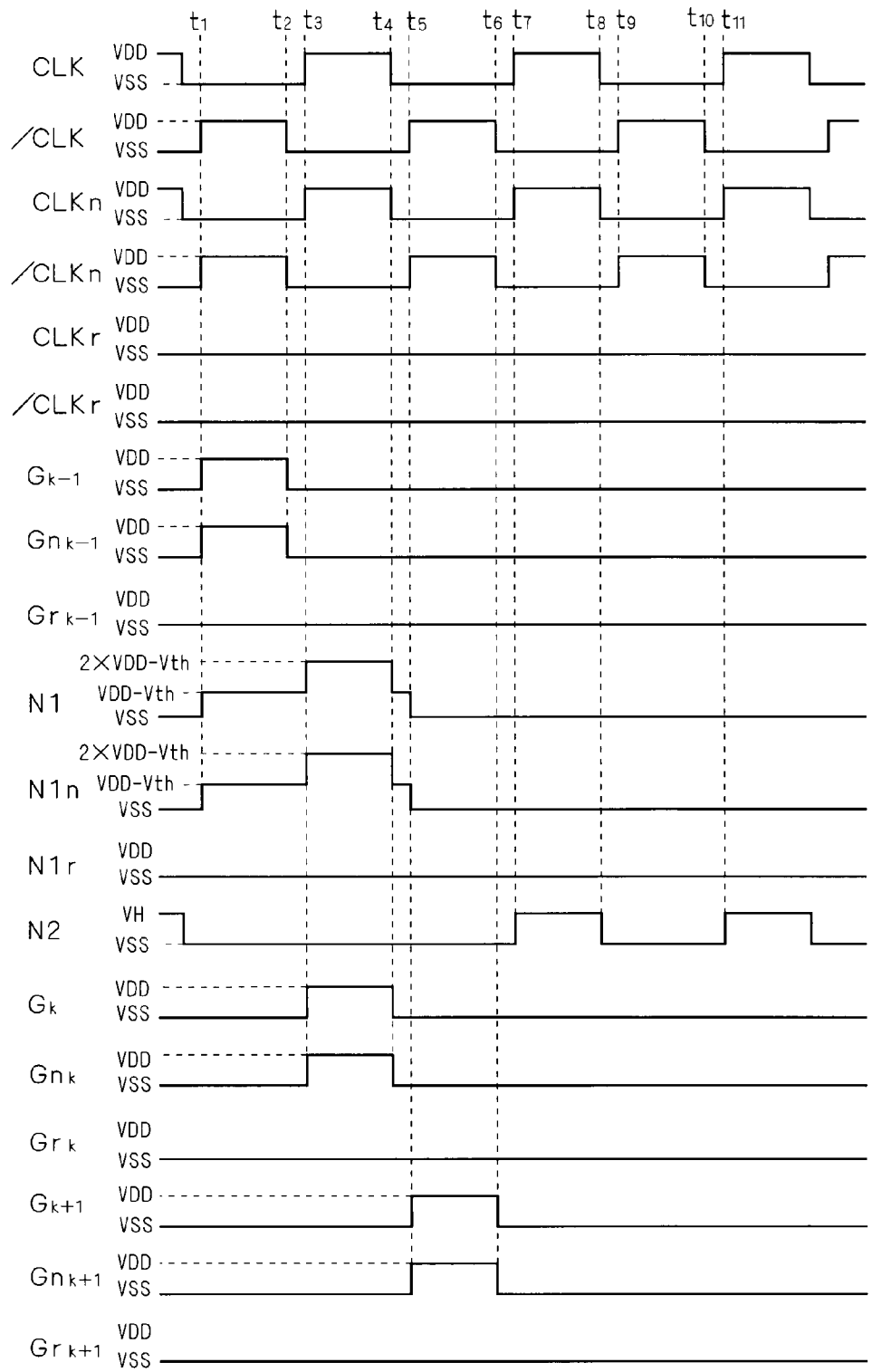
FIG. 10 is a timing chart showing an operation at the time of forward shift in the bidirectional unit shift register according to the embodiment 1.

First, the operation of the unit shift register $SR_k$ at the time of forward shift will be described. FIG. 10 is a timing chart showing the operation of the unit shift register $SR_k$ at the time of forward shift. Although a certain interval is provided between the active period (H level period) of the clock signal CLK and the active period of the clock signal /CLK in the drawing, the interval may not be indispensable. That is, the clocks may be two-phase clocks such that the clock signal CLk rises when the clock signal /CLK falls and the clock signal CLK falls when the clock signal /CLK rises.

At the time of forward shift, the forward clocks CLKn and /CLKn supplied from the clock signal generator 31 is activated at the same timing as the clock signals CLK and /CLK, and the backward clocks CLKr and /CLKr are fixed to L level. Since the backward signal $Gr_k$ outputted from the backward shift unit 43 is activated depending on the backward clock CLKr, the backward signal $Gr_k$ is always at L level at the time of forward shift.

It is assumed that the node N1 of the gate line drive unit 41, the node N1n of the forward shift unit 42, and the node N1r of the backward shift unit 43 are at L level in the unit shift register $SR_k$ in the initial state. In the following description, the state in which the node N1, the node N1n and the node N1r are at L level is referred to as the "reset state" of the gate line drive unit 41, the forward shift unit 42, and the backward shift unit 43, respectively. When the node N1 is at L level, since the transistor Q6 is off, although the node N2 is at a floating state, it is assumed that the node N2 is at L level (VSS) in this initial state. It is also assumed that both of the clock signals CLK and /CLK are at L level at this time.

It is assumed that the gate line drive signal $G_{k-1}$ and the forward signal $Gn_{k-1}$ from the previous-stage unit shift register $SR_{k-1}$ become H level at a time $t_1$ when the clock signal /CLK and the forward clock /CLKn become H level as shown in FIG. 10. When the clock signal /CLK becomes H level, the transistors Q2B, Q2Bn, and Q2Br are turned on in the unit shift register $SR_k$. In addition, when the forward signal $Gn_{k-1}$ of the previous-stage becomes H level, the transistors Q3Dn and Q3n are turned on and the nodes N1 and N1n are charged and become H level (VDD-Vth). Accordingly, the transistors Q1 and Q1n are turned on. The state when the node N1, the node N1n and node N1r are at H level is referred to as "set state" of the gate line drive unit 41, the forward shift unit 42, and the backward shift unit 43, respectively hereinafter.

Thus, when the transistors Q1, Q1n, Q2B, Q2Bn, and Q2Br are turned on, the output terminal OUT, the forward output terminal OUTn and the backward output terminal OUTr become L level of low impedance. While the output terminal OUT, the forward output terminal OUTn and the backward output terminal OUTr are at L level of low impedance, the gate line drive signal $G_k$, the forward signal $Gn_k$, and the backward signal $Gr_k$ are prevented from being outputted as error signals due to the influence such as a noise.

Since the node N1 is at H level, the transistor Q6 is turned on and the node N2 becomes L level of low impedance. Thus, at this time, the transistors Q2A, Q2An, Q2Ar, Q5, Q5n, and Q5r are kept off.

At a time $t_2$, when the clock signal /CLK and the forward clock /CLKn become L level, the gate line drive signal $G_{k-1}$ and the forward signal $Gn_{k-1}$ at the previous-stage become L level. Thus, the transistors Q2B, Q2Bn, Q2Br, Q3Dn, and Q3n are turned off. The nodes N1 and N1n are at H level in the floating state, and the transistors Q1 and Q1n are kept on, and the output terminal OUT and the forward output terminal OUTn are kept at L level of low impedance. Since the transistor Q6 is kept on, the node N2 is also kept at L level of low impedance. It is noted that since the transistor Q1r is off, the node OUTr is at L level of high impedance.

At a time $t_3$, when the clock signal CLK and the forward clock CLKn become H level, the selection operation of the gate line $GL_k$ is started. That is, the H level of the clock signal CLK and the forward clock CLKn is transmitted to the output terminal OUT and the forward output terminal OUTn through the transistors Q1 and Q1n in the on state and the gate line drive signal $G_k$ and the forward signal $Gn_k$ become H level.

At this time, the potentials of the nodes N1 and N1n rise to 2×VDD-Vth due to the coupling through the capacitive elements C1 and C1n. As a result, the transistors Q1 and Q1n operate in a non-saturated region (non-saturation operation), and the potentials of the gate line drive signal $G_k$ and the forward signal $Gn_k$ rise to VDD that is the same as the clock signal CLK and the forward clock CLKn.

The gate line drive signal $G_k$ is supplied to the corresponding gate line $GL_k$ and the gate line $GL_k$ is activated. Meanwhile, the forward signal $Gn_k$ is supplied to the forward input terminal INn of the subsequent-stage (unit shift register $SR_{k+1}$), and the subsequent-stage gate line drive unit 41 and forward shift unit 42 become the set state. The forward signal $Gn_k$ is also supplied to the forward reset terminal RSTn of the previous-stage (unit shift register $SR_{k-1}$), and the previous-stage gate line drive unit 41 and the forward shift unit 42 become the reset state.

Although the level of the node N2 tries to rise due to the coupling through the capacitive element C2 when the clock signal CLK rises at the time $t_3$, since the transistor Q6 is on, the level rise is immediately lowered and the operation of the unit shift register $SR_k$ is not influenced.

At a time $t_4$, when the clock signal CLK and the forward clock CLKn become L level, the output terminal OUT and the forward output terminal OUTn are discharged through the transistors Q1 and Q1n, respectively, and the gate line drive signal $G_k$ and the forward signal $Gn_k$ become L level (VSS). As a result, the selection operation of the gate line $GL_k$ is completed.

At a time $t_5$, when the clock signal /CLK and the forward clock /CLKn become H level, the gate line drive signal $G_{k+1}$ and the forward signal $Gn_{k+1}$ of the subsequent-stage become H level. The gate line drive signal $G_{k+1}$ activates (selects) the gate line $GL_{k+1}$. Meanwhile, the forward signal $Gn_{k+1}$ is inputted to the forward reset terminal RSTn of the unit shift register $SR_k$.

When the subsequent-stage forward signal $Gn_{k+1}$ becomes H level, the transistors Q4Dn and Q4n are turned on and the nodes N1 and N1n become L level in the unit shift register $SR_k$. That is, the gate line drive unit 41 and the forward shift unit 42 are returned to the reset state. Although the transistor Q6 is turned off because the node N1 becomes L level, since the clock signal CLK is at L level (the inverter composed of the capacitive element C2 and the transistor Q6 is in the inactive state), the potential of the node N2 does not rise and becomes L level of high impedance. Meanwhile, when the clock signal /CLK becomes H level, the transistors Q2B, Q2Bn, and Q2Br are turned on, and the output terminal OUT, the forward output terminal OUTn and the backward output terminal OUTr become L level of low impedance.

At a time $t_6$, when the clock signal /CLK and the forward clock /CLKn become L level, the gate line drive signal $G_{k+1}$ and the forward signal $Gn_{k+1}$ of the subsequent-stage become L level. As a result, the transistors Q4Dn and Q4n are turned off, and the node N1 and N1n become L level of high impedance.

At a time $t_7$, when the clock signal CLK and the forward clock CLKn become H level (the inverter composed of the capacitive element C2 and the transistor Q6 is activated), the node N2 becomes H level due to the coupling through the capacitive element C2. Accordingly, the transistors Q2A, Q2An, and Q2Ar are turned on, and the output terminal OUT, the forward output terminal OUTn and the backward output terminal OUTr become L level of low impedance. When the node N2 becomes H level, the transistors Q5, Q5n, and Q5r are turned on and the nodes N1, N1n, and N1r become L level of low impedance.

The operations of the transistors Q5, Q5n, and Q5r will be described. During a period while the unit shift register $SR_k$ does not activate the gate line drive signal $G_k$ (keeps at L level) (unselected period), the node N1 is at L level and the transistor Q1 is to be kept off. However, when the clock signal CLK rises, the potential of the node N1 tries to rise due to the coupling through overlap capacity (not shown) between the drain and the gate of the transistor Q1. When the transistor Q1 is turned on due to this potential rise, the problem is that the gate line drive signal $G_k$ is outputted as the error signal. Thus, as in the time $t_7$, the transistor Q5 is turned on when the clock signal CLK becomes H level during the unselected period, and the node N1 is discharged. As a result, the potential rise of the node N1 is prevented when the clock signal CLK rises during the unselected period, and the gate line drive signal $G_k$ is prevented from being generated as the error signal.

The same is true of the transistors Q5n and Q5r of the unit shift register $SR_k$, and they are turned on when the clock signal CLK rises during the unselected period. Since the forward clock CLKn is synchronized with the clock signal CLK at the time of forward shift, and backward clock CLKr is synchronized with the clock signal CLK at the time of backward shift, the transistors Q5n and Q5r are turned on when the forward clock CLKn and the backward clock CLKr rise, respectively. Thus, the potential rise of the nodes N1n and N1r due to the overlap capacity between the drains and gates of the transistors Q1n and Q1r can be prevented during the unselected period, and the forward signal $Gn_k$ and the backward signal $Gr_k$ can be prevented from being generated as the error signals.

At a time $t_8$, the clock signal CLK and the forward clock CLKn become L level. When the clock signal CLK becomes L level (the inverter composed of the capacitive element C2 and the transistor Q6 is inactivated), the node N2 becomes L level. Accordingly, the transistors Q5, Q5n, and Q5r are turned off, and the nodes N1, N1n, and N1r become L level of high impedance. In addition, the transistors Q2A, Q2An, and A2Ar are turned off, and the output terminal OUT, the forward output terminal OUTn, and the backward output terminal OUTr become L level of high impedance.

At a time $t_9$, when the clock signal /CLK and the forward clock /CLKn become H level, the transistors Q2B, Q2Bn, and Q2Br are turned on, and the output terminal OUT, the forward output terminal OUTn and the backward output terminal OUTr become L level of low impedance.

At a time, $t_{10}$, when the clock signal /CLK and the forward clock /CLKn become L level, the transistors Q2B, Q2Bn, and Q2Br are turned off, and the output terminal OUT, the forward output terminal OUTn, and the backward output terminal OUTr become L level of high impedance.

Thus, the operations from the time $t_7$ to the time $t_9$ are repeated and the gate line drive signal $G_k$ and the forward signal $Gn_k$ are kept at L level until the unit shift register $SR_k$ is selected at the next frame period.

As described above, when the unit shift register $SR_k$ receives the forward signal $Gn_{k-1}$ of the previous-stage at the time of forward shift, the gate line drive unit 41 and the forward shift unit 42 become the set state, and the gate line drive signal $G_k$ and the forward signal $Gn_k$ are activated at the timing when the clock signal CLK and the forward clock CLKn are activated next (become H level). Then, when it receives the forward signal $Gn_{k+1}$ of the subsequent-stage, the gate line drive unit 41 and the forward shift unit 42 return to the reset state, and the gate line drive signal $G_k$ and the forward signal $Gn_k$ are kept at L level.

The same operation as in the unit shift register $SR_k$ is performed in the unit shift register $SR_1$ (FIG. 8) and the unit shift register $SR_n$ (FIG. 9) although the signals inputted to the forward input terminal INn and the forward reset terminal RSTn are replaced by the forward start signal STn and the forward end signal EDn.

According to the gate line drive circuit 30 in which the above unit shift registers SR are cascade-connected as shown in FIG. 2, as shown in FIG. 3, the gate line drive signals $G_1$, $G_2$, $G_3$, ... are outputted from the unit shift registers $SR_1$, $SR_2$, $SR_3$, ... in synchronization with the clock signals CLK and /CLK, in this order, in response to the forward start signal STn inputted to the unit shift register $SR_1$. Thus, the gate line drive circuit 30 can sequentially drive the gate lines $GL_1$, $GL_2$, $GL_3$, ... in the predetermined scanning cycles. As shown in FIG. 3, the forward end signal EDn is inputted to the unit shift register $SR_n$ just after the last-stage unit shift register $SR_n$ outputs the gate line drive signal Gn.

Next, the operation of the unit shift register $SR_k$ at the time of backward shift will be described. FIG. 11 is a timing chart showing the operation of the unit shift register $SR_k$ at the time of backward shift. When the gate line drive circuit 30 performs the operation of backward shift, the clock signal generator 31 fixes the forward clocks CLKn and /CLKn to L level and level transfers the backward clocks CLKr and /CLKr at the same timing as the clock signals CLK and /CLK.

In this case, since the forward output terminal OUTn of the forward shift unit 42 in the unit shift register $SR_k$ is not activated, the forward signal $Gn_k$ is constantly at L level. Meanwhile, the backward shift unit 43 operates similarly to the forward shift unit 42 at the time of forward shift, and outputs the backward signal $Gr_k$. Although a detailed description will be omitted, when the waveform in FIG. 10 is compared with that in FIG. 11, it is understood that the operation of the forward shift unit 42 is switched to the operation of the backward shift unit 43 from the case of the forward shift.

As a result, since the backward signal Gr is outputted from the unit shift register SR, in the gate line drive unit 41 of the unit shift register $SR_k$, the transistors Q3Dr and Q4Dr that are not turned on at the time of forward shift operate similarly to the transistors Q3Dn and Q4Dn at the time of forward shift, and charge and discharge the node N1 (the level of the node N1 is the same in FIG. 10 and FIG. 11).

Thus, when the unit shift register $SR_k$ receives the backward signal $Gr_{k+1}$ of the next stage at the time of backward shift, the gate line drive unit 41 and the backward shift unit 43 become set state, and the gate line drive signal $G_k$ and the backward signal $Gr_k$ are outputted at the timing when the clock signal CLK and the backward clock CLKr are activated next. Then, when the gate line drive unit 41 and the backward shift unit 43 receive the backward signal $Gr_{k-1}$ of the previous-stage, they return to the reset state, and the gate line drive signal $G_k$ and the forward signal $Gr_k$ are kept at L level.

The same operation as the unit shift register $SR_k$ is performed in the unit shift register $SR_1$ (FIG. 8) and the unit shift register $SR_n$ (FIG. 9) although the signals inputted to the backward reset terminal RSTr and the backward input terminal INr are replaced by the backward end signal EDr and the backward start signal STr.

According to the gate line drive circuit 30 in which the above unit shift registers SR are cascade-connected as shown in FIG. 2, as shown in FIG. 4, the gate line drive signals $G_n$, $G_{n-1}$, $G_{n-2}$, ... are activated from the unit shift registers $SR_n$, $SR_{n-1}$, $SR_{n-2}$, ... in synchronization with the clock signals CLK and /CLK, in this order, in response to the activation of the backward start signal inputted to the unit shift register $SR_n$. Thus, the gate line drive circuit 30 can sequentially drive the gate lines $GL_n$, $GL_{n-1}$, $GL_{n-2}$, ... in the predetermined scanning cycles. As shown in FIG. 4, the backward end signal EDr is activated just after the last-stage unit shift register $SR_1$ activates the gate line drive signal $G_1$.

According to the unit shift register SR in this embodiment, in the case of forward shift, the nodes N1 and N1n are charged by the transistors Q3Dn and Q3n, and discharged by the transistors Q4Dn and Q4n. At this time, since the transistors Q3Dn and Q3n are the source follower operation, their threshold voltage is not shifted to the positive side, while the threshold voltage is shifted to the positive side in the transistors Q4Dn and Q4n. Meanwhile, since the gates of the transistors Q3Dr, Q3r, Q4Dr, and Q4r are fixed to L level, the threshold voltages of them are not shifted to the positive side.

In the case of backward shift, the nodes N1 and N1r are charged by the transistors Q3Dr and Q3r, and discharged by the transistors Q4Dr and Q4r. At this time, since the transistors Q3Dr and Q3r are the source follower operation, their threshold voltage is not shifted to the positive side, while the threshold voltage is shifted to the positive side in the transistors Q4Dr and Q4r. Meanwhile, since the gates of the transistors Q3Dn, Q3n, Q4Dn, and Q4n are fixed to L level, the threshold voltages of them are not shifted to the positive side.

Thus, according to the unit shift register SR in this embodiment, at the time of forward shift and at the time of backward shift, the transistors Q3Dn, Q3n, Q3Dr, and Q3r whose threshold voltages are not shifted to the positive side are used to charge the nodes N1, N1n, and N1r. Therefore, when the shift direction of the signal is switched, the level of the nodes N1, N1n, N1r after charged is prevented from being lowered due to the threshold voltage shift of the transistor. As a result, lowering the driving abilities of the transistors Q1, Q1n, and Q1r are suppressed. In addition, the operation margin of the unit shift register SR is prevented from being reduced, and an error operation is prevented from being generated.

Meanwhile, during the unselected period of the unit shift register SR, it is necessary to keep the output terminal OUT, the forward output terminal OUTn, the backward output terminal OUTr, and the nodes N1, N1n, and N1r at L level to prevent an error signal from being generated. Taking the k-stage unit shift register $SR_k$ as an example, during its unselected period, the transistors Q2A, Q2An, and Q2Ar are on while the clock signal CLK is activated and discharge the output terminal OUT, the forward output terminal OUTn, and the backward output terminal OUTr, respectively. The transistors Q2B, Q2Bn, and Q2Br are on while the clock signal /CLK is activated and discharge the output terminal OUT, the forward output terminal OUTn, and the backward output terminal OUTr, respectively.

Consequently, while the unit shift register $SR_k$ is unselected, the transistors Q2A and Q2B discharge the output terminal OUT alternately in the cycles of clock signals CLK and /CLK, and the transistors Q2An and Q2Bn discharge the forward output terminal OUTn alternately in the same cycles, and the transistors Q2Ar and Q2Br discharge the backward output terminal OUTr alternately in the same cycles. Thus, the output terminal OUT, the forward output terminal OUTn, and the backward output terminal OUTr are at L level of low impedance during the most period of the unselected period, so that an error signal is prevented from being generated.

As described above, the transistors Q5, Q5n, and Q5r of the unit shift register $SR_k$ during the unselected period are turned on during the activated period of the clock signal CLK to discharge the nodes N1, N1n, and N1r, respectively. Thus, the levels of the nodes N1, N1n, and N1r are prevented from rising due to the overlap capacity between the drains and the gates of the transistors Q1, Q1n, and Q1r.

Thus, each gate of the transistors Q2A, Q2B, Q2An, Q2Bn, Q2Ar, Q2Br, Q5, Q5n, and Q5r performing the discharging operation to prevent the error signal from being generated is not biased continuously during the unselected period, but biased alternately based on the cycle of the clock signals CLK and /CLK. Therefore, the threshold voltages of the transistors Q2A, Q2B, Q2An, Q2Bn, Q2Ar, Q2Br, Q5, Q5n, and Q5r are prevented from being shifted. Thus, lowering the driving abilities of them can be suppressed and the error signal can be prevented from being generated more definitely.

Embodiment 2

Figure 12:
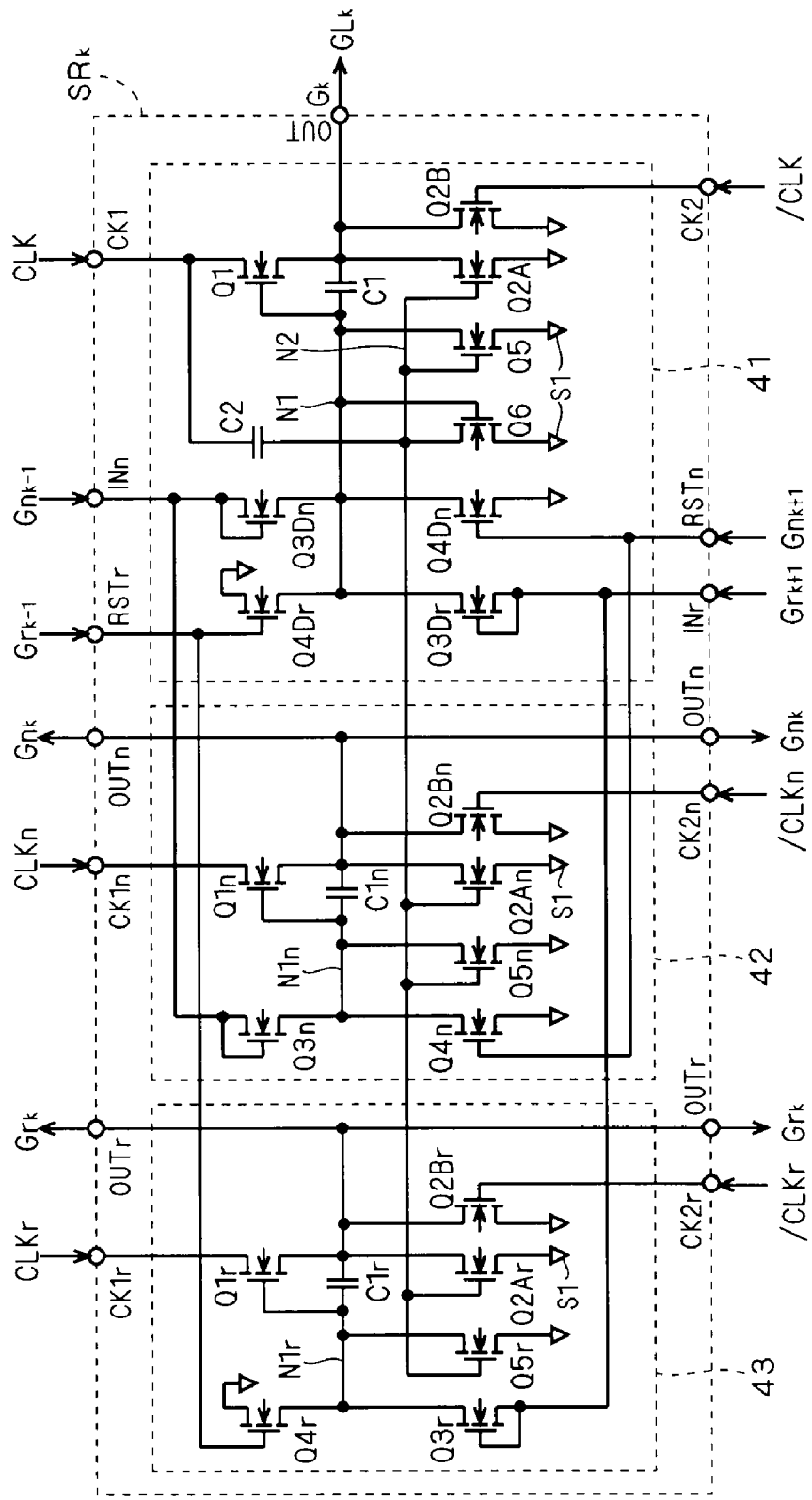
FIG. 12 is a view showing a constitution of a bidirectional shift register according to an embodiment 2.

FIG. 12 is a circuit diagram of the unit shift register SR according to an embodiment 2. Similar to the embodiment 1, since the unit shift registers $SR_1$ to $SR_n$ are the same circuits basically, a k-stage unit shift register $SR_k$ is shown also here representatively.

The unit shift register SR according to this embodiment is provided with a second forward clock terminal CK2n and a second backward clock terminal CK2r. Although the second forward clock terminal CK2n receives the forward clock CLKn or /CLKn similar to the first forward clock terminal CK1n, it receives the one opposite to that supplied to the first forward clock terminal CK1n. As shown in FIG. 12, for example, in the unit shift register $SR_k$, in which the forward clock CLKn is supplied to the first forward clock terminal CK1n, the forward clock /CLKn is supplied to the second forward clock terminal CK2n.

Although the second backward clock terminal CK2r receives the backward clock CLKr or /CLKr similar to the first backward clock terminal CK1r, it receives the one opposite to that supplied to the first backward clock terminal CK1r. As shown in FIG. 12, for example, in the unit shift register $SR_k$, in which the backward clock CLKr is supplied to the first backward clock terminal CK1r, the backward clock /CLKr is supplied to the second backward clock terminal CK2r.

According to the unit shift register SR in FIG. 12, the gate of the transistor Q2Bn is connected to the second forward clock terminal CK2n and the gate of the transistor Q2Br is connected to the second backward clock terminal CK2r as compared with the circuit in FIG. 7. The same operation as the unit shift register SR in the embodiment 1 can be performed even in this constitution.

According to this embodiment, since the transistor Q2Br at the time of forward shift and the transistor Q2Bn at the time of backward shift are not driven, there is an effect that a reactive power can be reduced in the inactive one of the forward shift unit 42 and the backward shift unit 43 (the backward shift unit 43 at the time of forward shift and the forward shift unit 42 at the time of backward shift).

Here, since the transistor Q2Br is kept off at the time of forward shift, and the transistor Q2Bn is kept off at the time of backward shift, the backward output terminal OUTr becomes a high impedance when the transistor Q2Ar is turned off at the time of forward shift, for example. In addition, the forward output terminal OUTn becomes a high impedance when the transistor Q2An is turned off at the time of backward shift. Therefore, it should be noted that the forward signal Gn and the backward signal Gr are likely to be outputted as error signals due to a noise and the like as compared with the embodiment 1.

As compared with the embodiment 1, since the number of signals supplied to the unit shift register SR is increased in this embodiment, the wiring is needed for that. However, since the forward clock /CLKn and the backward clock /CLKr are supplied to the unit shift registers $SR_{k-1}$ and $SR_{k+1}$ (not shown) adjacent to the unit shift register $SR_k$ shown in FIG. 7 in the embodiment 1, a change in layout (from the embodiment 1) required to receive the signals in the unit shift register $SR_k$ is small. Therefore, a circuit area is not increased as compared with the embodiment 1.

Embodiment 3

FIG. 13 is a circuit diagram showing the unit shift register SR according to an embodiment 3. Also in this drawing, the k-stage unit shift register $SR_k$ is representatively shown.

According to the unit shift register $SR_k$ in FIG. 7, when the clock signal CLK becomes L level during the unselected period, the transistors Q5, Q5n, and Q5r are turned off and the nodes N1, N1n, and N1r become L level of high impedance. Thus, during that period, the levels of the nodes N1, N1n, and N1r are likely to be affected by a noise and the like. Thus, according to this embodiment, the measures against the problem are proposed.

According to the unit shift register SR in this embodiment, the forward clock CLKn or /CLK that is opposite to the one inputted to the first forward clock terminal CK1n is inputted to the forward reset terminal RSTn, and the backward clock CLKr or /CLKr that is opposite to the one inputted to the first backward clock terminal CK1r is inputted to the backward reset terminal RSTr. For example, according to the unit shift register $SR_k$, as shown in FIG. 13, the forward clock /CLKn is inputted to the forward reset terminal RSTn, and the backward clock /CLKr is inputted to the backward reset terminal RSTr. Thus, the sources of the transistors Q4Dn and Q4n are connected to the forward input terminal INn, and the sources of the transistors Q4Dr and Q4r are connected to the backward input terminal INr.

According to the unit shift register SR in this embodiment, the transistors Q4Dn and Q4n and the transistors Q5 and Q5n are alternately turned on during the unselected period at the time of forward shift, and nodes N1 and N1n are low in impedance during almost all the unselected period. In addition, the transistors Q4Dr and Q4r and the transistors Q5 and Q5r are alternately turned on during the unselected period at the time of backward shift, and nodes N1 and N1n are low in impedance for almost all the unselected period, whereby the unit shift register SR is not likely to be affected by a noise and the reliability of the operation is enhanced as compared with the one in the embodiment 1.

Since the forward signal $Gn_{k-1}$ of the previous-stage is supplied to the sources of transistors Q4Dn and Q4n, when the forward signal $Gn_{k-1}$ of the previous-stage is activated, the transistors Q4Dn and Q4n are not turned on. Thus, when transistors Q3Dn and Q3n charge the nodes N1 and N1n at the time of forward shift, the transistors Q4Dn and Q4n do not hinder the operation. Therefore, the same forward shift as that of the unit shift register SR in FIG. 7 can be performed in the unit shift register SR in FIG. 13.

Since the forward signal $Gn_{k+1}$ of the subsequent-stage is supplied to the sources of transistors Q4Dr and Q4r, when the forward signal $Gn_{k+1}$ of the subsequent-stage is activated, the transistors Q4Dr and Q4r are not turned on. Thus, when transistors Q3Dr and Q3r charge the nodes N1 and N1r at the time of backward shift, the transistors Q4Dr and Q4r do not hinder the operation. Therefore, the same backward shift as that of the unit shift register SR in FIG. 7 can be performed in the unit shift register SR in FIG. 13.

According to this embodiment, it is not necessary to input the forward signal Gn of the subsequent-stage to the forward reset terminal RSTn of the unit shift register SR, and it is not necessary to input the backward signal Gr of the previous-stage to the backward reset terminal RSTr. That is, since the number of signals exchanged between the unit shift registers SR, the wiring can be simplified and the layout design of the circuit can be easy.

Furthermore, since load capacity applied to the forward signal Gn and the backward signal Gr of the unit shift register SR is reduced, the rising speed thereof becomes high. Therefore, the operation speed of a gate line drive circuit 30 can be high.

It is noted that since the charging and discharging of the gate capacity by the transistors Q4Dn and Q4n (at the time of forward shift) and the transistors Q4Dr and Q4r (at the time of backward shift) are repeated, power consumption is increased as compared with the embodiment 1.

As a variation of this embodiment, the same clock signal as the second clock terminal CK2 may be inputted to the forward reset terminal RSTn and the backward reset terminal RSTr. For example, according to the unit shift register $SR_k$ shown in FIG. 13, the clock signal /CLK is inputted to the forward reset terminal RSTn and the backward reset terminal RSTr. According to this variation, since transistors Q4Dn, Q4n, and Q4r and transistors Q5, Q5n, and Q5r are alternately turned on during the unselected period regardless of forward shift and backward shift, the nodes N1, N1n, N1r are low in impedance for almost all the unselected period, whereby the same effect as the above can be achieved.

The embodiment 2 can be applied to the unit shift register SR in this embodiment. That is, the gates of the transistors Q2Bn and Q2Br may be connected to the second forward clock terminal CK2n and the second backward clock terminal CK2r, respectively in the unit shift register SR shown in FIG. 13.

Embodiment 4

Figure 14:
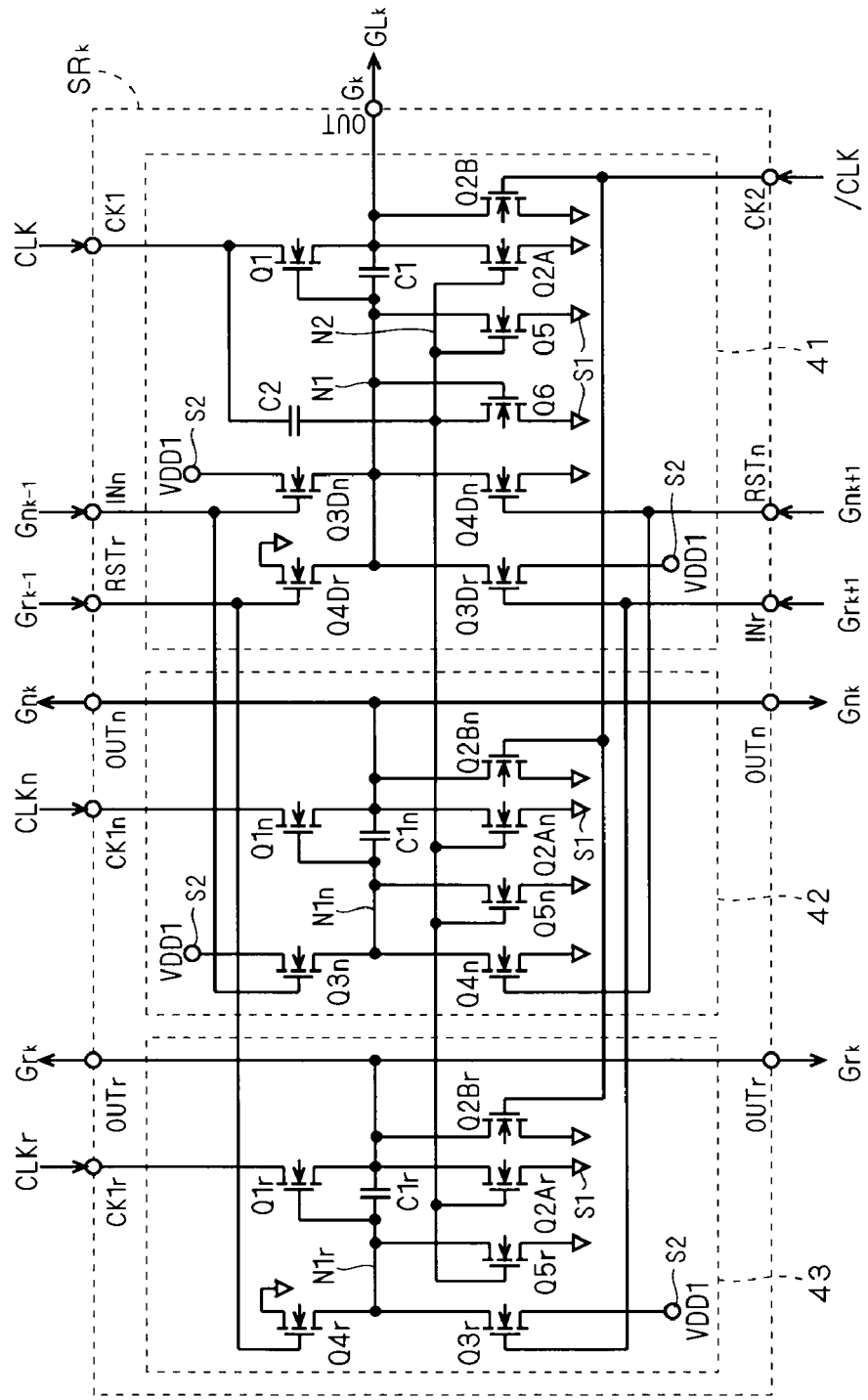
FIG. 14 is a view showing a constitution of a bidirectional shift register according to an embodiment 4.

FIG. 14 is a circuit diagram showing the unit shift register SR according to an embodiment 4. Also in this drawing, the k-stage unit shift register $SR_k$ is shown representatively.

According to the unit shift register SR in this embodiment, the drains of the transistors Q3Dn, Q3Dr, Q3n, and Q3r are connected to a second power supply terminal S2 to which a constant potential VDD1 is supplied as compared with the circuit shown in FIG. 7. Although the level of the potential VDD1 may be any level as long as the gate line drive circuit 30 can operate normally, it may be the same as the H level potential of the clock signals CLK and /CLK (potential VDD in the embodiment 1).

Although the previous-stage forward signal Gn and the subsequent-stage backward signal Gr are used as the power supplied to charge the node N1, N1n, and N1r of the unit shift register SR in the embodiment 1, the second power supply terminal S2 is used as their power supply in this embodiment. Therefore, the load applied to the forward signal Gn and the subsequent-stage backward signal Gr in each unit shift register SR can be reduced and their rising speed is increased. Therefore, the operation speed of the gate line drive circuit 30 can be increased. It should be noted that an external terminal and a wiring region for supplying the potential VDD1 are required.

The embodiment 2 can be applied to the unit shift register SR in this embodiment. That is, the gates of the transistors Q2Bn and Q2Br may be connected to the second forward clock terminal CK2n and the second backward clock terminal CK2r, respectively in the unit shift register SR shown in FIG. 14.

Figure 15:
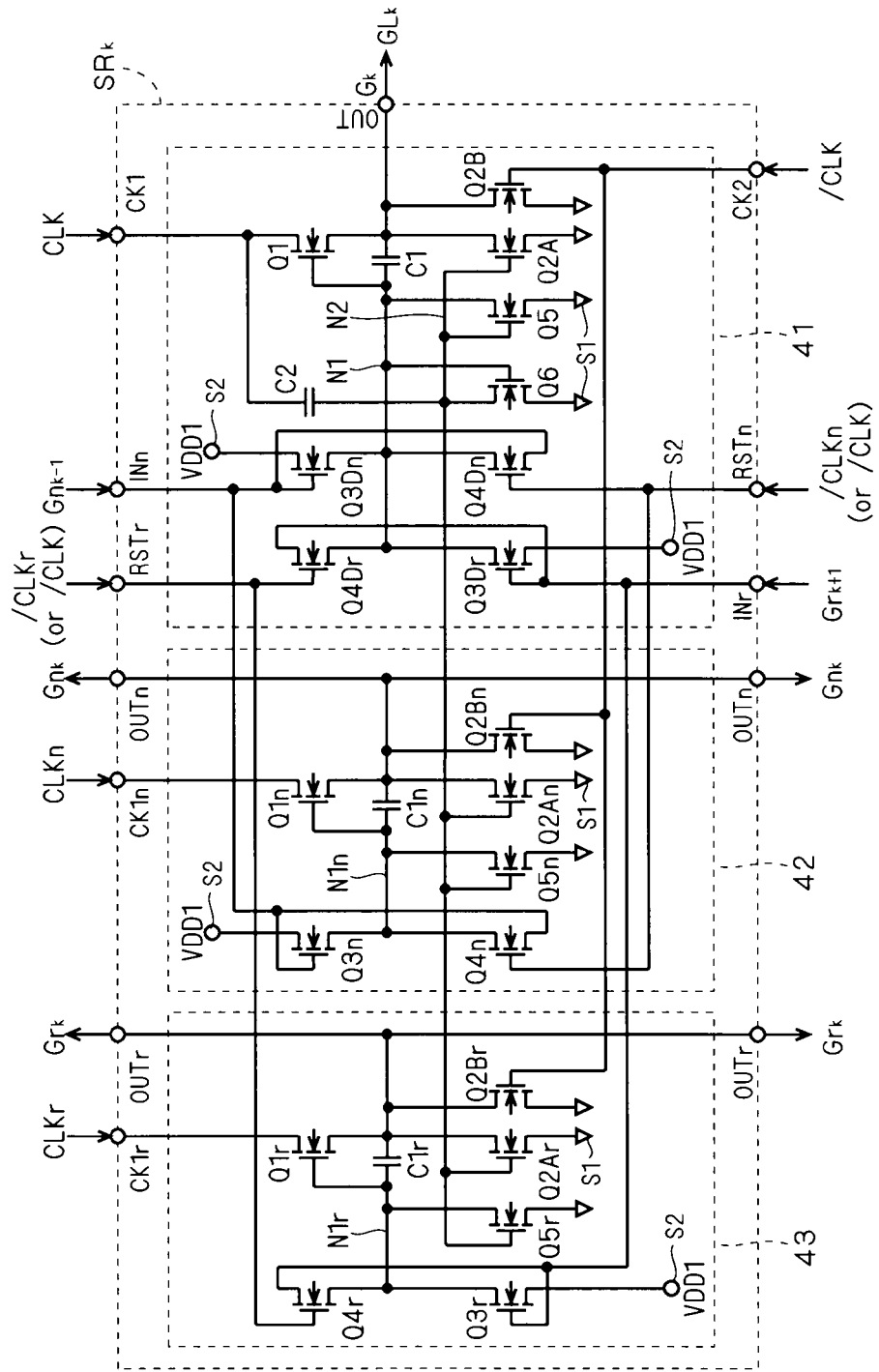
FIG. 15 is a view showing a variation of the bidirectional shift register according to the embodiment 4.

Furthermore, the embodiment 3 can be applied to the unit shift register SR in this embodiment. According to the k-stage unit shift register $SR_k$, as shown in FIG. 15, the forward clock /CLKn (or clock signal /CLK) is supplied to the gates of the transistors Q4Dn and Q4n (forward reset terminal RSTn) and the sources thereof are connected to the forward input terminal INn. In addition, the backward clock /CLKr (or clock signal /CLK) is supplied to the gates of the transistors Q4Dr and Q4r (forward reset terminal RSTr) and the sources thereof are connected to the backward input terminal INr.

Particularly, the application of the embodiment 3 is effective in this embodiment. The reason for that is as follows. That is, since the constant potential VDD1 is constantly applied to the drains of the transistors Q3Dn, Q3Dr, Q3n, and Q3r in the shift register shown in FIG. 14, there is concern that the levels of the nodes N1, N1n, and N1r rise due to their leak current during the inactivated period of the clock signal CLK. In this case, the gate line drive signal G and the forward signal Gn are likely to be generated as error signals at the time of forward shift, and the gate line drive signal G and the backward signal Gr are likely to be generated as error signals at the time of backward shift. As shown in FIG. 15, when the embodiment 3 is applied, since the transistors Q4Dn, Q4n, and Q4r are turned on during the inactivated period of the clock signal CLK, and the nodes N1, N1n, and N1r is at L level of low impedance, the above problem of the leak current can be solved.

Embodiment 5

Figure 16:
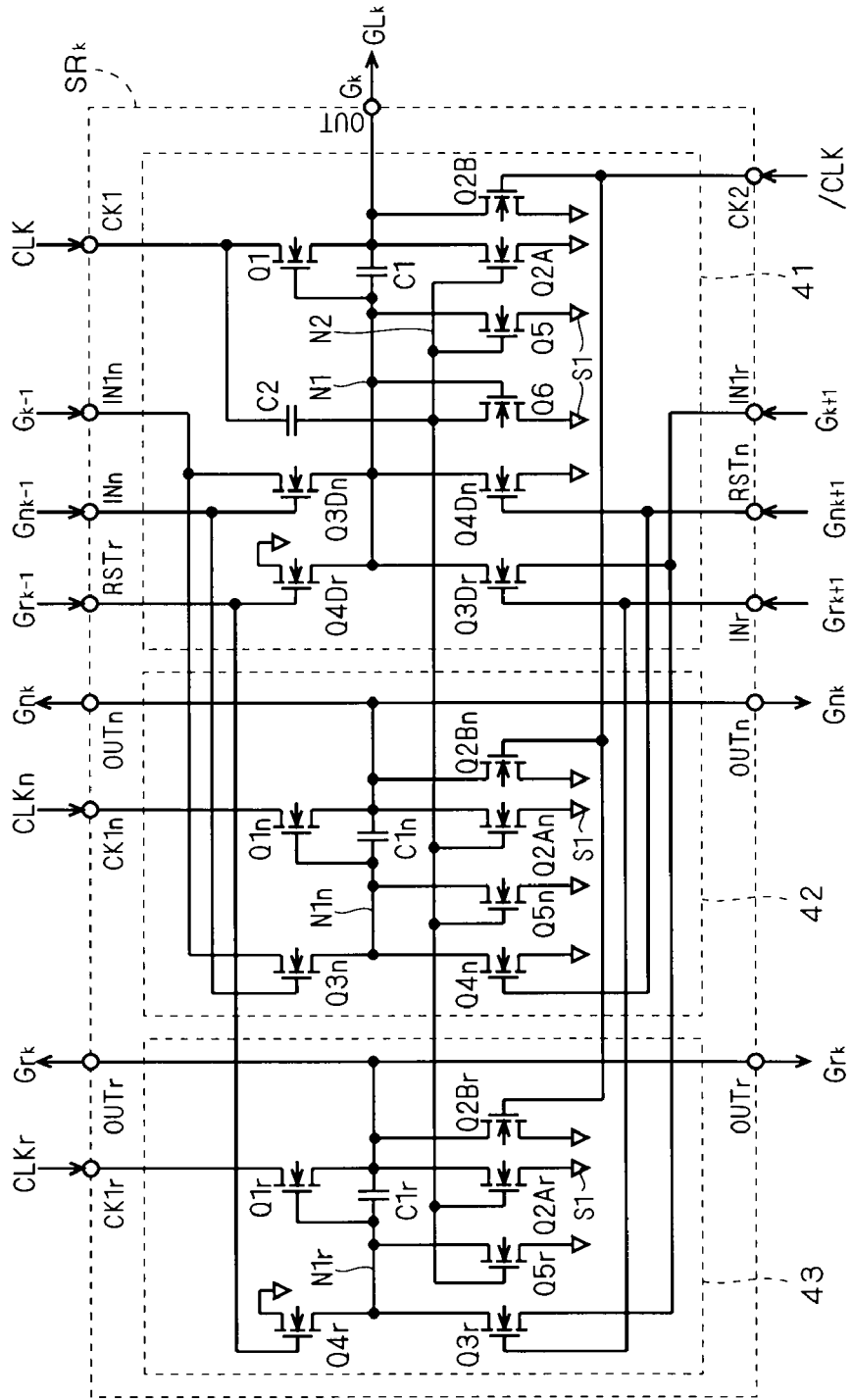
FIG. 16 is a view showing a constitution of a bidirectional shift register according to an embodiment 5.

FIG. 16 is a circuit diagram showing the unit shift register SR according to an embodiment 5. Also in this drawing, the k-stage unit shift register $SR_k$ is representatively shown.

The unit shift register SR in this embodiment includes a forward drive signal input terminal IN1n receiving the gate line drive signal G of the previous-stage and a backward drive signal input terminal IN1r receiving the gate line drive signal G of the subsequent-stage. The drains of the transistors Q3Dn and Q3n are connected to the forward drive signal input terminal IN1n, and the drains of the transistors Q3Dr and Q3r are connected to the backward drive signal input terminal IN1r as compared with the circuit shown in FIG. 14 in the embodiment 4.

As a result, the load applied to the forward signal Gn and the subsequent-stage backward signal Gr can be reduced in the unit shift register SR, so that their rising speed is increased. Since the load capacity of the gate line drive signal G is sufficiently large as compared with the capacity component provided in the nodes N1, N1n, and N1r, even when the nodes N1, N1n, and N1r are added as the load of the gate line drive signal G, the rising of the gate line drive signal G is not delayed. As a matter of course, the external terminal and the wiring region for supplying the potential VDD1 that are required in the circuit in FIG. 14 are not required.

The above embodiments 2 and 3 can be applied to this embodiment.

Embodiment 6

Figure 17:
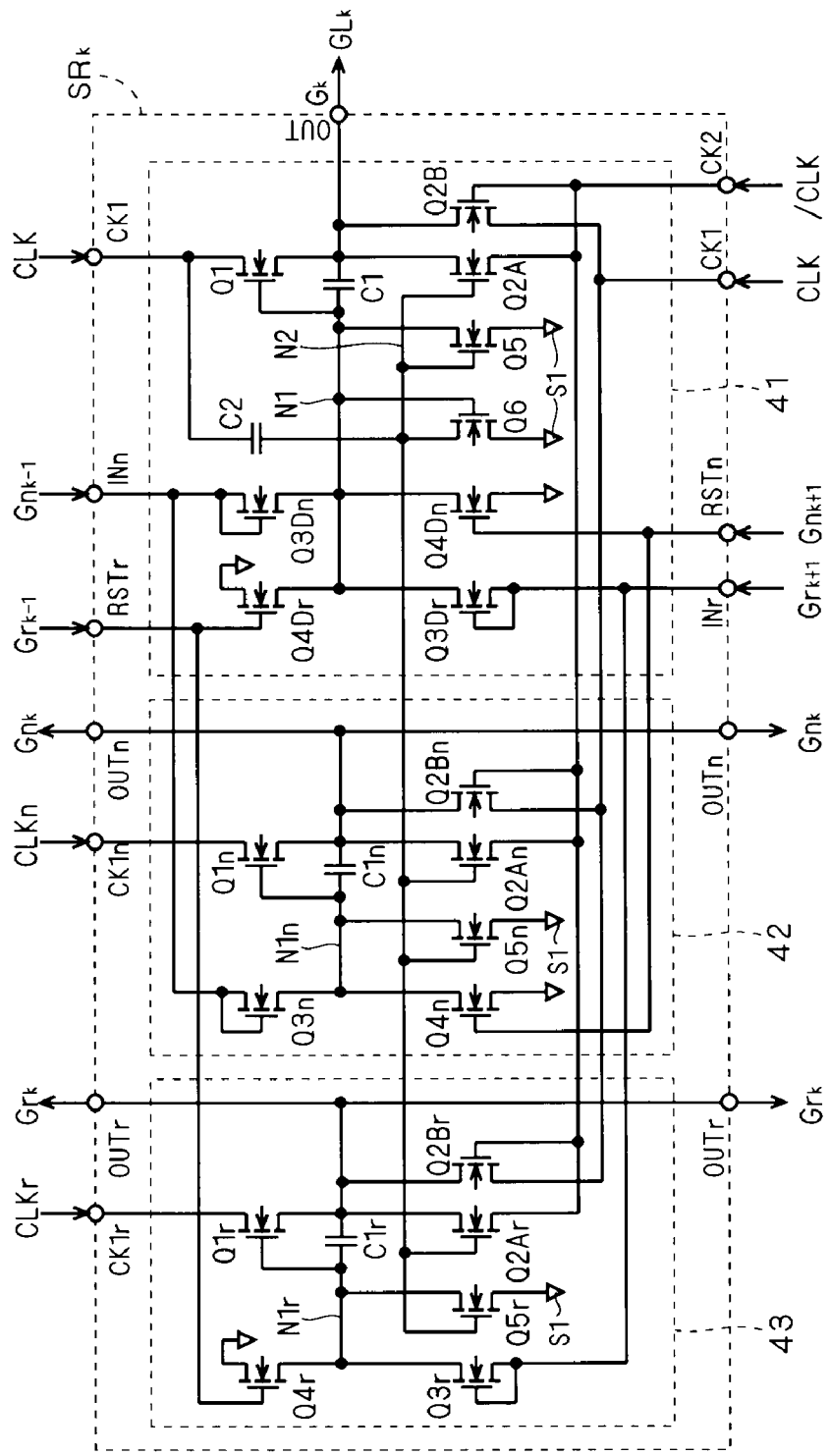
FIG. 17 is a view showing a constitution of a bidirectional shift register according to an embodiment 6.

FIG. 17 is a circuit diagram showing the unit shift register SR according to an embodiment 6. Also in this drawing, the k-stage unit shift register $SR_k$ is representatively shown.

According to the unit shift register SR in this embodiment, the sources of the transistor Q2A, Q2An, and Q2Ar are connected to the second clock terminal CK2, and the sources of the transistors Q2B, Q2Bn, and Q2Br are connected to the first clock terminal CK1 as compared with the circuit in FIG. 7.

According to this constitution, when the gates of the transistors Q2A, Q2An, Q2Ar, Q2B, Q2Bn, and Q2Br become L level and they are turned off, the signals inputted to their sources become H level. That is, the state is equivalent to the state in which the gate is negatively biased with respect to the source, the threshold voltage positively shifted returns to the negative side and recovers. As a result, there is an effect that the driving abilities of transistors Q2A, Q2An, Q2Ar, Q2B, Q2Bn, and Q2Br are prevented from being lowered and the life of the circuit can be elongated.

Figure 18:
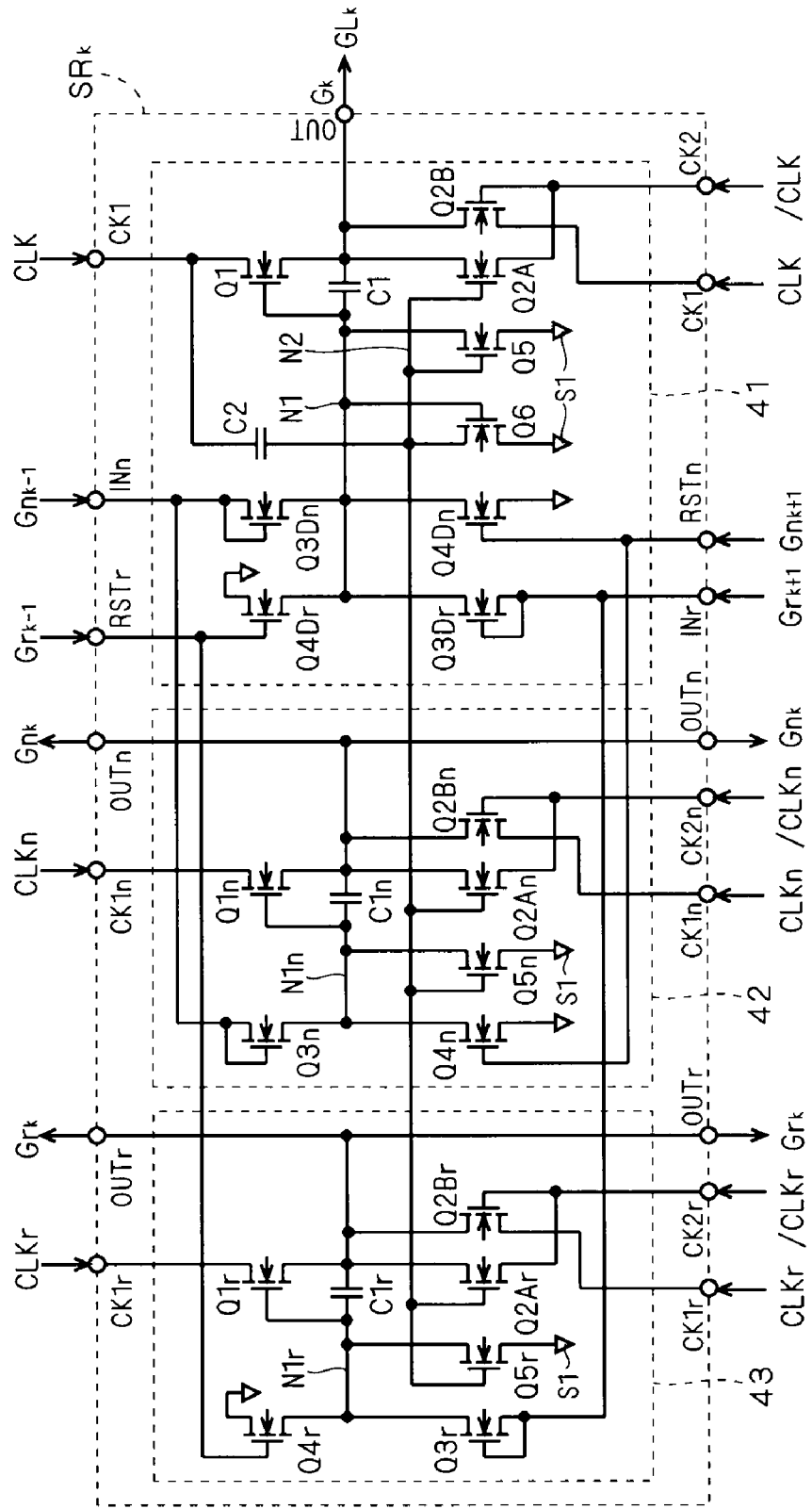
FIG. 18 is a view showing a variation of the bidirectional shift register according to the embodiment 6.

As a variation of this embodiment, as shown in FIG. 18, the source of the transistor Q2Bn is connected to the first forward clock terminal CK1n, and the source of the transistor Q2Br is connected to the first forward clock terminal CK1n.

In addition, as shown in this drawing, the second forward clock terminal CK2n and the second backward clock terminal CK2r are provided in the unit shift register SR as described in the embodiment 2 and the source of the transistor Q2An is connected to the second forward clock terminal CK2n, and the source of the transistor Q2Ar is connected to the second backward clock terminal CK2r. In this drawing, the embodiment 2 is applied such that the gate of the transistor Q2Bn is connected to the second forward clock terminal CK2n, and the gate of the Q2Br is connected to the second forward clock terminal CK2n. As a matter of course, the gates of the transistors Q2Bn and Q2Br may be connected to the second clock terminal CK2 similar to FIG. 17.

The embodiments 2 and 3 can be applied to this embodiment.

Embodiment 7

Figure 19:
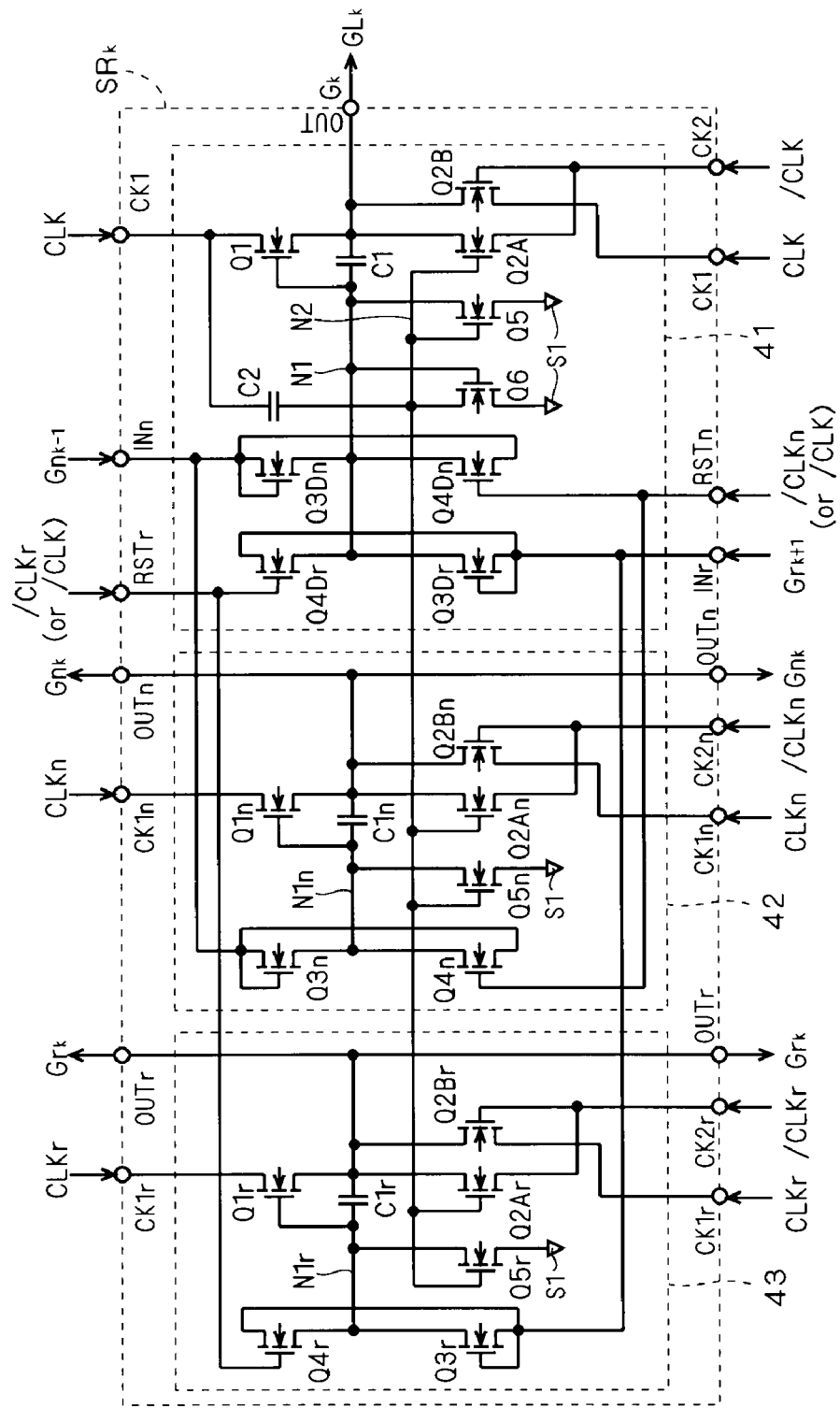
FIG. 19 is a view showing a constitution of a bidirectional shift register according to an embodiment 7.

FIG. 19 is a circuit diagram showing the unit shift register SR according to an embodiment 7. Also in this drawing, the k-stage unit shift register $SR_k$ is representatively shown.

According to this embodiment, the embodiment 3 (FIG. 3) is applied to the unit shift register SR (FIG. 13) according to the variation described in the embodiment 6. According to this constitution, the effects of the embodiments 3 and 6 are achieved. Furthermore, among the transistors constituting the unit shift register SR, transistors whose sources are connected to the first power supply terminal S1 are only the transistors Q5, Q5n, Q5r, and Q6, so that the wiring region for supplying the low potential side power supply potential VSS can be minimum. Thus, the space of the circuit can be small.

Embodiment 8

As described above, according to the embodiment 1, the threshold voltages of the transistors Q2A, Q2B, Q2An, Q2Bn, Q2Ar, Q2Br, Q5, Q5n, and Q5r (referred to as "pull-down transistor" hereinafter) for discharging (pulling down) the output terminal OUT, the forward output terminal OUTn, the backward output terminal OUTr, and the nodes N1, N1n, and N1r during the unselected period are prevented from being shifted by biasing the gates of them alternately in the cycle of the clock signals CLK and /CLK. Thus, the driving ability of the pull-down transistor is prevented from being lowered and the effect to prevent an error signal from being generated is enhanced.

According to this embodiment, a description will be made of another method for preventing the threshold voltages of the pull-down transistors for discharging the output terminal OUT, the forward output terminal OUTn, the backward output terminal OUTr, and the nodes N1, N1n, and N1r from being shifted during the unselected period.

Figure 20:
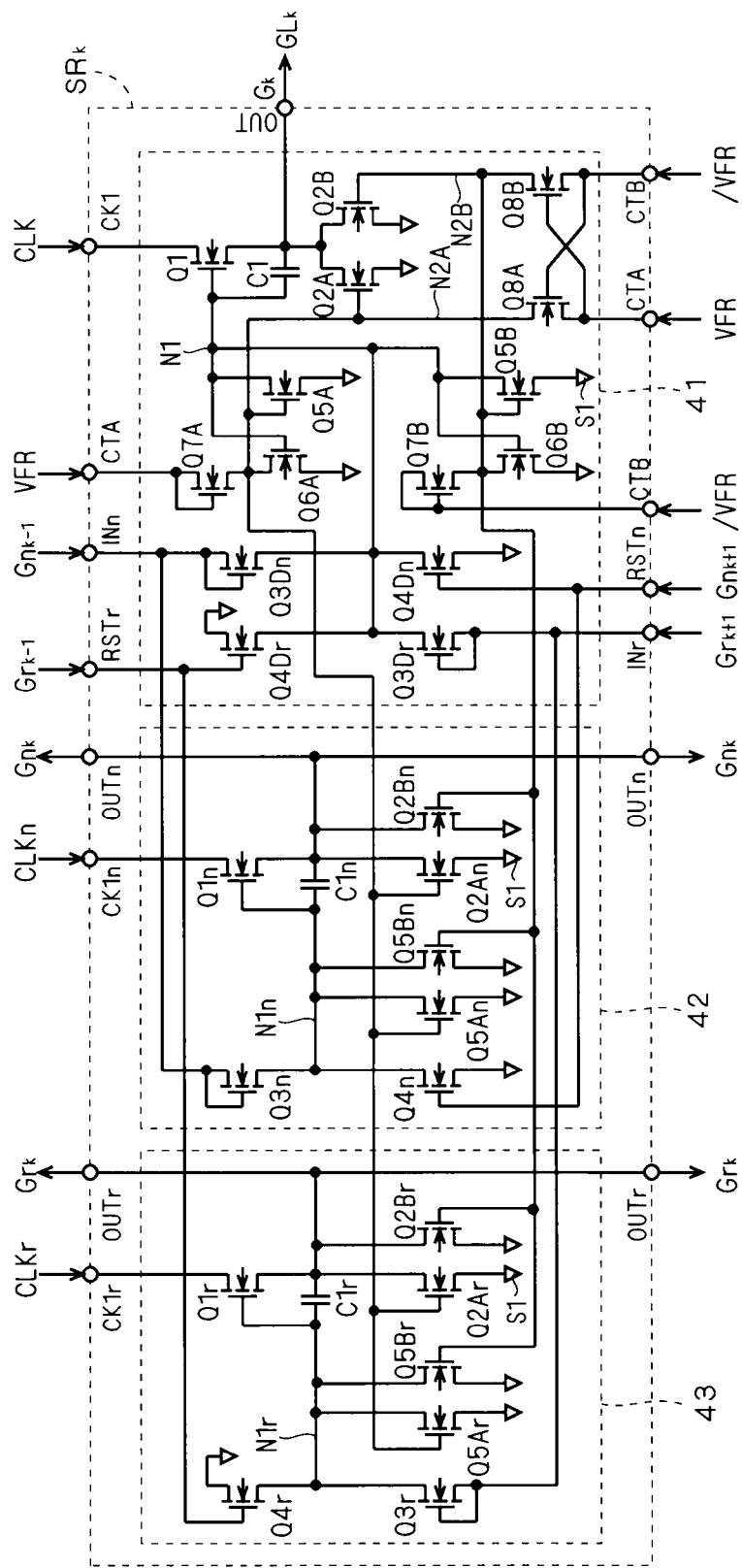
FIG. 20 is a view showing a constitution of a bidirectional shift register according to an embodiment 8.

FIG. 20 is a circuit diagram showing the unit shift register SR according to an embodiment 8. Also in this drawing, the k-stage unit shift register $SR_k$ is shown representatively. The constitution of the unit shift register SR according to this embodiment will be described with reference to the drawing.

The unit shift register SR according to this embodiment is provided with first and second frame signal terminals CTA and CTB (first and second control terminals) to which predetermined first and second frame signals VFR and /VFR (first and second control signals) are inputted. While the first and second frame signals VFR and /VFR may be inputted to the first or second frame signal terminals CTA and CTB in view of the symmetry of the circuit, the first frame signal VFR is inputted to the first frame signal terminal CTA, and the second frame signal /VFR is inputted to the second frame signal terminal CTB here in all the unit shift registers $SR_1$ to $SR_n$.

The first and second frame signals VFR and /VFR are complementary signals. Preferably, the first and second frame signals VFR and /VFR are controlled such that the levels thereof are switched (alternated) during a blank period between the frames of the display image, for example, the level is switched in a cycle of each frame of the display image. The cycle does not necessarily correspond to each frame, and it may correspond to its integral multiple (two frames, three frames, and the like). Since the gate line drive circuit 30 operates to activate the gate lines $GL_1$ to $GL_n$ with respect to each frame repeatedly, the frame cycle of the video signal is defined as its operation cycle.

The unit shift register SR in this embodiment is also composed of the gate line drive 41, the forward shift unit 42, and the backward shift unit 43.

The output stage of the gate line drive unit 41 includes the transistor Q1 connected between the output terminal OUT and the first clock terminal CK1, and the transistors Q2A and Q2B connected between the output terminal OUT and the first power supply terminal S1 similar to the embodiment 1. The node connected to the gate of the transistor Q1 is also defined as the "node N1". The capacitive element C1 is provided between the gate and source of the transistor Q1, that is, between the node N1 and the output terminal OUT.

The transistor Q1 is driven by a circuit composed of the transistors Q3Dn, Q4Dn, Q3Dr, and Q4Dr, and has the same constitution shown in FIG. 7. That is, the transistor Q3Dn is diode-connected such that the side of the forward input terminal INn is an anode and the side of the node N1 is a cathode, and the transistor 4Dn is connected between the node N1 and the first power supply terminal S1 and its gate is connected to the forward reset terminal RSTn. The transistor Q3Dr is diode-connected such that the side of the backward input terminal INr is an anode and the side of the node N1 is a cathode, and the transistor Q4Dr is connected between the node N1 and the first power supply terminal S1 and its gate is connected to the backward reset terminal RSTr.

The gate line drive unit 41 in this embodiment has two inverters (first and second inverters). When the gate node of the transistor Q2A is defined as the "node N2A", and the gate node of the transistor Q2B is defined as the "node N2B", respectively, the node N1 is the input terminal and the node N2A is the output terminal of the first inverter composed of the transistors Q6A and Q7A, respectively, and the node N1 is the input terminal and the node N2B is the output terminal of the second inverter composed of the transistor Q6B and Q7B, respectively.

That is, while the transistors Q2A and Q2B discharge the output terminal OUT, the transistor Q2A is controlled by the output of the first inverter, and the transistor Q2B is controlled by the output of the second inverter.

The transistor Q6A is connected between the node N2A and the first power supply terminal S1 and its gate is connected to the node N1 in the first inverter. The transistor Q7A is connected between the node N2A and the first frame signal terminal CTA and its gate is connected to the first frame signal terminal CTA. That is, the transistor Q7A is diode-connected such that the side of the first frame signal terminal CTA is an anode, and the side of the node N2A is a cathode.

The on resistance of the transistor Q6A is set sufficiently lower than that of the transistor Q7A. That is, the first inverter is a ratio-type inverter in which the diode-connected transistor Q7A is a load element, and the L-level potential outputted from it is determined by a ratio of the on resistances of the transistors Q6A and Q7A. It is noted that the first inverter differs from the general inverter in that the first frame signal VFR is supplied as its power supply.

According to the second inverter, the transistor Q6B is connected between the node N2B and the first power supply terminal S1, and its gate is connected to the node N1. The transistor Q7B serving as the load element is connected between the node N2B and the second frame signal terminal CTB and its gate is connected to the second frame signal terminal CTB. That is, the transistor Q7B is diode-connected such that the side of the second frame signal terminal CTB is an anode and the side of the node N2B is a cathode. This second inverter is also a ratio-type inverter and the second frame signal /VFR is supplied as its power supply.

The gate line drive unit 41 includes the transistor Q5A connected between the node N1 and the first power supply terminal S1 and having a gate connected to the node N2A, as well as the transistor Q5B connected between the node N1 and the first power supply terminal S1 and having a gate connected to the node N2B. That is, while the transistors Q5A and Q5B discharge the node N1, the transistor Q5A is controlled by the output of the first inverter, and the transistor Q5B is controlled by the output of the second inverter.

Thus, in the gate line drive unit 41, the transistors Q2A and Q5A among the pull-down transistors of the output terminal OUT and the node N1 are driven by the first inverter. That is, the transistors Q2A and Q5A are controlled based on the level of the node N1 that is inverted by the first inverter. It is noted that since the first frame signal VFR is the power supply of the first inverter, such control is provided while the first frame signal VFR is at H level only, and the gates of the transistors Q2A and Q5A are not biased and in a resting state during other periods.

Meanwhile, the transistors Q2B and Q5B are driven by the second inverter. That is, the transistors Q2B and Q5B are controlled based on the level of the node N1 that is inverted by the second inverter. It is noted that since the second frame signal /VFR is the power supply of the second inverter, such control is provided while the second frame signal /VFR is at H level only, and the gates of the transistors Q2B and Q5B are not biased and in a resting state during other periods.

The gate line drive unit 41 includes a transistor Q8A connected between the first frame signal terminal CTA and the node N2A as well as a transistor Q8B connected between the second frame signal terminal CTB and the node N2B. The gate of the transistor Q8A is connected to the source (second frame signal terminal CTB) of the transistor Q8B, and the gate of the transistor Q8B is connected to the source (first frame signal terminal CTA) of the transistor Q8A. That is, according to the transistors Q8A and the transistor Q8B, each of the main electrodes (sources) thereof is connected to each of the gates in a crossed manner, so that a flip-flop circuit is provided.

Next, the constitutions of the forward shift unit 42 and the backward shift unit 43 will be described. The forward shift unit 42 and the backward shift unit 43 have the constitution similar to that shown in FIG. 7.

That is, according to the forward shift unit 42 in this embodiment, as the pull-down transistor of the node N1n, two transistors Q5An and Q5Bn are provided instead of the transistor Q5n in FIG. 7. The transistors Q5An and Q5Bn are connected between the node N1n and the first power supply terminal S1, the gate of the transistor Q5An is connected to the node N2A, and the gate of the transistor Q5Bn is connected to the node N2B. Furthermore, the gate of the transistor Q2An is connected to the node N2A, and the gate of the transistor Q2Bn is connected to the node N2B.

That is, in the forward shift unit 42, the transistors Q2An and Q5An among the pull-down transistors of the forward output terminal OUTn and the node N1n are driven by the first inverter of the gate line drive unit 41. Meanwhile, the transistors Q2Bn and Q5Bn are driven by the second inverter of the gate line drive unit 41.

According to the backward shift unit 43 in this embodiment, two transistors Q5Ar and Q5Br are provided instead of the transistor Q5r in FIG. 7. The transistors Q5Ar and Q5Br are connected between the node N1r and the first power supply terminal S1, the gate of the transistor Q5Ar is connected to the node N2A, and the gate of the transistor Q5Br is connected to the node N2B. Furthermore, the gate of the transistor Q2Ar is connected to the node N2A, and the gate of the transistor Q2Br is connected to the node N2B.

That is, in the backward shift unit 43, the transistors Q2Ar and Q5Ar among the pull-down transistors of the backward output terminal OUTr and the node N1r are driven by the first inverter of the gate line drive unit 41. Meanwhile, the transistors Q2Br and Q5Br are driven by the second inverter of the gate line drive unit 41.

Thus, the unit shift register SR in this embodiment has the two pull-down transistors for each of the output terminal OUT, the forward output terminal OUTn, the backward output terminal OUTr, and the nodes N1, N1n, and N1r. Thus, a group (referred to as the "group A") of the transistors Q2A, Q5A, Q2An, Q5An, Q2Ar and Q5Ar are driven by the first inverter, and a group (referred to as the "group B") of the transistors Q2B, Q5B, Q2Bn, Q5Bn, Q2Br and Q5Br are driven by the second inverter. The first and second frame signals VFR and /VFR function as signals for switching and operating the two groups.

The operation of the gate line drive circuit 30 according to this embodiment will be described hereinafter. Here, it is assumed that the potentials of the first and second frame signals at H level and L level are set to the high potential side power supply potential VDD and the low potential side power supply potential VSS (=0V), respectively similar to the assumption in the other signals. It is noted that the potentials of the first and second frame signals VFR and /VFR at H level and L level may be any potential as long as the gate line drive circuit 30 can normally operate.

The operation of the unit shift register $SR_k$ will be described representatively with reference to FIG. 20. It is assumed that the first frame signal VFR has been switched from L level to H level, and the second frame signal /VFR has been switched from H level to L level during a certain blank period. Then, according to the unit shift register $SR_k$, since the first frame signal terminal CTA becomes H level and the second frame signal terminal CTB becomes L level, the transistor Q7A is turned on and the transistor Q7B is turned off. That is, in the gate line drive unit 41, the first inverter is activated and the second inverter is inactivated.

The transistor Q8B is turned on, and the node N2B becomes L level (level of the second frame signal /VFR). While the transistor Q5B is turned off accordingly, the transistor Q5B is on just before it, so that the node N1 is at L level. Thus, at this time, the transistor Q6A is off. When the second frame signal /VFR becomes L level, the transistor Q8A is also off. Therefore, the node N2A serving as the output end of the first inverter is charged by the transistor Q7A and becomes H level.

Meanwhile, the second frame signal /VFR becomes L level, since the power is not supplied to the second inverter and the transistor Q8B is turned on by the first frame signal VFR, the node N2B serving as the output end of the second inverter is fixed to L level (VSS). That is, during that period, the gates of the transistors Q2B and Q5B of the gate line drive unit 41 is not biased and becomes a resting state.

As a result, in the gate line drive unit 41 in FIG. 20, almost the same circuit as in the gate line drive unit 41 in FIG. 7 is constituted by the combination of the transistors Q1, Q2A, Q3Dn, Q3Dr, Q4Dn, Q4Dr, Q5A, Q6A, and Q7A.

Therefore, the gate line drive unit 41 in FIG. 20 when the first frame signal VFR is at H level and the second frame signal /VFR is at L level performs the same operation as in the gate line drive unit 41 in FIG. 7. However, while the inverter in the gate line drive unit 41 in FIG. 7 is activated based on the clock signal CLK, the first inverter of the gate line drive unit 41 in FIG. 20 is activated based on the first frame signal VFR, so that the node N2A is kept at H level during the unselected period. That is, while the transistors Q2A and Q5A in FIG. 7 are turned of and off based on the cycle of the clock signal /CLK during the unselected period, the transistors Q2A and Q5A in FIG. 20 are kept on during the unselected period. At this point, the operation in this embodiment differs from that of the gate line drive unit 41 in FIG. 7.

Next, a description will be made of the forward shift unit 42 and the backward shift unit 43 in FIG. 20 when the first frame signal VFR is at H level and the second frame signal /VFR is at L level. As described above, when the first frame signal VFR is at H level and the second frame signal /VFR is at L level, since the node N2B is fixed to L level, the transistors Q2Bn and Q5Bn are in the resting state in the forward shift unit 42, and almost the same circuit as in the forward shift unit 42 in FIG. 7 is constituted by the other transistors. Similarly, the transistors Q2Br and Q5Br are in the resting state in the backward shift unit 43, and almost the same circuit as in the forward shift unit 43 in FIG. 7 is constituted by the other transistors.

As a result, the forward shift unit 42 and the backward shift unit 43 in FIG. 20 perform almost the same operation as those in FIG. 7. However, since the node N2A is kept at H level during the unselected period in this embodiment, the transistors Q2An, Q5An, Q2Ar, and Q5Ar are kept on during that period. At this point, the operation in this embodiment differs from those of the forward shift unit 42 and the backward shift unit 43 in FIG. 7.

As described above, while the first frame signal VFR is at H level, and the second frame signal /VFR is at L level, the unit shift register $SR_k$ in FIG. 20 performs almost the same operation as that of the unit shift register $SR_k$ in FIG. 7.

Thus, when the first frame signal VFR becomes L level and the second frame signal /VFR becomes H level in the next bland period, in the gate line drive unit 41, the transistor Q8B is turned off and the second inverter composed of the transistor Q6B and Q7*b* is activated and the node N2B becomes H level. Since the transistor Q8A is turned on and the first inverter is inactivated, the node N2A is fixed to L level (VSS).

That is, while the first frame signal VFR is at L level and the second frame signal /VFR is at H level, the gates of the transistors Q2A and Q5A are not biased but become the resting state. In addition, since a current is not supplied to the first inverter, it does not operate. Therefore, according to the gate line drive unit 41 in FIG. 20, almost the same circuit as in the gate line drive unit 41 in FIG. 7 is constituted by the combination of the transistors Q1, Q2B, Q3Dn, Q3Dr, Q4Dn, Q4Dr, Q5B, Q6B, and Q7B.

Therefore, the gate line drive unit 41 in FIG. 20 performs the same operation as in the gate line drive unit 41 in FIG. 7. However, since the second inverter is activated based on the second frame signal /VFR, the node N2B is kept at H level during the unselected period, and the transistors Q2B and Q5B are kept on during that period. At this point, the operation in this embodiment differs from that of the gate line drive unit 41 in FIG. 7.

The transistors Q2An and Q5An are in the resting state in the forward shift unit 42, and almost the same circuit as in the forward shift unit 42 in FIG. 7 is constituted by the other transistors. Similarly, the transistors Q2Ar and Q5Ar are in the resting state in the backward shift unit 43, and almost the same circuit as in the backward shift unit 43 in FIG. 7 is constituted by the other transistors.

As a result, the forward shift unit 42 and the backward shift unit 43 in FIG. 20 perform almost the same operation as those in FIG. 7. However, since the node N2B is kept at H level during the unselected period, the transistors Q2B and Q5B are kept on. At this point, the operation in this embodiment differs from that of the forward shift unit 42 and the backward shift unit 43 in FIG. 7.

As described above, while the first frame signal VFR is at L level, and the second frame signal /VFR is at H level, the unit shift register $SR_k$ in FIG. 20 performs almost the same operation as that of the unit shift register $SR_k$ in FIG. 7.

Thus, the unit shift register SR in this embodiment can perform the same operation as that in the circuit in FIG. 7. Thus, the pull-down transistor group A (transistors Q2A, Q5A, Q2An, Q5An, Q2Ar and Q5Ar) and group B (transistors Q2B, Q5B, Q2Bn, Q5Bn, Q2Br and Q5Br) become the resting state alternately every time the first and second frame signals VFR and /VFR are inverted, the gates thereof are prevented from being biased continuously. Therefore, the threshold voltage of each transistor can be prevented from being shifted, and lowering the driving ability thereof can be suppressed. Thus, the output terminal OUT, the forward output terminal OUTn, backward output terminal OUTr, and the nodes N1, N1n, and N1r can be kept at L level during the unselected period more surely, so that an error signal is sufficiently prevented from being generated.

According to this embodiment, a switching cycle (corresponding to the frame period) between the group A and the group B by the first and second frame signals VFR and /VFR is several tens times longer than the switching cycle (corresponding to the clock signals CLK and /CLK) between the transistors Q2 and Q5 and the transistors Q7 and Q8 in the embodiment 1. Therefore, the power consumption can be reduced more than the case of the embodiment 1. However, it is necessary to provide a generation circuit of the first and second frame signals VFR and /VFR in the gate line drive circuit 30 or outside the display device.

The embodiments 3 to 5 can be applied to the unit shift register SR in this embodiment.

Embodiment 9

Figure 21:
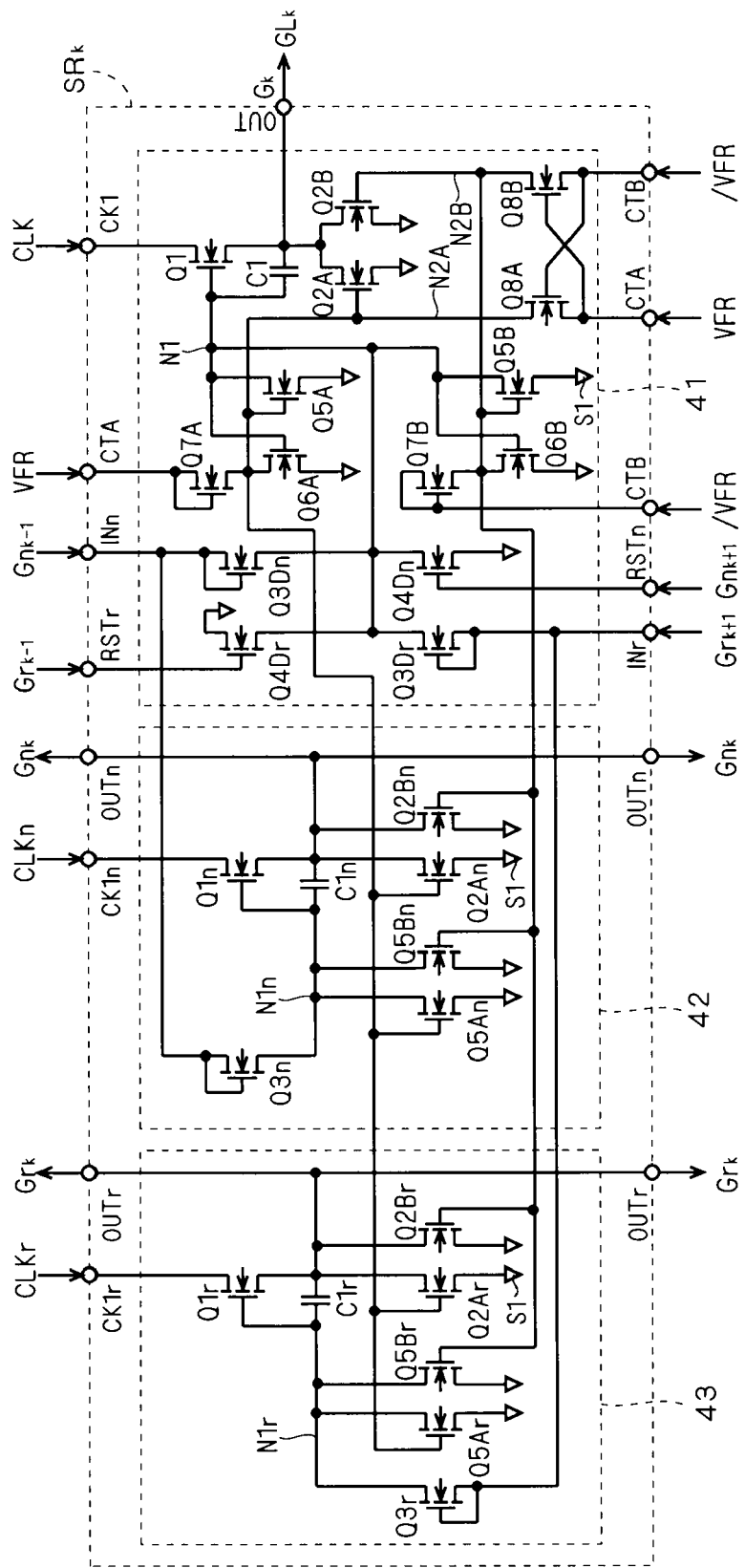
FIG. 21 is a view showing a constitution of a bidirectional shift register according to an embodiment 9.

According to an embodiment 9, a variation of the embodiment 8 will be shown. FIG. 21 is a circuit diagram showing the unit shift register SR according to the embodiment 9. In this drawing, the k-stage unit shift register $SR_k$ is also shown representatively. As shown in this drawing, according to the unit shift register SR in this embodiment, the transistors Q4n and Q4r are omitted from the circuit in FIG. 20.

According to the unit shift register $SR_k$ in FIG. 20, when the gate line drive signal $G_{k+1}$ of the subsequent-stage inputted to the forward reset terminal RSTn is activated at the time of forward shift, the transistors Q4Dn, Q4n, and Q4r are turned on and the nodes N1, N1n, and N1r are discharged and the gate line drive unit 41, the forward shift unit 42, and the backward shift unit 43 become the reset state.

According to the unit shift register SR in FIG. 20, since one of the first and second inverter is surely in the active state, when the node N1 becomes L level, the node N2A or N2B becomes H level and accordingly the transistors Q5An and Q5Ar or the transistors Q5An and Q5Br are turned on, whereby the nodes N1n and N1r are discharged. That is, the transistor Q5An can discharge the node N1n when the subsequent-stage forward signal $Gn_{k+1}$ inputted to the forward clock reset terminal RSTn is activated similarly to the transistor Q4n, and the transistor Q5Ar can discharge the node N1r when the subsequent-stage forward signal $Gr_{k+1}$ inputted to the forward clock reset terminal RSTr is activated similarly to the transistor Q4r.

Therefore, the gate line drive unit 41, the forward shift unit 42, and the backward shift unit 43 can be in the reset state without using the transistors Q4n and Q4r. Thus, even when the transistors Q4n and Q4r are omitted like in FIG. 21, the unit shift register SR can perform the same operation as that in the circuit in FIG. 20.

According to this embodiment, since the transistors Q4n and Q4r are omitted, a circuit area can be reduced.

Embodiment 10

Although in the unit shift register SR according to the embodiment 8, different inverters (first and second inverter) drive the pull-down transistor group A (transistors Q2A, Q5A, Q2An, Q2Ar and Q5Ar) and group B (transistors Q2B, Q5B, Q2Bn, Q5Bn, Q2Br and Q5Br), respectively, a description will be made of a case where the same operation is performed by one inverter in this embodiment.

FIG. 22 is a view showing the circuit constitution of the unit shift register SR. In this drawing, the k-stage unit shift register $SR_k$ is shown representatively.

According to the unit shift register SR in this embodiment, instead of the first and second inverters (transistors Q6A, Q7A, Q6B, and Q7B), a circuit composed of one inverter composed of transistors Q6 and Q7, and transistors Q9A and Q9B is provided, and each pull-down transistor is driven by the circuit.

The transistors Q6 and Q7 constitute a ratio-type inverter. The transistor Q7 serving as a load element of the inverter is connected between the output end of the inverter (defined as the "node N3") and a third power supply terminal S3 to which a high potential side power supply potential VDD2 is supplied, and diode-connected such that the side of the third power supply terminal S3 is an anode and the side of the node N3 is a cathode. The transistor Q6 is connected between the node N3 and the first power supply terminal S1, and its gate is connected to the node N1 serving as the input end of the inverter. The on resistance of the transistor Q6 is set so as to be sufficiently smaller than that of the transistor Q7. The potential VDD2 may be the same as the potential VDD (H level of each signal).

The transistor Q9A is connected between the node N3 and the node N2A, and the transistor Q9B is connected between the node N3 and the node N2B. The gate of the transistor Q9A is connected to the first frame signal terminal CTA to which the first frame signal VFR is inputted, and the gate of the transistor Q9B is connected to the second frame signal terminal CTB to which the second frame signal /VFR is inputted.

According to this constitution, while the first frame signal VFR is at H level and the second frame signal /VFR is at L level, since the transistor Q9A is turned on and the transistor Q9B is turned off, the output end of the inverter, that is, the node N3 is electrically connected to the node N2A.

That is, during that period, the group A of the pull-down transistors is driven and the group B is in the resting state. To the contrary, while the first frame signal VFR is at L level and the second frame signal /VFR is at H level, since the transistor Q9A is turned off and the transistor Q9B is turned on, the node N3 is electrically connected to the node N2B. That is, during that period, the group B is driven and the group A is in the resting state.

Thus, the transistors Q9A and Q9B function as a switching circuit for alternately connecting the output end (node N3) of the inverter composed of the transistors Q6 and Q7 to the node N2A and the node N2B, based on the first and second frame signals VFR and /VFR.

According to the embodiment 8, the alternate operations of the group A and the group B of the pull-down transistors are performed by the alternate operations of the two inverters (first and second inverters). Meanwhile, according to this embodiment, the alternate operations are performed by the output end of the one inverter is alternately connected to the node N2A and the node N2B. Except for this point, since the operation of the unit shift register SR (the gate line drive unit 41, the forward shift unit 42, and backward shift unit 43) in this embodiment is the same as that in the embodiment 8, a detailed description will be herein omitted.

Also in this embodiment, since the group A and the group B of the pull-down transistors become the resting state alternately every time the first and second frame signals VFR and /VFR are inverted, the gates are prevented from being biased continuously. Therefore, similar to the embodiment 8, the threshold voltage of the pull-down transistor is prevented from being shifted and an error signal can be prevented from being generated.

According to this embodiment, as compared with the embodiment 8, the number of the transistors whose gates are connected to the node N1 is small, so that the gate capacity of the transistor connected to the node N1 can be small. Thus, advantageously, the parasitic capacity of the node N1 is reduced and the boosting effect of the node N1 by the clock signal inputted to the first clock terminal CK1 is enhanced and the driving ability of the transistor Q1 is improved. In addition, since the used transistor is fewer than that in the embodiment 8, a circuit area can be small.

Figure 23:
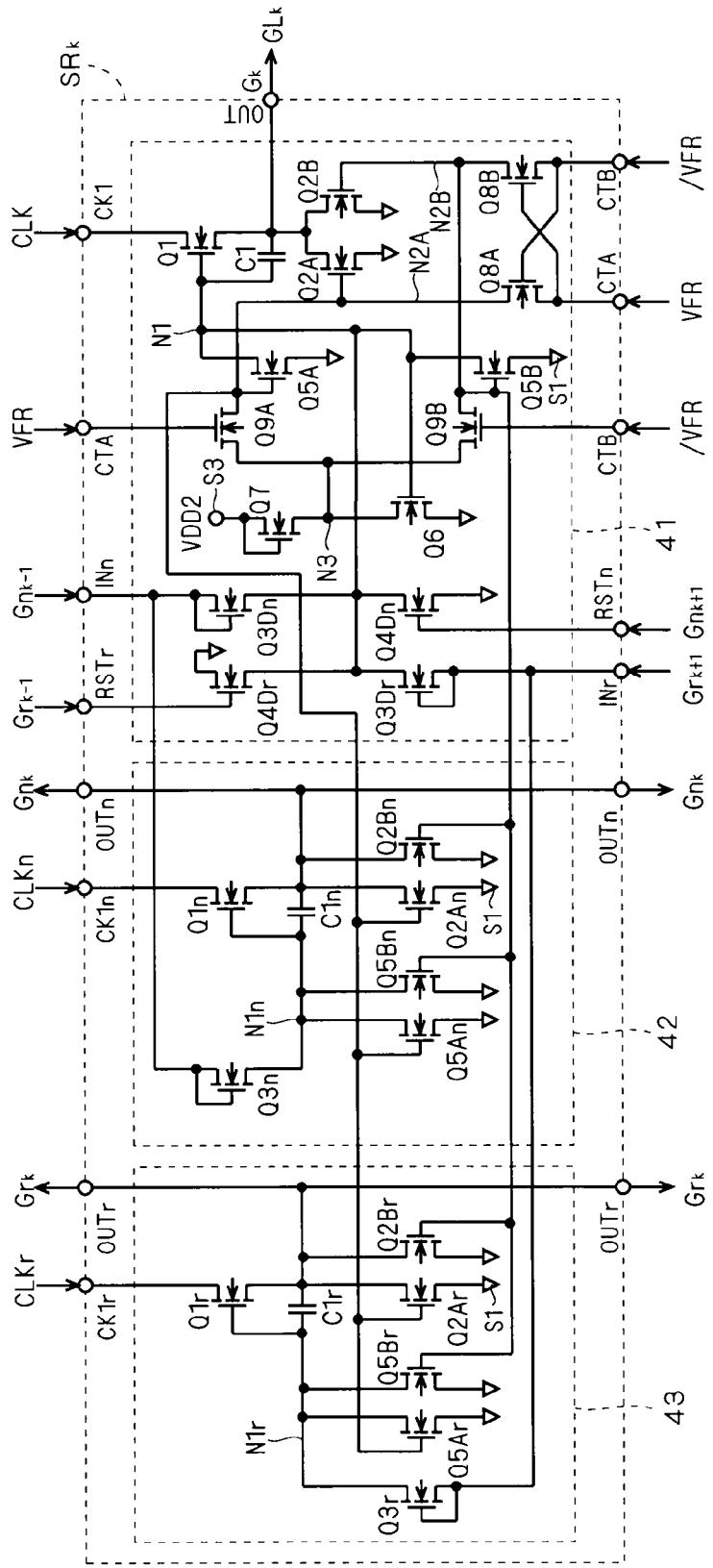
FIG. 23 is a view showing a variation of the bidirectional shift register according to the embodiment 10.

The embodiments 3 to 5 can be applied to the unit shift register SR in this embodiment. The embodiment 9 can be also applied to the unit shift register SR in this embodiment. That is, as shown in FIG. 23, the transistors Q4n and Q4r may be omitted from the circuit in FIG. 22.

Embodiment 11

Figure 24:
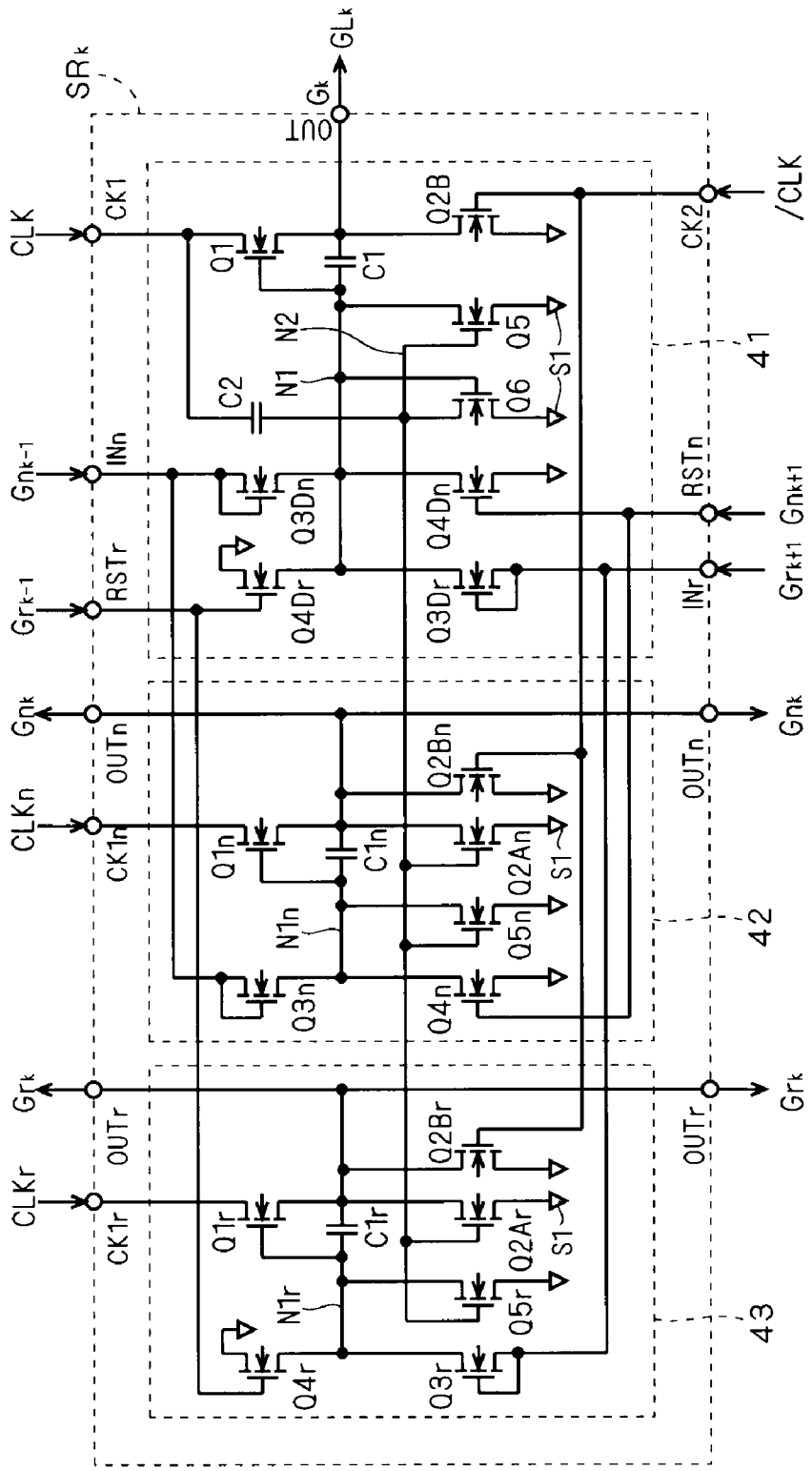
FIG. 24 is a view showing a constitution of a bidirectional shift register according to an embodiment 11.

FIG. 24 is a circuit diagram showing the unit shift register SR according to an embodiment 11. Also in this drawing, the k-stage unit shift register $SR_k$ is shown representatively. According to the unit shift register SR in this embodiment, the transistor Q2A of the gate line drive unit 41 is omitted from the circuit in FIG. 7.

While the transistor Q2A functions to discharge the output terminal OUT based on the output (level of the node N2) of the inverter composed of the capacitive element C2 and the transistor Q6, it can be omitted in some cases depending on the timing of the noise generation at the output terminal OUT (gate line GL) and the size of the noise.

When the transistor Q2A is omitted, the area of the unit shift register SR can be thus reduced. Since the parasitic capacity corresponding to the node N2 is reduced, the capacity value of the capacitive element C2 can be small, so that a circuit area can be reduced. The power consumed by the gate capacity of the transistor Q2A can be advantageously saved.

Not only the transistor Q2A but also the transistor Q2An of the forward shift unit 42 and the transistor Q2Ar of the backward shift unit 43 may be also omitted. However, the transistors Q2An and Q2Ar are preferably not omitted to prevent an error operation even when the transistor Q2A is omitted.

For example, when the transistor Q2An is omitted, the forward output terminal OUTn becomes high impedance at the timing of the rise of the clock signal (forward clock) of the first forward clock terminal CK1n at the time of forward shift. Since the forward output terminal OUTn has small capacity load as compared with the output terminal OUT connected to the gate line GL, when it becomes the high impedance state, the level is likely to rise in response to the rise of the clock signal at the first forward clock terminal CK1n. That is, the forward signal Gn is likely to be outputted as the error signal.

In addition, when the transistor Q2Ar is omitted, since the backward output terminal OUTr also has a small capacity load as compared with the output terminal OUT, the backward signal Gr is likely to be outputted as the error signal at the timing of the rise of the clock signal (backward clock) at the first backward clock terminal CK1r at the time of backward shift. Thus, the transistors Q2An and Q2Ar are not preferably omitted to prevent the error signal from being generated.

Embodiment 12

Figure 25:
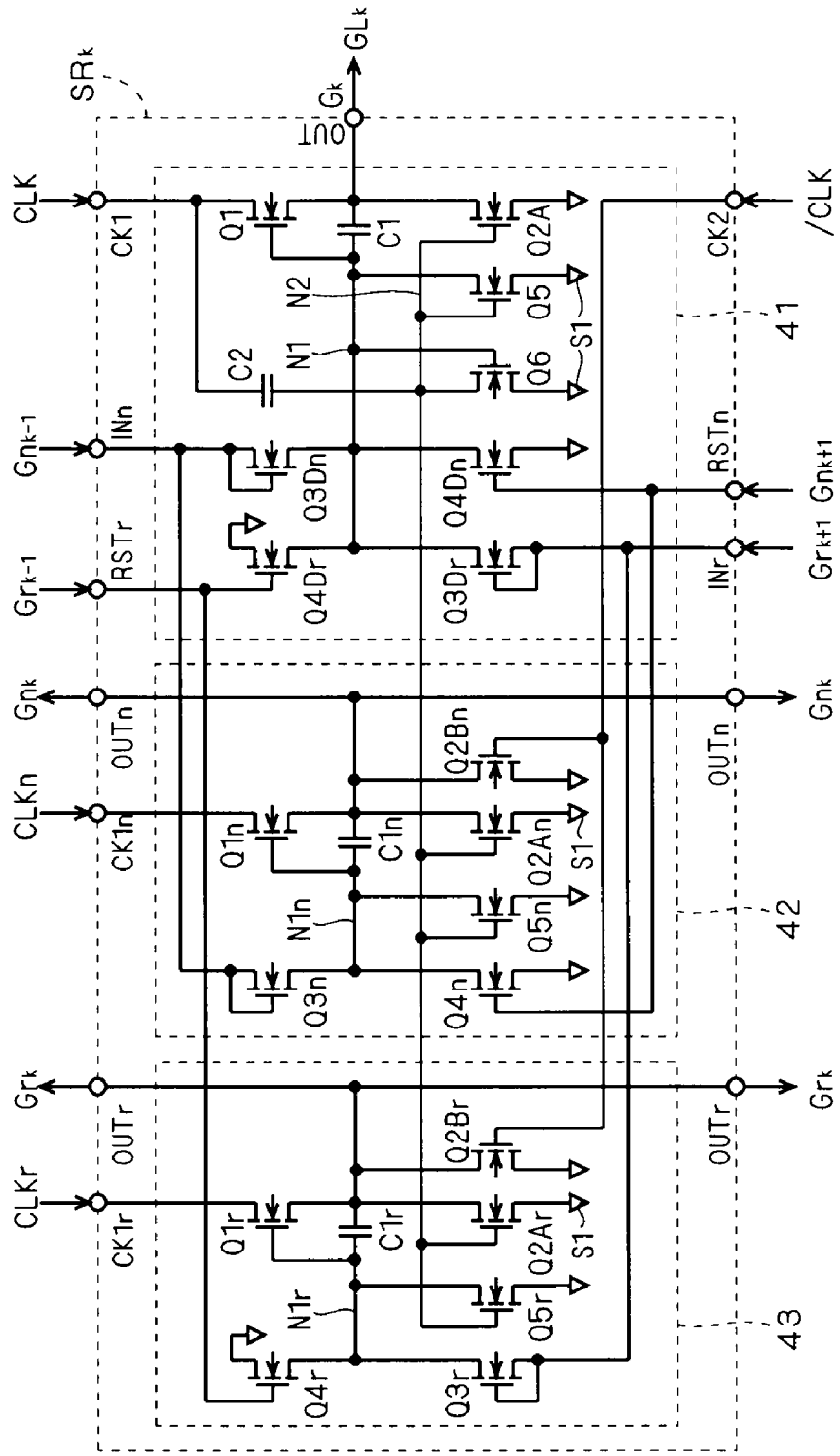
FIG. 25 is a view showing a constitution of a bidirectional shift register according to an embodiment 12.

FIG. 25 is a circuit diagram showing the unit shift register SR according to an embodiment 12. Also in this drawing, the k-stage unit shift register $SR_k$ is shown representatively.

According to the unit shift register SR in this embodiment, the transistor Q2B is omitted from the circuit in FIG. 7.

While the transistor Q2B functions to discharge the output terminal OUT based on the clock signal at the second clock terminal CK2, it can be omitted in some cases depending on the timing of the noise generation at the output terminal OUT (gate line GL) and the size of the noise.

When the transistor Q2B is omitted, the area of the unit shift register SR can be reduced. The power consumed by the gate capacity of the transistor Q2B can be advantageously saved.

Not only the transistor Q2B but also the transistors Q2Bn and Q2Br may be also omitted. However, the transistors Q2Bn and Q2Br are preferably not omitted to prevent an error operation even when the transistor Q2B is omitted.

As described above, since the forward output terminal OUTn and the backward output terminal OUTr have a small capacity load as compared with the output terminal OUT, when they become the high impedance state because the transistors Q2Bn and Q2Br are omitted, their levels are likely to rise due to the influence of the noise. That is, the forward signal Gn and the backward signal Gr are likely to be outputted as the error signals (although not to the extent of the case where the transistors Q2An and Q2Ar are omitted like the embodiment 11). Thus, the transistors Q2Bn and Q2Br are not preferably omitted to prevent it.

Embodiment 13

Figure 26:
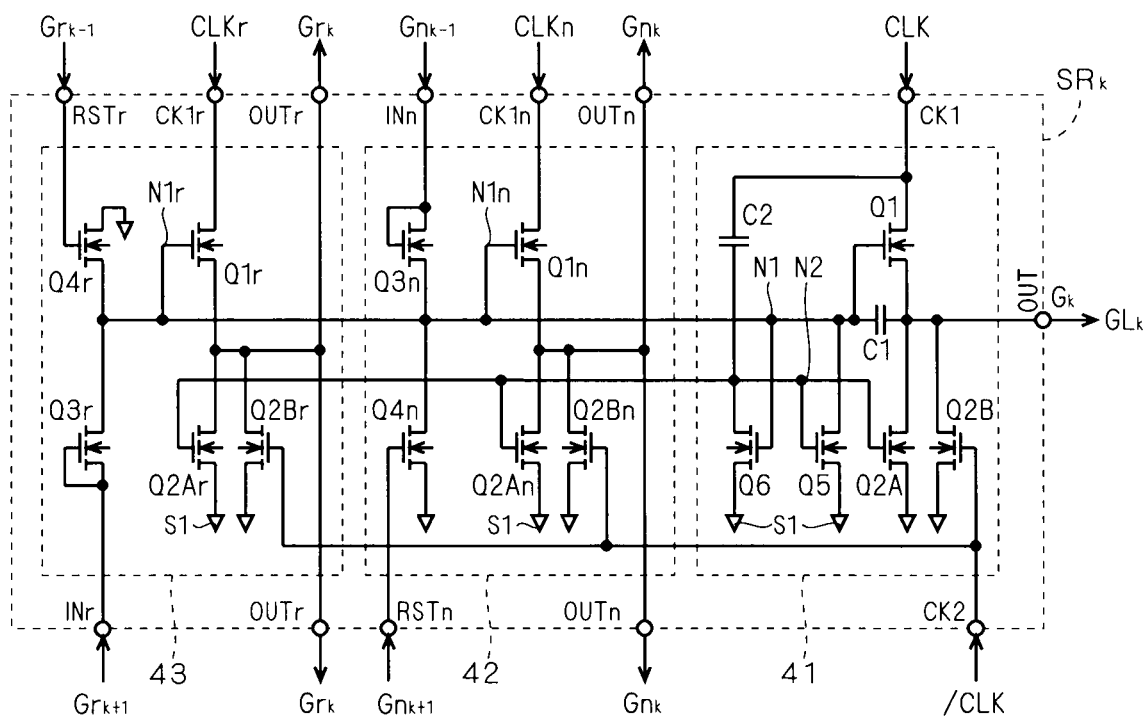
FIG. 26 is a view showing a constitution of a bidirectional shift register according to an embodiment 13.

FIG. 26 is a circuit diagram showing the unit shift register SR according to an embodiment 13. Also in this drawing, the k-stage unit shift register $SR_k$ is shown representatively. According to this embodiment, preference is given to the reduction in circuit area especially.

According to the unit shift register SR in this embodiment, the node N1 of the gate line drive unit 41, the node N1n of the forward shift unit 42, and the node N1r of the backward shift unit 43 are connected to each other as compared with the circuit shown in FIG. 7. When the nodes N1, N1n, and N1r are commonly provided, since the transistors Q3Dn and Q3n have a completely parallel relation, their functions can be implemented by one transistor (one of them can be omitted). Similarly, since the transistors Q4Dn and Q4n have a parallel relation, their functions can be implemented by one transistor. In addition, since the transistors Q3Dr and Q3r have a parallel relation, their functions can be implemented by one transistor, and since the transistors Q4Dr and Q4r have a parallel relation, their functions can be implemented by one transistor. Furthermore, since the transistor Q5, Q5r, and Q5n are parallel to each other, their functions can be implemented by one transistor (two of them can be omitted).

In FIG. 26, the transistors Q3Dn, Q3Dr, Q4Dn, Q4Dr, Q5Dn, and Q5Dr are omitted. In addition, the capacitive element C1 in FIG. 7 is left and the capacitive elements C1n and C1r are omitted.

Thus, since the nodes N1, N1n, and N1r are commonly provided, the number of transistors can be reduced and the circuit area can be reduced. However, it should be noted that the following problems could arise.

According the unit shift register $SR_k$ in FIG. 26, when the nodes N1, N1n, and N1r (referred to as the "node 1" hereinafter) are boosted in response to the rise of the clock signal CLK at the time of forward shift, for example, the drain (first backward clock terminal CK1r) and the source (backward output terminal OUTr) of the transistor Q1r are at L level (VSS). That is, the gate of the transistor Q1r at that time is positively biased with respect to the source and the drain, and its value is as high as the voltage of the boosted node N1. Thus, the threshold voltage of the transistor Q1r is largely shifted to the positive side as compared with the circuit in FIG. 7.

Therefore, when the gate line drive circuit 30 is switched to the backward shift operation after that, the level of the backward signal Gr is lowered by the threshold voltage shift, and the problem is that the margin in the backward signal Gr is lowered.

Also at the time of forward shift, a channel is formed in the transistor Q1r while the node N1 is boosted, and this increases the parasitic capacity between the node N1 and the drain and source of the transistor Q1r. Since the increase in parasitic capacity corresponding to the node N1 lowers the boosting effect of the node N1 by the capacitive element C1, the driving ability of the transistor Q1 may be lowered depending on its amount.

As described above, the capacitive element C1 in FIG. 7 is not omitted but the capacitive elements C1n and C1r are omitted in FIG. 26 because the capacitive element C1 can be used to enhance the boosting effect of the standardized node N1 all the time since the output terminal OUT is activated at the time of forward shift and at the time of backward shift, but the capacitive elements C1n and C1r are not the case.

More specifically, since the forward output terminal OUTn is activated only at the time of forward shift and the backward output terminal OUTr is activated only at the time of backward shift, the capacitive element C1n and the capacitive element C1r boost the node N1 at the time of forward shift and at the time of backward shift only, respectively. In addition, the capacitive element C1n at the time of backward shift and the capacitive C1r at the time of forward shift operate so as to prevent the boosting of the node N1, so that the capacitive elements C1n and C1r operate so as to offset the boosting effect of them. Thus, the capacitive elements C1n and C1r are efficiently omitted not only in view of area reduction but also in view of operation efficiency.

This embodiment can be applied to the unit shift register SR in the embodiments 2 to 12 (FIG. 12 to 25). When the nodes N1, N1n, N1r are standardized even in each of the unit shift register SR, one of the transistors Q3Dn and Q3n, one of the transistors Q4Dn and Q4n, one of the transistors Q3Dr and Q3r, and one of the transistors Q4Dr and Q4r can be omitted. Furthermore, when this embodiment is applied to the embodiments 2 to 7, 11, and 12 (FIGS. 12 to 19, FIG. 24 and FIG. 25), two of the transistors Q5, Q5n, and Q5r can be omitted. When this embodiment is applied to the unit shift registers SR in embodiments 8 to 10 (FIGS. 20 to 23), two of the transistors Q5A, Q5An, and Q5Ar and two of the transistors Q5B, Q5Bn, and Q5Br can be omitted.

Embodiment 14

Figure 27:
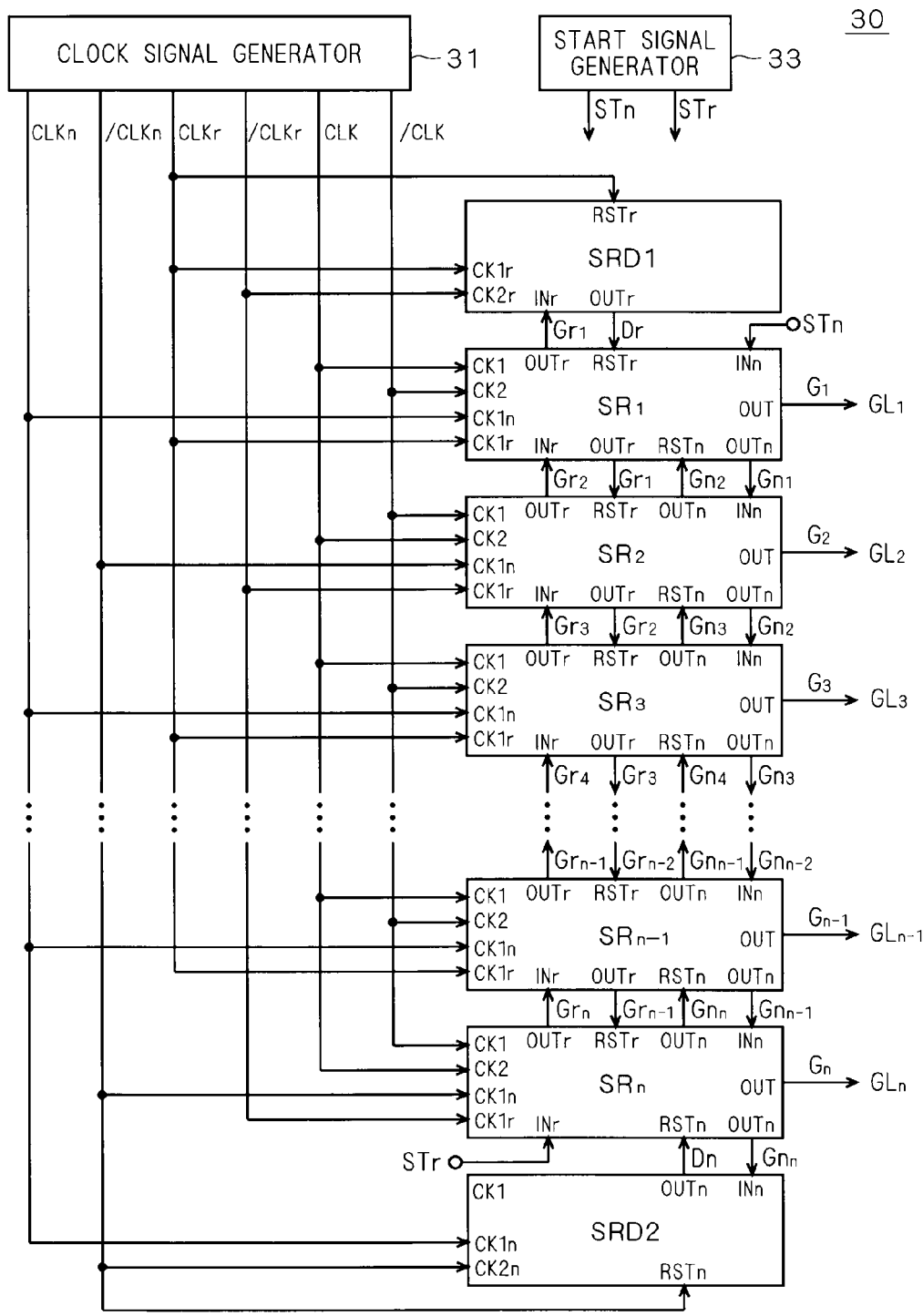
FIG. 27 is a block diagram showing a constitution example of a gate line drive circuit composed of bidirectional shift registers according to an embodiment 14.

FIG. 27 is a view showing the constitution of the gate line drive circuit 30 according to an embodiment 14. As shown in this drawing, according to this embodiment, a dummy stage SRD1 serving as a dummy unit shift register is provided before the first-stage unit shift register $SR_1$, and a dummy stage SRD2 serving as a dummy unit shift register is provided after the last-stage unit shift register $SR_n$. The circuit constitution of the unit shift registers $SR_1$ to $SR_n$ may be any one of the above embodiments 1 to 13 and a following embodiment 15.

The dummy stage SRD1 receives a backward signal $Gr_1$ outputted from the unit shift register $SR_1$ and activates a dummy signal Dr that is an output signal of the dummy stage SRD1 at the next timing. Thus, the dummy signal Dr can be used as the end signal of the backward shift. Thus, the dummy signal Dr is inputted to the backward reset terminal RSTr of the unit shift register $SR_1$ instead of the backward end signal EDr in FIG. 2.

The dummy stage SRD2 receives a forward signal $Gn_n$ outputted from the unit shift register $SR_n$ and activates a dummy signal Dn that is an output signal of the dummy stage SRD2 at the next timing. Thus, the dummy signal Dn can be used as the end signal of the forward shift. Thus, the dummy signal Dn is inputted to the forward reset terminal RSTn of the unit shift register $SR_n$ instead of the forward end signal EDn in FIG. 2.

Thus, according to this embodiment, the forward end signal EDn and the backward end signal EDr are not needed. Therefore, according to the gate line drive circuit 30 in FIG. 27, a start signal generator 33 for outputting the forward start signal STn and the backward start signal STr only is used instead of the start/end signal generator 32 in FIG. 2.

Figure 28A:
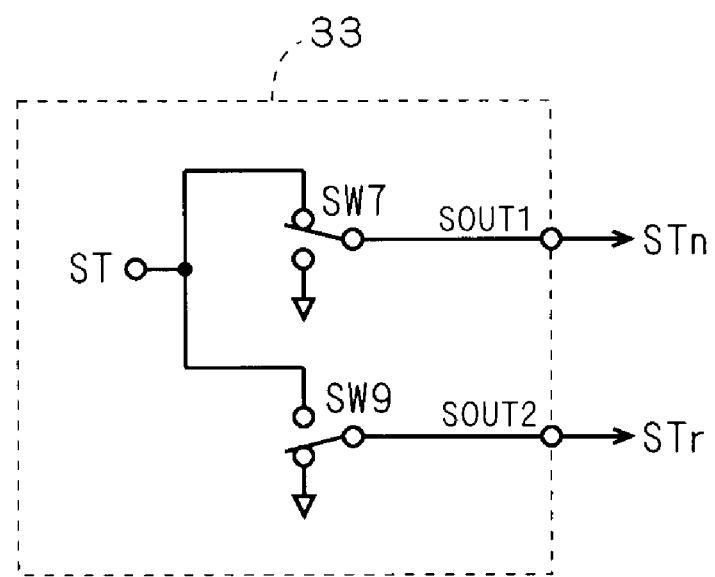
FIGS. 28A and 28B are views showing a constitution and an operation of a start signal generator according to the embodiment 14.
Figure 28B:
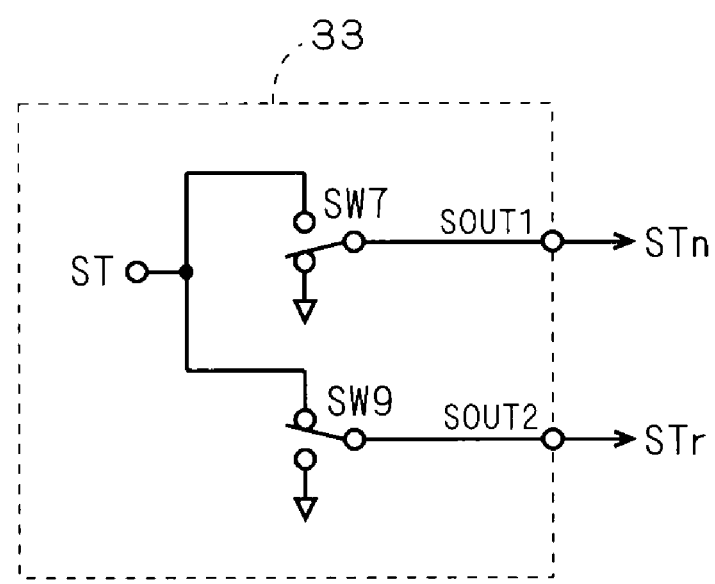

FIGS. 28A and 28B show a constitution example of the start signal generator 33. This drawing shows a circuit for generating the forward start signal STn and the backward start signal STr by use of a basic general start signal ST (corresponding to a start of each frame period). The start signal generator 33 shown in FIGS. 28A and 28B is the same as one obtained by extracting a part for generating the forward start signal STn and the backward start signal STr from the circuit of the start/end signal generator 32 shown in FIGS. 6A and 6B. Also in FIGS. 28A and 28B, it is assumed that the forward start signal STn is outputted from the terminal SOUT1 and the backward start signal STr is outputted from the terminal SOUT2.

FIG. 28A shows the state at the time of forward shift. The switch SW7 supplies the start signal ST to the terminal SOUT1 as the forward start signal STn, and the switch SW9 connects the terminal SOUT2 to the first power supply terminal S1 and fixes the backward start signal STr to L level. FIG. 28B shows the state at the time of backward shift. The switch SW7 connects the terminal SOUT1 to the first power supply terminal S1 and fixes the forward start signal STn to L level, and the switch SW9 supplies the start signal ST to the terminal SOUT2 as the backward start signal STr.

Since the start signal generator 33 can generate the forward start signal STn and the backward start signal STr in the circuit shown in FIGS. 28A and 28B by use of only the general start signal ST substantially, the cost can be reduced. As a matter of course, the start signal generator 33 may generate the two signals independently.

As the dummy stages SRD1 and SRD2, the same constitution as in the unit shift register SR1 to SRn can be used. However, as described above, the dummy stage SRD1 receives the backward signal $Gr_1$ from the subsequent-stage unit shift register $SR_1$, and outputs the dummy signal Dr at the next timing, that is, performs only the backward shift. Thus, the dummy stage SRD1 does not require the gate line drive unit 41 and the forward shift unit 42.

Similarly, the dummy stage SRD2 receives the forward signal $Gr_n$ from the previous-stage unit shift register $SR_n$, and outputs the dummy signal Dn at the next timing, that is, performs only the forward shift. Thus, the dummy stage SRD2 does not require the gate line drive unit 41 and the backward shift unit 43.

Figure 29:
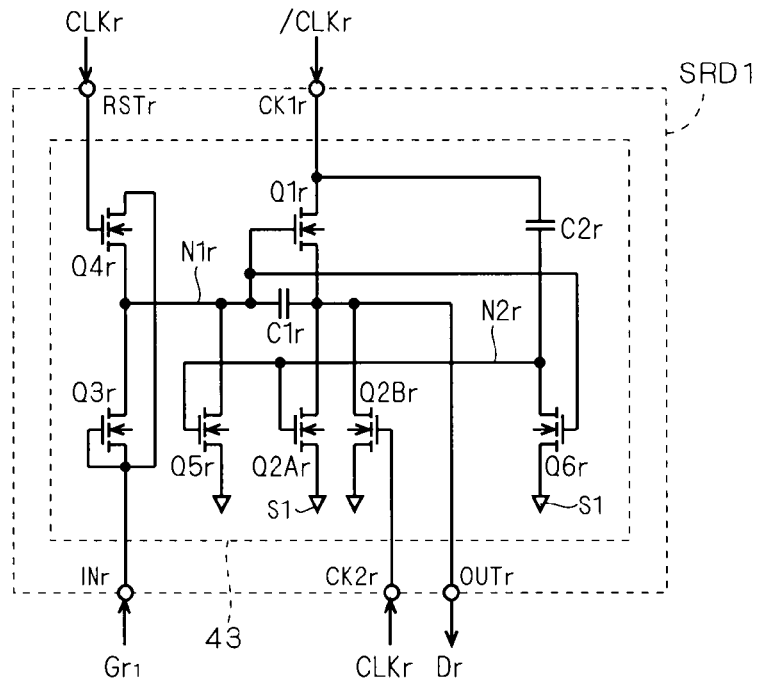
FIG. 29 is a view showing a dummy stage provided at previous-stage of the first-stage of the gate line drive circuit according to the embodiment 14.

A constitution example of the dummy stages SRD1 and SRD2 will be shown hereinafter. FIG. 29 is a circuit diagram showing the constitution of the dummy stage SRD1. The dummy stage SRD1 includes the backward shift unit 43 only.

That is, the dummy stage SRD1 uses the signal outputted from the backward output terminal OUTr as the dummy signal Dr.

However, according to the unit shift register SR shown in above each embodiment, the transistors Q2Ar and Q5r of the backward shift unit 43 is controlled by the inverter in the gate line drive unit 41 and the backward shift unit 43 itself does not have the inverter. Since the dummy stage SRD1 does not have the gate line drive unit 41, an inverter, in which the node N1r is an input end and the gate nodes of the transistors Q2Ar and Q5r (defined as "node N2r") is an output end, is provided in the backward shift unit 43 itself.

According to this embodiment, the inverter is a capacitive load type inverter composed of a capacitive element C2r and a transistor Q6r. As shown in FIG. 29, the capacitive element C2r is connected between the node N2r and the first backward clock terminal CK1r. That is, the backward clock /CLKr is supplied to the inverter as the power supply. The transistor Q6r is connected between the node N2r and the first power supply terminal S1, and its gate is connected to the node N1r.

Since there is no previous-stage of the dummy stage SRD1, the technique in the embodiment 3 is used to reset the dummy stage SRD1. That is, the backward clock CLKr is inputted to the backward reset terminal RSTr (gate of the transistor Q4r) and the source of the transistor Q4r is connected to the backward input terminal INr to which the backward signal $Gr_1$ is inputted. As described in the embodiment 3, in this constitution, it is not necessary to input the backward signal Gr of the previous-stage to the backward reset terminal RSTr. Thus, the dummy stage SRD1 having no previous-stage can be reset.

Since the operation of the dummy stage SRD1 is the same as that of the backward shift unit 43 in the above each embodiment basically, its description will be here omitted.

Figure 30:
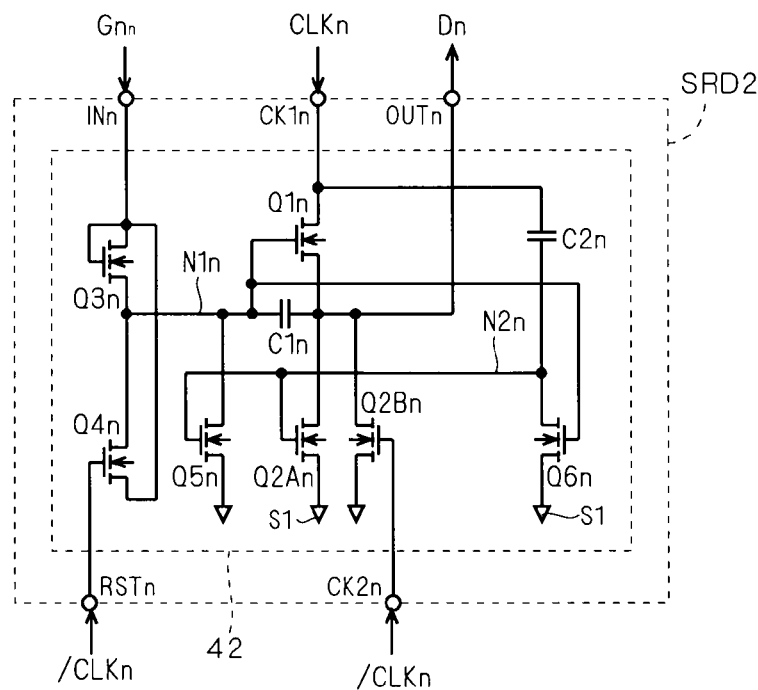
FIG. 30 is a view showing a dummy stage provided at subsequent-stage of the last-stage of the gate line drive circuit according to the embodiment 14.

FIG. 30 is a circuit diagram showing the constitution of the dummy stage SRD2. The dummy stage SRD2 includes the forward shift unit 42 only. That is, the dummy stage SRD2 uses the signal outputted from the forward output terminal OUTn as the dummy signal Dn.

However, according to the unit shift register SR shown in above each embodiment, the forward shift unit 42 itself does not have an inverter for driving the transistors Q2An and Q5n. Thus, according to the dummy stage SRD2 instead of it, an inverter, in which the node N1n is an input end, and the gate node of the transistors Q2An and Q5n (defined as "node N2n") is an output end, is provided in the forward shift unit 42 itself.

As shown in FIG. 30, a capacitive load type inverter composed of a capacitive element C2n and a transistor Q6n is provided in the dummy stage SRD2. The capacitive element C2n is connected between the node N2n and the first forward clock terminal CK1n. That is, the forward clock CLKn is supplied to the inverter as the power supply. The transistor Q6n is connected between the node N2n and the first power supply terminal S1, and its gate is connected to the node N1n.

Since there is no subsequent-stage of the dummy stage SRD2, the technique in the embodiment 3 is also used to reset the dummy stage SRD2. That is, the forward clock /CLKn is inputted to the forward reset terminal RSTn (gate of the transistor Q4n) and the source of the transistor Q4n is connected to the forward input terminal INn to which the forward signal $Gn_n$ is inputted. As described in the embodiment 3, in this constitution, it is not necessary to input the subsequent-stage backward signal Gn to the forward reset terminal RSTn. Thus, the dummy stage SRD2 having no subsequent-stage can be reset.

Since the operation of the dummy stage SRD2 is the same as that of the forward shift unit 42 in the above each embodiment basically, its description will be omitted here.

Embodiment 15

In the above each embodiment, to control the shift direction of the signals in the gate line drive circuit 30, the forward clocks CLKn and /CLKn and the backward clocks CLKr and /CLKr are used. Thus, the backward signal Gr is prevented from being generated as the error signal at the time of forward shift, and the forward signal Gn is prevented from being generated as the error signal at the time of backward shift, so that the forward shift and backward shift can be normally performed.

However, since the four control signals such as the forward clocks CLKn and /CLKn and the backward clocks CLKr and /CLKr are used, the wiring area could be increased. Thus, this embodiment proposes a method for preventing the above-described error signal from being generated while suppressing the number of the control signals.

Figure 31:
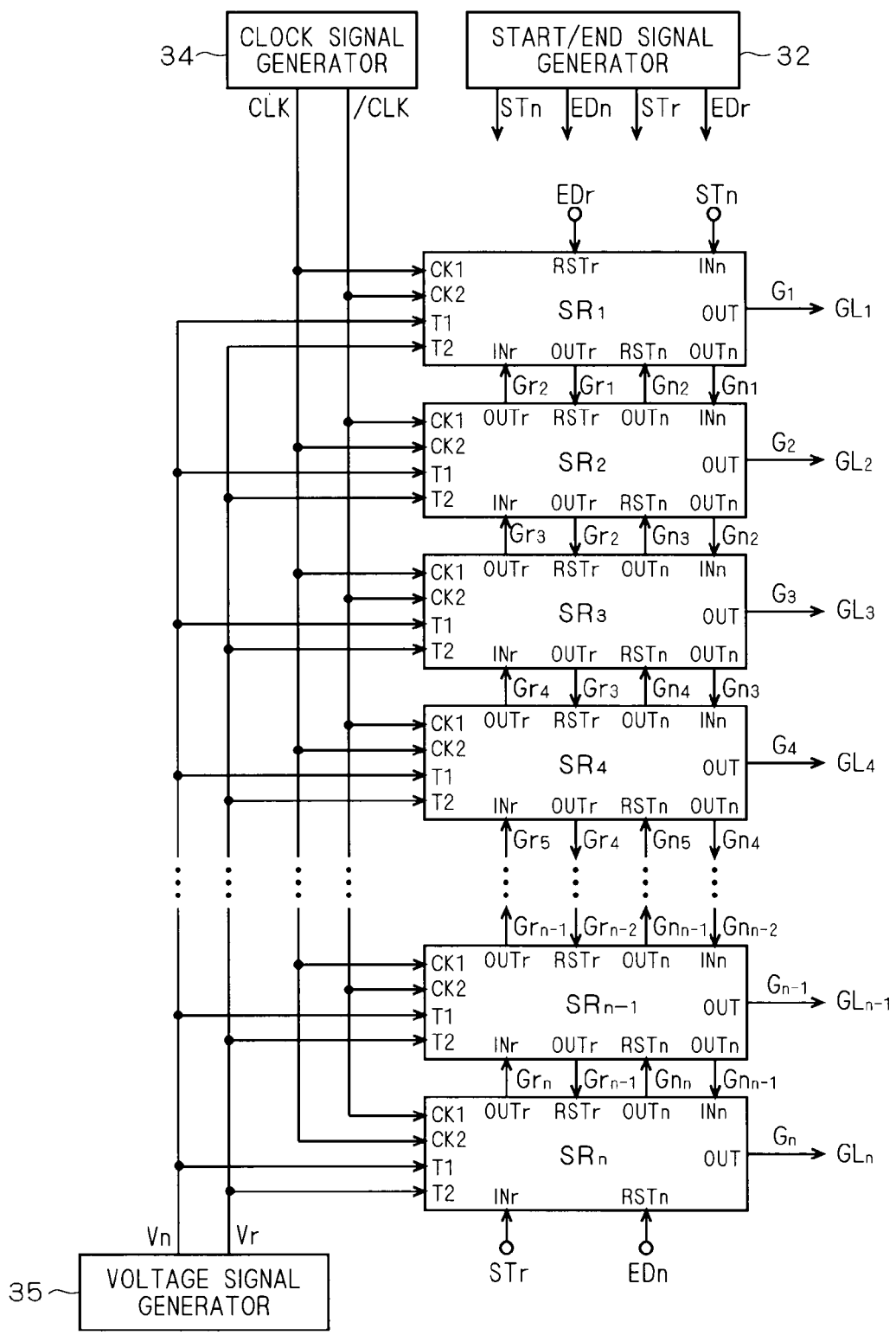
FIG. 31 is a block diagram showing a constitution example of a gate line drive circuit composed of bidirectional shift registers according to an embodiment 15.

FIG. 31 is a view showing the constitution of the gate line drive circuit 30 according to an embodiment 15. According to this embodiment, in this drawing, a clock signal generator 34 outputs only the clock signals CLK and /CLK. That is, the forward clocks CLKn and /CLKn and the backward clocks CLKr and /CLKr are not used. Instead, a voltage signal generator 35 that outputs predetermined first and second voltage signals Vn and Vr is provided.

The first and second voltage signals Vn and Vr are control signals for determining the shift direction of the signals in the gate line drive circuit 30 in this embodiment. According to the voltage signal generator 35, when the gate line drive circuit 30 performs the forward shift, the first voltage signal Vn is set at H level and the second voltage signal Vr is set at L level. Meanwhile, when it performs the backward shift, the second voltage signal Vr is set at H level and the first voltage signal Vn is set at L level. That is, the first and second voltage signals Vn and Vr are complementary signals to each other. While the potentials of the first and second voltage signals Vn and Vr may be any potential as long as the gate line drive circuit 30 can operate normally, it is here assumed that the H level is the potential VDD and the L level is the potential VSS similar to the other signals.

As shown in FIG. 31, a first voltage signal terminal T1 for inputting the first voltage signal Vn and a second voltage signal terminal T2 for inputting the second voltage signal Vr are provided in the unit shift register SR according to this embodiment.

Figure 32:
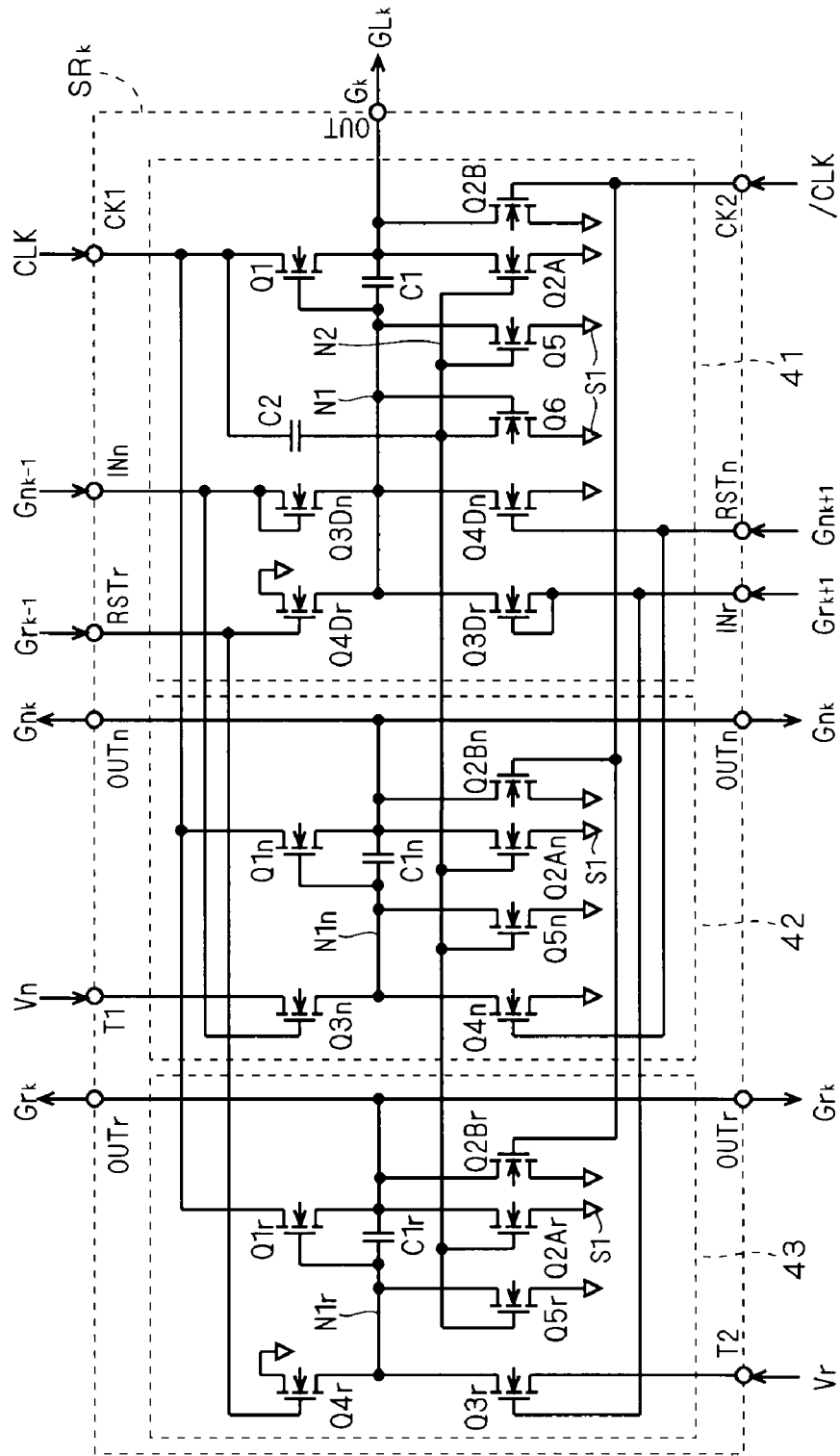
FIGS. 32 to 34 are views showing a constitution of the bidirectional unit shift register according to the embodiment 15.

FIG. 32 is a view showing the constitution of the unit shift register SR in this embodiment. The k-stage unit shift register $SR_k$ is shown also representatively. According to the unit shift register SR in this embodiment, all the drains of the transistors Q1, Q1n, and Q1r are connected to the first clock terminal CK1 and the drain of the transistor Q3n is connected to the first voltage signal terminal T1, and the drain of the transistor Q3r is connected to the second voltage signal terminal T2 as compared with the circuit shown in FIG. 7.

The operation of the unit shift register $SR_k$ in this embodiment will be described. At the time of forward shift, the first voltage signal Vn is set at H level (VDD) and the second voltage signal Vr is set at L level (VSS). In this case, since the drain of the transistor Q3r is fixed to L level, the node N1r of the backward shift unit 43 is not charged and the transistor Q1r is kept off. Therefore, even when the clock signal CLK is inputted to the drain of the transistor Q1r, the backward signal $Gr_k$ is prevented from being generated. Meanwhile, the gate line drive unit 41 and the forward shift unit 42 can operate similarly to the circuit at the time of forward shift in FIG. 7.

At the time of backward shift, the second voltage signal Vr is set at H level and the first voltage signal Vn is set at L level. In this case, since the drain of the transistor Q3n is fixed to L level, the node N1n of the forward shift unit 42 is not charged and the transistor Q1n is kept off. Therefore, even when the clock signal CLK is inputted to the drain of the transistor Q1n, the backward signal $Gr_k$ is prevented from being outputted. Meanwhile, the gate line drive unit 41 and the forward shift unit 42 can operate similarly to the circuit at the time of forward shift in FIG. 7.

According to this embodiment, as compared with the embodiment 1, since the number of the used control signals is reduced, the wiring area in the gate line drive circuit 30 can be reduced.

However, according to this embodiment, the drain of the transistor Q3Dn is always at H level at the time of forward shift, and the drain of the transistor Q3Dr is always at H level at the time of backward shift. Thus, the level of the node N1n due to a leak current of the transistor Q3n could be rise during the unselected period at the time of forward shift, for example. In addition, the level of the node N1r could rise due to a leak current of the transistor Q3r during the unselected period at the time of backward shift. In this case, the gate line drive signal G and the forward signal Gn are likely to be generated as the error signals at the time of forward shift, and the gate line drive signal G and the backward signal Gr are likely to be generated as the error signals at the time of backward shift. Consequently, the same problem as that in the circuit in the embodiment 4 (FIG. 14) could arise in the forward shift unit 42 and the backward shift unit 43.

Figure 33:
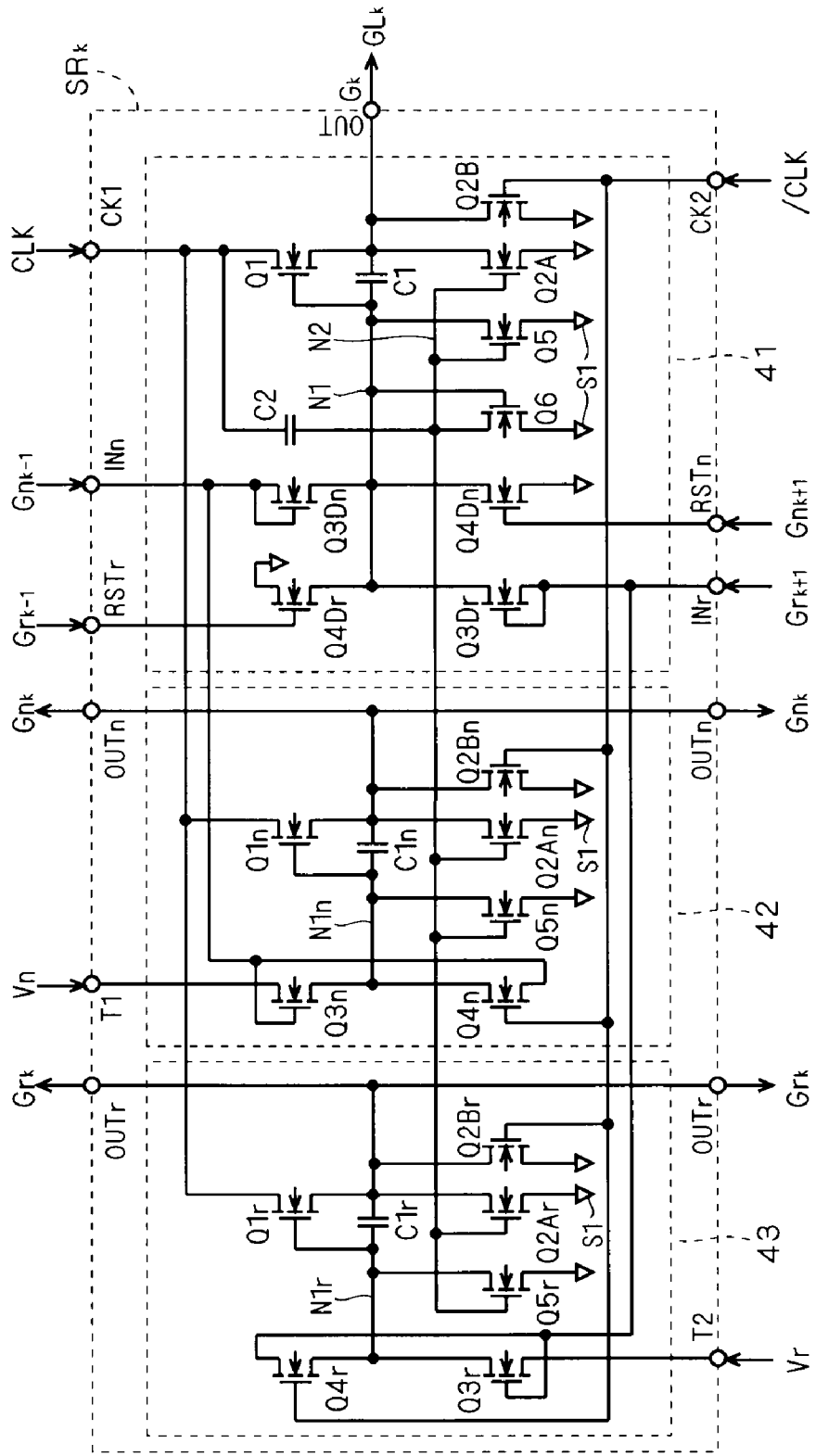

Thus, it is preferable that the same method as in the embodiment 3 is used in the forward shift unit 42 and the backward shift unit 43 in this embodiment. That is, as shown in FIG. 33, the gate of the transistor Q4n is connected to the second clock terminal CK2, and the source thereof is connected to the forward input terminal INn. In addition, the gate of the transistor Q4r is connected to the second clock terminal CK2, and the source thereof is connected to the backward input terminal INr. Thus, the transistors Q4Dn, Q4n, and Q4r and the transistors Q5, Q5n, and Q5r are alternately turned on during the unselected period, so that the node N1, N1n, and N1r are at L level of low impedance and the above problem of the leak current can be solved.

Figure 34:
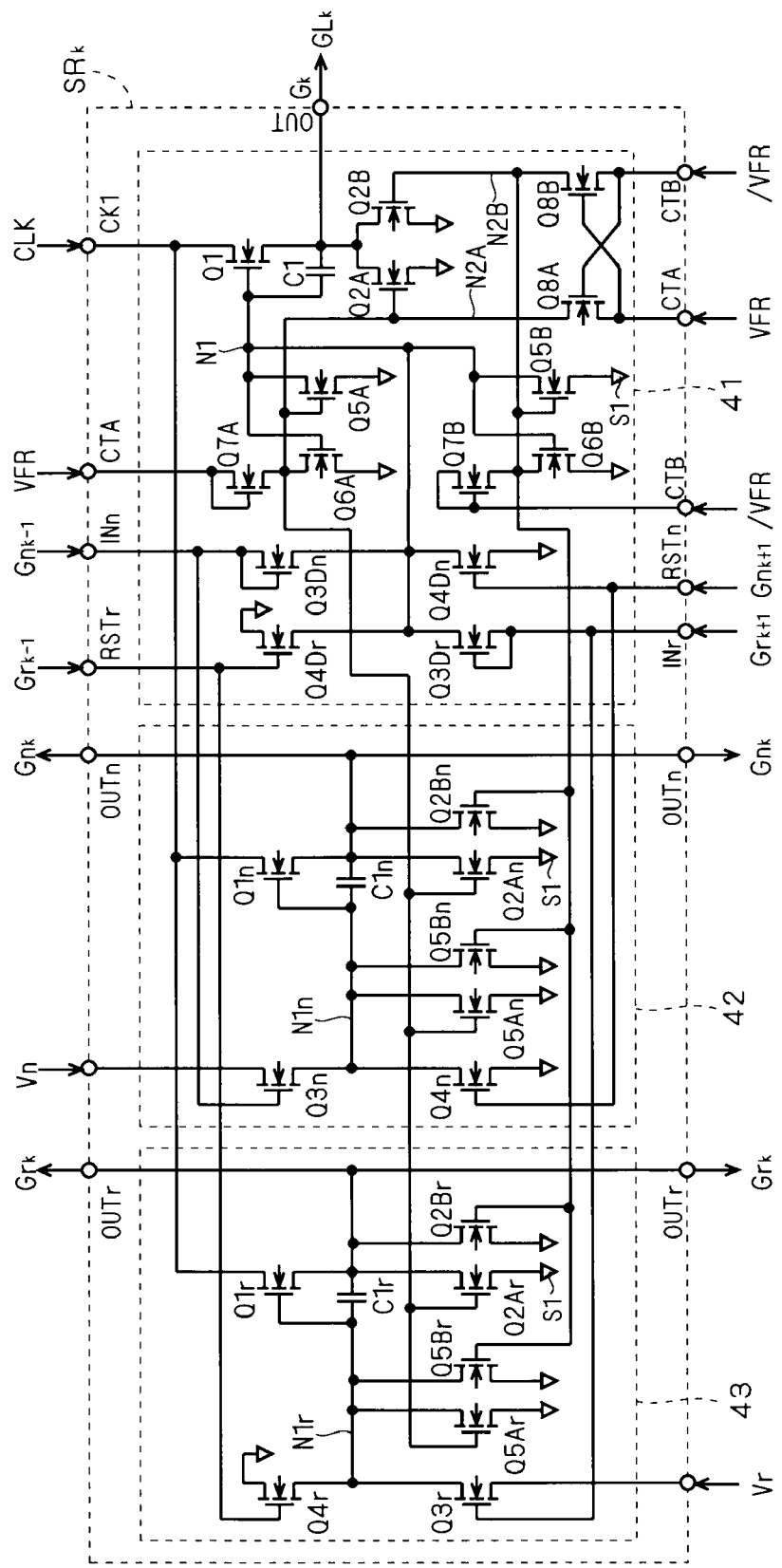

This embodiment can be applied to the above embodiments. As a matter of course, this embodiment can be applied to the embodiments 8 to 10 in which the pull-down transistors to be driven are switched by the first and second frame signals VFR and /VFR. For example, FIG. 34 shows an example in which this embodiment is applied to the embodiment 8 (FIG. 20). As shown in FIG. 34, also in this case, all the drains of the transistors Q1, Q1n, and Q1r may be connected to the first clock terminal CK1, the drain of the transistor Q3n may be connected to the first voltage signal terminal T1, and the drain of the transistor Q3r may be connected to the second voltage signal terminal T2.

However, it is not so advantageous to apply this embodiment to the embodiment 13 (FIG. 26). Since the nodes N1, N1n, and N1r are commonly provided in the unit shift register SR in FIG. 26, all the gate line drive unit 41, the forward shift unit 42, and the backward shift unit 43 become set state at the same time at the time of forward shift and at the time of backward shift. Thus, the control by the forward clocks CLKn and /CLKn and the backward clocks CLKr and /CLKr are needed in order not to activate the backward signal Gr at the time of forward shift and not to activate the forward signal Gn at the time of backward shift in the unit shift register SR, so that the wiring area is increased as a result. Thus, the effect that the area is reduced due to the reduction in transistor number in the embodiment 13 is small.

Embodiment 16

When the operation of the forward shift is performed by the unit shift register $SR_k$ in FIG. 7, the gate line drive signal $G_k$ outputted from the gate line drive unit 41 and the forward signal $Gn_k$ outputted from the forward shift unit 42 are activated (become H level) at the predetermined timing, while the backward signal $Gr_k$ outputted from the backward shift unit 43 is inactivated (fixed to L level).

Focusing on the backward shift unit 43 at this time, the backward clock CLKr and the backward signals $Gr_{k+1}$ and $Gr_{k-1}$ supplied thereto is fixed to L level. Thus, the transistors Q3r and Q4r are kept off. However, since the node N2 becomes H level based on the clock signal CLK (refer to FIG. 10), the transistors Q5r and Q2Ar are turned on periodically, and accordingly the node N1r and the backward output terminal OUTr are kept at L level.

Thus, at the time of forward shift, all the terminals of the transistors Q1r, Q3r, and Q4r are kept at L level and the threshold voltages of them are not shifted. However, as for the transistors Q5r and Q2Ar whose gates are connected to the node N2, and the transistor Q2Br whose gate is supplied with the clock signal /CLK, their gates are alternately biased and the threshold voltages thereof are gradually shifted and their driving abilities are lowered.

This causes the following problem when the operation of the unit shift register $SR_k$ is switched from the forward shift to the backward shift. The transistor Q5r originally functions to prevent the level of the node N1r from rising at the time of the rise of the backward clock CLKr, due to coupling through the overlap capacity between the drain and gate of the transistor Q1r while the unit shift register $SR_k$ is unselected at the time of backward shift. However, when the driving ability of the transistor Q5r is lowered, the level rise of the node N1r cannot be sufficiently prevented. In addition, since the threshold voltage of the transistor Q1r is not shifted, it is likely to be turned on. As a result, the transistor Q1r is turned on at the time of rise of the backward clock CLKr in spite of the unselected period, and the level of the backward output terminal OUTr tries to rise.

Since the transistor Q2Ar is turned on at this time, the level rise of the backward output terminal OUTr is to be suppressed. However, it cannot be sufficiently suppressed in the case where the driving ability of the transistor Q2Ar is lowered. As a result, the backward signal $Gr_k$ is generated as the error signal, and the previous-stage unit shift register $SR_{k-1}$ is activated, and a display defect is generated.

Since the transistor Q2Br only has to be turned on to keep the backward output terminal OUTr at L level while the clock signal CLKr is inactivated, that is, the above error signal is not generated, a high driving ability is not required. Thus, as for the transistor Q2Br, even when the threshold voltage is shifted, it does not matter so much.

The problem of this error signal generation arises in the forward shift unit 42 when the operation of the unit shift register $SR_k$ is switched from the backward shift to the forward shift. That is, when the operation of the backward shift is continued for a long period of time, the threshold voltage of the transistors Q1n, Q3n and Q4n are not shifted but the threshold voltages of the transistors Q2An, Q2Bn, and Q5n are shifted (driving ability is lowered). When the operation is switched to the forward shift from that state, the forward signal $Gn_k$ is generated as the error signal at the time of the rise of the forward clock CLKn. Since a high driving ability is not required for the transistor Q2Bn, even when the threshold voltage is shifted, it does not matter so much.

Figure 35:
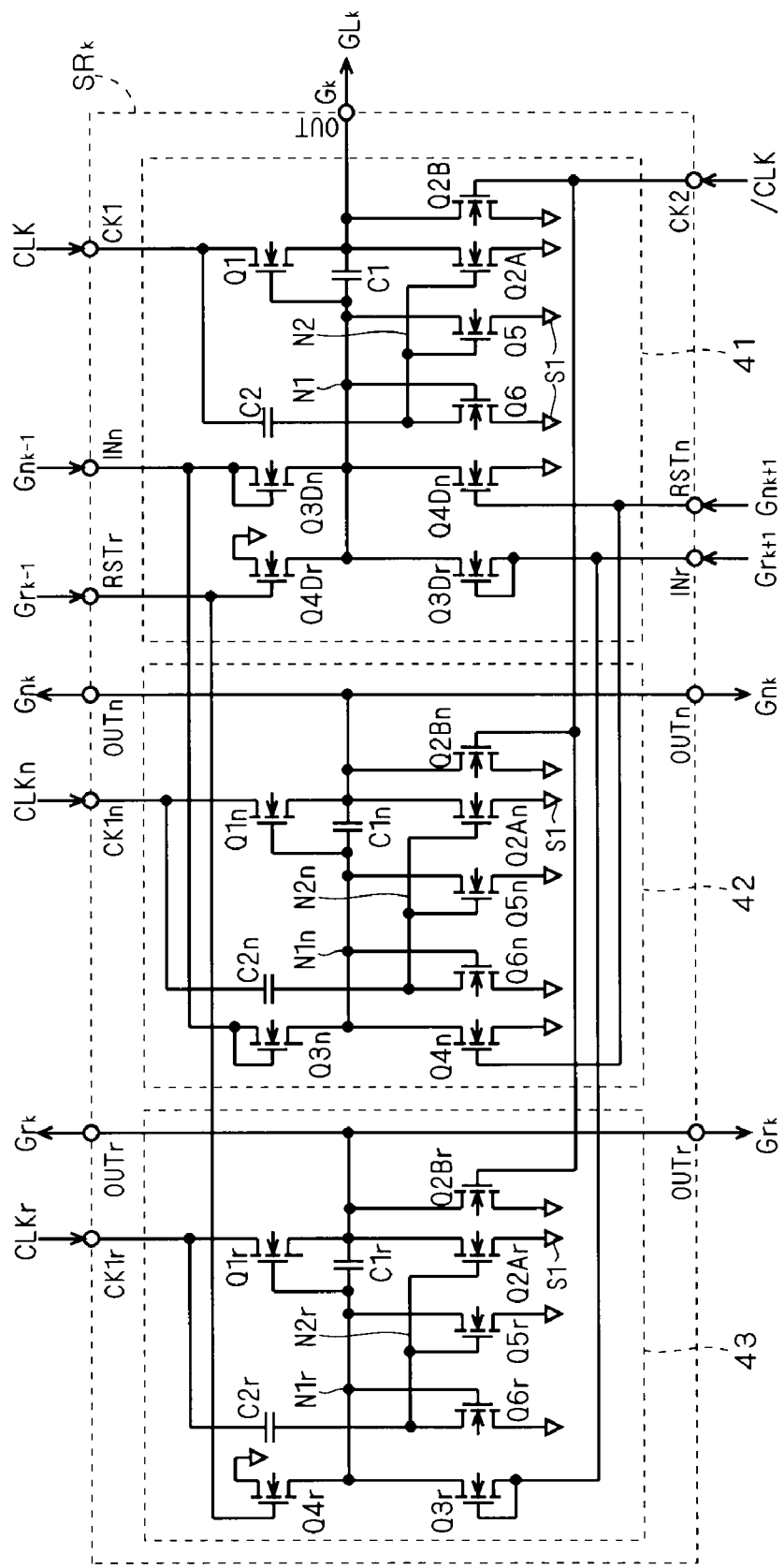
FIG. 35 is a view showing a constitution of a bidirectional unit shift register according to an embodiment 16.

In an embodiment 16, the unit shift register which can solve the above problem is provided. FIG. 35 is a circuit diagram showing the constitution of the unit shift register $SR_k$ according to the embodiment 16.

According to the unit shift register $SR_k$ in the embodiment 1 (FIG. 7), the gates of the transistor Q2An and Q5n in the forward shift unit 42, and the transistors Q2Ar and Q5r in the backward shift unit 43 are connected to the node N2, and these transistors are driven by the inverter composed of the capacitive element C2 and the transistor Q6 in the gate line drive unit 41.

Meanwhile, according to the circuit in FIG. 35, the transistors Q2An and Q5n in the forward shift unit 42, and the transistors Q2Ar and Q5r in the backward shift unit 43 are separately driven. That is, the unit shift register $SR_k$ in this embodiment is provided with an inverter composed of a capacitive element C2n and a transistor Q6n in the forward shift unit 42, and the transistors Q2An and Q5n are driven by it. Similarly, an inverter composed of a capacitive element C2r and a transistor Q6r is provided in the backward shift unit 43, and the transistors Q2Ar and Q5r are driven by it.

In the forward shift unit 42, the capacitive element C2n and the transistor Q6n constitute the capacitive load type inverter having the capacitive element C2n as a load element. Although the constitution of the inverter is the same as the inverter composed of the capacitive element C2 and the transistor Q6 in the gate line drive unit 41 basically, the clock signal inputted to the first forward clock terminal CK1n is supplied as the power supply.

The input end of this inverter is the node N1n, and the output end (defined as "node N2n") is connected to the gates of the transistors Q2An and Q5n. That is, the capacitive element C2n is connected between the node N2n and the first forward clock terminal CK1n, the transistor Q6n is connected between the node N2n and the first power supply terminal S1, and its gate is connected to the node N1. Consequently, the transistor Q5n has the gate (node N2n) connected to the first forward clock terminal CK1n through the capacitive element C2n (load), and discharges the node N1n, and the transistor Q6n has the gate connected to the node N1n and discharges the node N2n.

The inverter is activated in synchronization with the clock signal inputted to the first forward clock terminal CK1n to perform an alternate operation. More specifically, while the clock signal inputted to the first forward clock terminal CK1n is at the active level (H level), the inverter inverts the level of the node N1n and outputs it to the node N2n. However, while the clock signal inputted to the first forward clock terminal CK1n is at the inactive level (L level), the node N2n is at L level regardless of the level of the node N1n.

Similarly, in the backward shift unit 43, the capacitive element C2r and the transistor Q6r constitute the capacitive load type inverter having the capacitive element C2r as a load element. Although the constitution of the inverter is the same as the inverter composed of the capacitive element C2 and the transistor Q6 in the gate line drive unit 41 basically, the clock signal inputted to the first backward clock terminal CK1r is supplied as the power supply.

The input end of this inverter is the node N1r, and the output end (defined as "node N2r") is connected to the gates of the transistors Q2Ar and Q5r. That is, the capacitive element C2r is connected between the node N2r and the first backward clock terminal CK1r, the transistor Q6r is connected between the node N2r and the first power supply terminal S1, and its gate is connected to the node N1r. Consequently, the transistor Q5r has the gate (node N2r) connected to the first backward clock terminal CK1r through the capacitive element C2r (load), and discharges the node N1r, and the transistor Q6r has the gate connected to the node N1r and discharges the node N2r.

The inverter is activated in synchronization with the clock signal inputted to the first backward clock terminal CK1r to perform an alternate operation. More specifically, while the clock signal inputted to the first backward clock terminal CK1r is at the active level (H level), the inverter inverts the level of the node N1r and outputs it to the node N2r. However, while the clock signal inputted to the first backward clock terminal CK1r is at the inactive level (L level), the node N2r is at L level regardless of the level of the node N1r.

The operation of the unit shift register $SR_k$ in this embodiment is the same as the circuit in FIG. 7 basically. However, the gates (node N2r) of the transistors Q2Ar and Q5r are fixed to L level at the time of forward shift, while the gates (node N2n) of the transistors Q2An and Q5n are fixed to L level at the time of backward shift. Consequently, since the threshold voltages of the transistors Q2Ar and Q5r are prevented from being shifted at the time of forward shift, and the threshold voltages of the transistors Q2An and Q5n are prevented from being shifted at the time of backward shift, the above problem does not occur.

Although the gates of the transistor Q2An and Q2Ar are connected to the node N2n and N2r, respectively in this embodiment, they may be connected to the node N2 similarly to the circuit in FIG. 7. In this case, although the threshold voltages of the transistors Q2An and Q2Ar are shifted similarly to FIG. 7, since the threshold voltages of the transistors Q5n and Q5r are prevented from being shifted, the error signal is prevented from being generated. The level rise of the backward output terminal OUTr at the time of forward shift and the level rise of the forward output terminal OUTn at the time of backward shift can be surely prevented.

Although the variation of the circuit in FIG. 7 is shown in FIG. 35, this embodiment can be applied to the unit shift registers SR shown in FIGS. 8, 9, 12 to 19, 24 to 26, 29, 30, 32, and 33.

While the invention has been shown and described in detail, the foregoing description is in all aspects illustrative and not restrictive. It is therefore understood that numerous modifications and variations can be devised without departing from the scope of the invention.

What is claimed is:

1. A shift register composed of a plurality of stages, wherein each stage of said plurality of stages comprises:

first to third shift register components each capable of operating as one-stage shift register;

first to third output terminals for outputting first to third output signals serving as output signals of the first to third shift register components, respectively; and a first input terminal receiving said second output signal of a previous-stage, and a second input terminal receiving the third output signal of a subsequent-stage, said first shift register component activates said first output signal outputted from said first output terminal, in response to both of said second output signal of the previous-stage inputted to said first input terminal and said third output signal of the subsequent-stage inputted to said second input terminal, said second shift register component activates said second output signal outputted from said second output terminal, in response to only said second output signal of the previous-stage inputted to said first input terminal, and said third shift register component activates said third output signal outputted from said third output terminal, in response to only said third output signal of the subsequent-stage inputted to said second input terminal.

2. The shift register according to claim 1, wherein
in each stage of said plurality of stages,
said third shift register component does not activate said third output signal at the time of forward shift to activate said first output signal sequentially from the previous-stage to the subsequent-stage, and
said second shift register component does not activate said second output signal at the time of backward shift to activate said first output signal sequentially from the subsequent-stage to the previous-stage.

3. The shift register according to claim 2, wherein
each stage of said plurality of stages further comprises:
first and second reset terminals,
in each stage of said plurality of stages,
said first shift register component comprises:
a first clock terminal;
a first transistor supplying a first clock signal inputted to said first clock terminal to said first output terminal;
a second transistor having a control electrode connected to said first input terminal, and charging a first node connected to a control electrode of said first transistor;
a third transistor discharging said first node based on a signal inputted to said first reset terminal;
a fourth transistor having a control electrode connected to said second input terminal, and charging said first node; and
a fifth transistor discharging said first node based on a signal inputted to said second reset terminal,
said second shift register component comprises:
a second clock terminal;
a sixth transistor supplying a second clock signal inputted to said second clock terminal to said second output terminal;
a seventh transistor having a control electrode connected to said first input terminal, and charging a second node connected to a control electrode of said sixth transistor; and
an eighth transistor discharging said second node based on a signal inputted to said first reset terminal,
said third shift register component comprises:
a third clock terminal;
a ninth transistor supplying a third clock signal inputted to said third clock terminal to said third output terminal;
a tenth transistor having a control electrode connected to said second input terminal, and charging a third node connected to a control electrode of said ninth transistor; and
an eleventh transistor discharging said third node based on a signal inputted to said second reset terminal, and
said second and third clock signals have the same phase as said first clock signal.

4. The shift register according to claim 3, wherein
in each stage of said plurality of stages,
said second clock signal is activated at the time of said forward shift, but not activated at the time of said backward shift, and
said third clock signal is activated at the time of said backward shift, but not activated at the time of said forward shift.

5. The shift register according to claim 3, wherein
each stage of said plurality of stages further comprises:
first and second voltage signal terminals supplied with first and second voltage signals complementary to each other, respectively,
in each stage of said plurality of stages,
said seventh transistor is connected between said second node and said first voltage signal terminal, and
said tenth transistor is connected between said third node and said second voltage signal terminal.

6. The shift register according to claim 5, wherein
said first to third clock signals are all the same signal.

7. The shift register according to claim 3, wherein
in each stage of said plurality of stages,
said first shift register component further comprises:
a twelfth transistor having a control electrode connected to said first clock terminal through a load, and discharging said first node; and
a thirteenth transistor having a control electrode connected to said first node, and discharging a fourth node connected to a control electrode of said twelfth transistor.

8. The shift register according to claim 7, wherein
in each stage of said plurality of stages,
said first shift register component further comprises:
a fourteenth transistor having a control electrode connected to said fourth node, and discharging said first output terminal.

9. The shift register according to claim 8, wherein
in each stage of said plurality of stages,
said fourteenth transistor has one main electrode connected to said first output terminal, and the other main electrode supplied with a signal having a phase different from that of said first clock signal.

10. The shift register according to claim 7, wherein
in each stage of said plurality of stages,
said first shift register component further comprises:
a fifteenth transistor controlled by a fourth clock signal having a phase different from said first clock signal, and discharging said first output terminal.

11. The shift register according to claim 7, wherein
in each stage of said plurality of stages,
said second shift register component further comprises:
a sixteenth transistor controlled by a fifth clock signal having a phase different from said first clock signal, and discharging said second output terminal, and
said third shift register component further comprises:
a seventeenth transistor controlled by a sixth clock signal having a phase different from said first clock signal, and discharging said third output terminal.

12. The shift register according to claim 3, wherein
in each stage of said plurality of stages,
said second output signal of the subsequent-stage is inputted to said first reset terminal, and
said third output signal of the previous-stage is inputted to said second reset terminal.

13. The shift register according to claim 3, wherein
in each stage of said plurality of stages,
seventh and eighth clock signals having a phase different from said first clock signal are inputted to said first and second reset terminals, respectively,
said third transistor is connected between said first node and said first input terminal,
said fifth transistor is connected between said first node and said second input terminal,
said eighth transistor is connected between said second node and said first input terminal, and said eleventh transistor is connected between said third node and said second input terminal.

14. The shift register according to claim 3, wherein in each stage of said plurality of stages, said first shift register component comprises:

first and second control terminals receiving first and second control signals complementary to each other, respectively;

twelfth and thirteenth transistors discharging said first output terminal; and a drive circuit driving said twelfth and thirteen transistors alternately, based on said first and second control signals.

15. The shift register according to claim 7, wherein in each stage of said plurality of stages, said second shift register component further comprises:

a sixteenth transistor having a control electrode connected to said second clock terminal through a load, and discharging said second node; and a seventeenth transistor having a control electrode connected to said second node, and discharging a fifth node connected to a control electrode of said sixteenth transistor, and said third shift register component further comprises:

an eighteenth transistor having a control electrode connected to said third clock terminal through a load, and discharging said third node; and a nineteenth transistor having a control electrode connected to said third node, and discharging a sixth node connected to a control electrode of said eighteenth transistor.

16. The shift register according to claim 15, wherein in each stage of said plurality of stages, said second shift register component further comprises:

a twentieth transistor having a control electrode connected to said fourth or fifth node, and discharging said second output terminal, and said third shift register component further comprises:

an twenty-first transistor having a control electrode connected to said fourth or sixth node, and discharging said third output terminal.

17. The shift register according to claim 15, wherein in each stage of said plurality of stages, said second shift register component further comprises:

a twenty-second transistor controlled by a fifth clock signal having a phase different from said first clock signal, and discharging said second output terminal, and said third shift register component further comprises:

an twenty-third transistor controlled by a sixth clock signal having a phase different from said first clock signal, and discharging said third output terminal.

18. The shift register according to claim 15, wherein in each stage of said plurality of stages, said second output signal of the subsequent-stage is inputted to said first reset terminal, and said third output signal of the previous-stage is inputted to said second reset terminal.

19. The shift register according to claim 3, comprising:

a first dummy stage as one-stage shift register provided at the previous-stage of a first-stage of said plurality of stages, and outputting a signal to said second reset terminal of said first-stage; and a second dummy stage as one-stage shift register provided at the subsequent-stage of a last-stage of said plurality of stages, and outputting a signal to said first reset terminal of said last-stage, wherein said first dummy stage activates a signal outputted to said second reset terminal of said first-stage, in response to only said third output signal of said first-stage, and said second dummy stage activates a signal outputted to said first reset terminal of said last-stage, in response to only said second output signal of said last-stage.

* * * * *